(12) United States Patent
Takahashi et al.

(10) Patent No.: US 11,575,001 B2
(45) Date of Patent: Feb. 7, 2023

(54) SEMICONDUCTOR DEVICE

(71) Applicant: Mitsubishi Electric Corporation, Tokyo (JP)

(72) Inventors: Tetsuo Takahashi, Tokyo (JP); Hidenori Fujii, Tokyo (JP); Shigeto Honda, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 38 days.

(21) Appl. No.: 17/373,660

(22) Filed: Jul. 12, 2021

(65) Prior Publication Data
US 2022/0109044 A1   Apr. 7, 2022

(30) Foreign Application Priority Data

Oct. 1, 2020  (JP) .............................. JP2020-167271

(51) Int. Cl.
*H01L 29/06* (2006.01)
*H01L 27/07* (2006.01)
(Continued)

(52) U.S. Cl.
CPC ...... *H01L 29/0634* (2013.01); *H01L 27/0727* (2013.01); *H01L 29/0696* (2013.01); *H01L 29/7397* (2013.01); *H01L 29/861* (2013.01)

(58) Field of Classification Search
CPC ............. H01L 27/0727; H01L 29/0634; H01L 29/0696; H01L 29/7397; H01L 29/861
(Continued)

(56) References Cited

U.S. PATENT DOCUMENTS

2013/0240947 A1   9/2013  Matsudai et al.
2016/0148928 A1*  5/2016  Son ..................... H01L 29/2003
                                                         257/77
(Continued)

FOREIGN PATENT DOCUMENTS

JP    2013-197122 A    9/2013
JP    2016-072359 A    5/2016
(Continued)

OTHER PUBLICATIONS

Takahashi, Hideki et al.; "1200V Reverse Conducting IGBT"; Proceedings of 2004 International Symposium on Power Semiconductor Devices & ICs, Kitakyushu; pp. 133-136.

*Primary Examiner* — Igwe U Anya
(74) *Attorney, Agent, or Firm* — Studebaker & Brackett PC

(57) ABSTRACT

A semiconductor substrate has a transistor region, a diode region, and an outer peripheral region. The transistor region is divided into a plurality of transistor unit cell regions by a plurality of gate electrodes each having a stripe shape, and the diode region is divided into a plurality of diode unit cell regions by the plurality of gate electrodes. Each of the plurality of transistor unit cell regions has a third semiconductor layer of a first conductivity type provided on a first main surface side of the semiconductor substrate, a fourth semiconductor layer of a second conductivity type selectively provided on an upper layer part of the third semiconductor layer, and a fifth semiconductor layer. The fifth semiconductor layer is provided to be in contact with an impurity layer of the first conductivity type provided in the outer peripheral region, or to enter the impurity layer.

19 Claims, 47 Drawing Sheets

(51) Int. Cl.
 *H01L 29/861* (2006.01)
 *H01L 29/739* (2006.01)
(58) Field of Classification Search
 USPC .......................................................... 257/355
 See application file for complete search history.

(56) References Cited

U.S. PATENT DOCUMENTS

| | | | |
|---|---|---|---|
| 2017/0250269 A1* | 8/2017 | Sumitomo | ............ H01L 29/407 |
| 2017/0263603 A1 | 9/2017 | Hata et al. | |
| 2017/0352747 A1* | 12/2017 | Sumitomo | .......... H01L 27/0727 |
| 2019/0096878 A1 | 3/2019 | Arakawa et al. | |
| 2019/0259747 A1 | 8/2019 | Gejo | |

FOREIGN PATENT DOCUMENTS

| | | | |
|---|---|---|---|
| JP | 2016-100464 A | 5/2016 |
| JP | 2017-224685 A | 12/2017 |
| JP | 2019-145708 A | 8/2019 |

* cited by examiner

F I G. 3 0
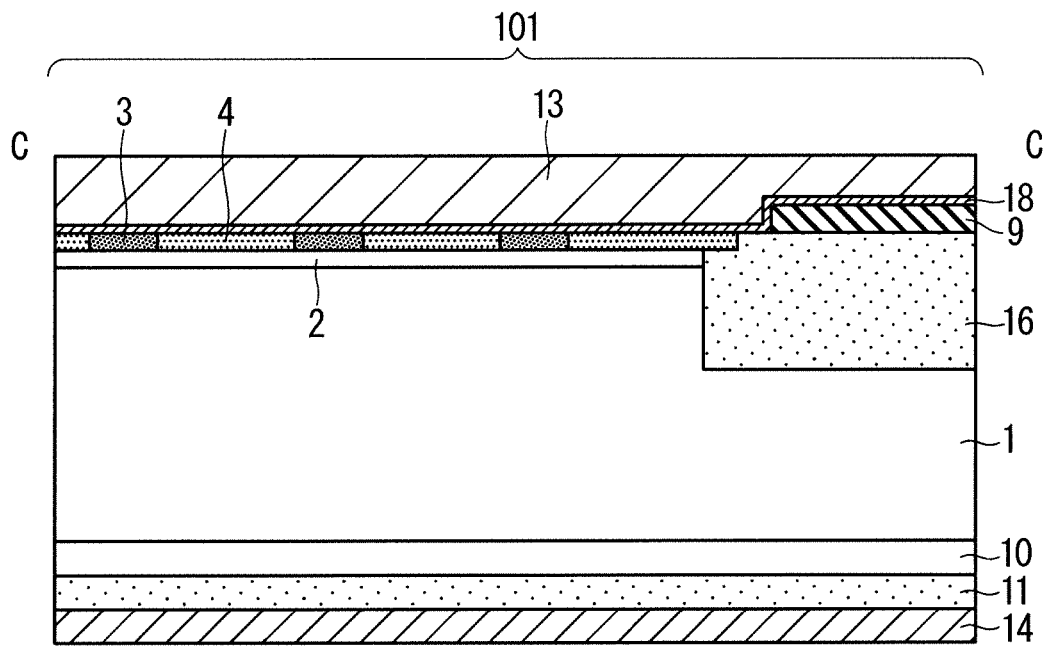
F I G. 3 1
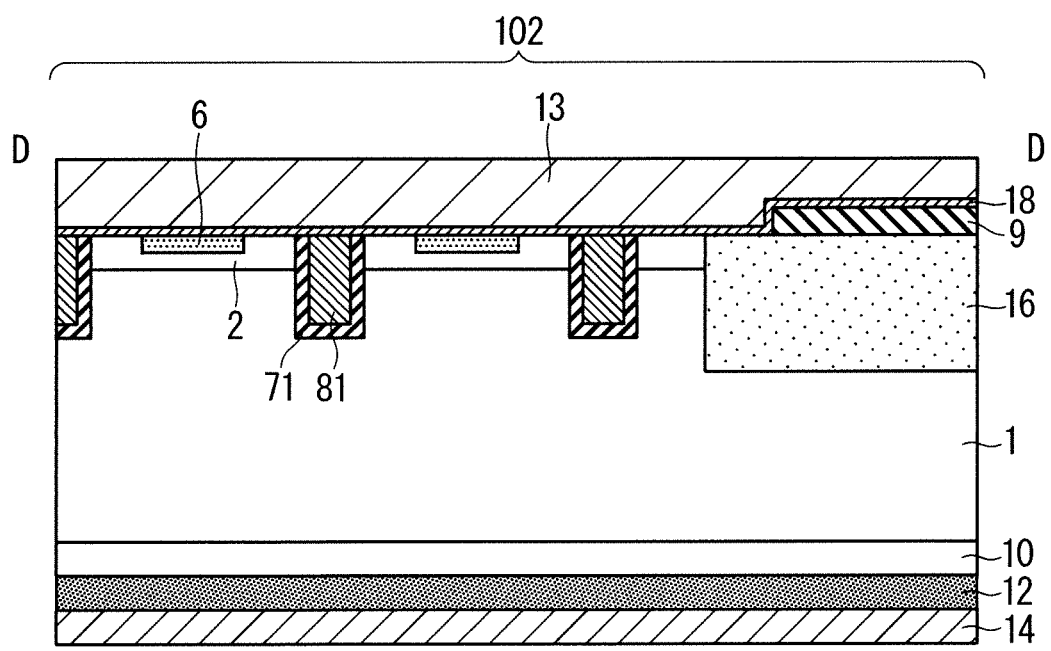

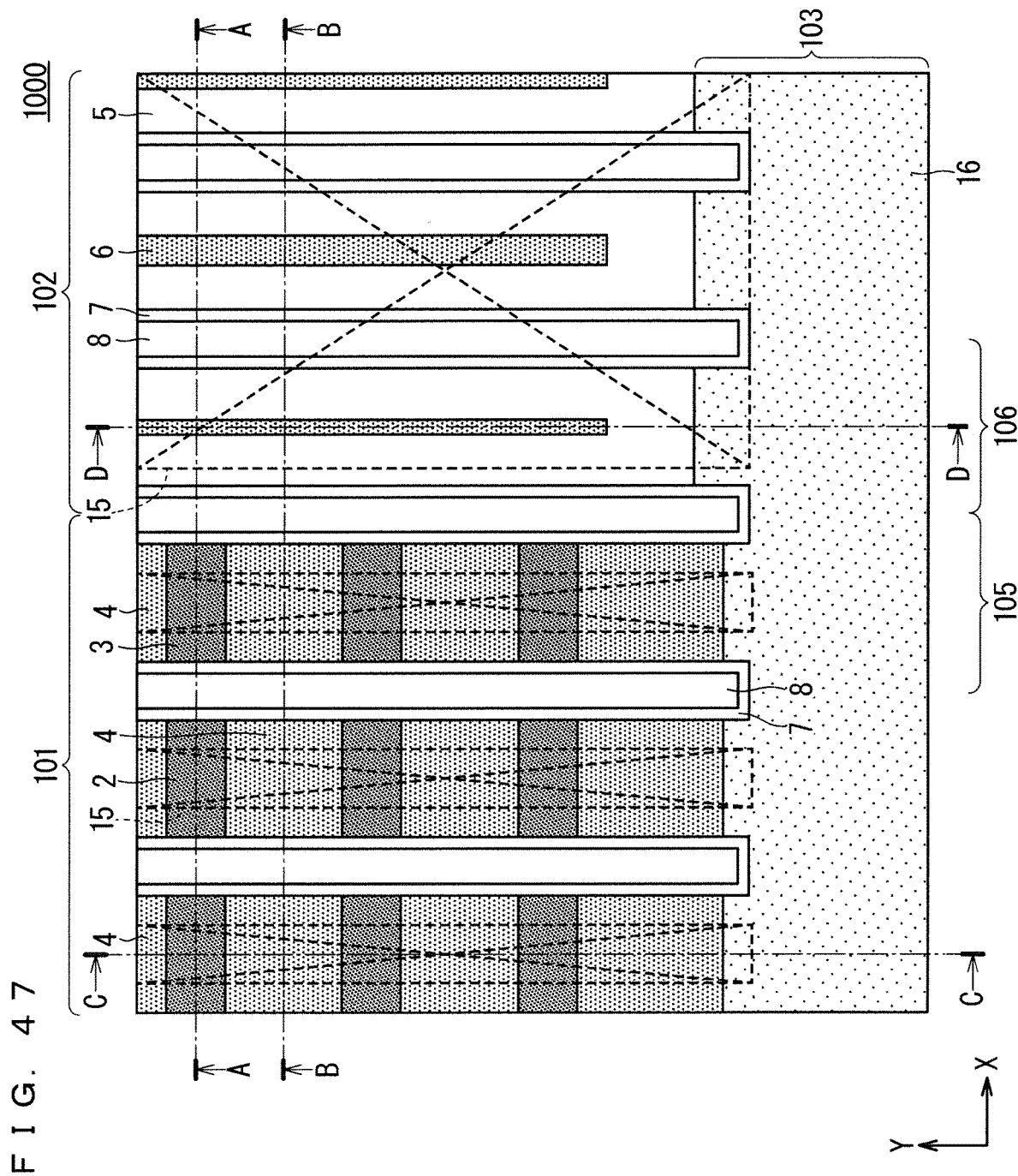
F I G. 47

F I G. 5 7
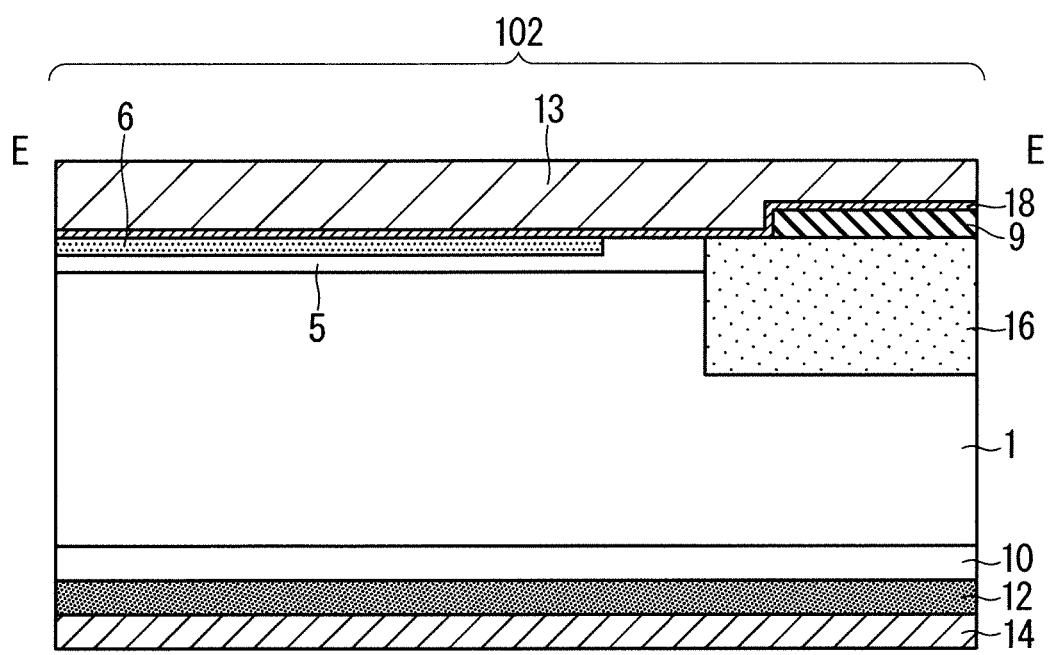

F I G. 6 8
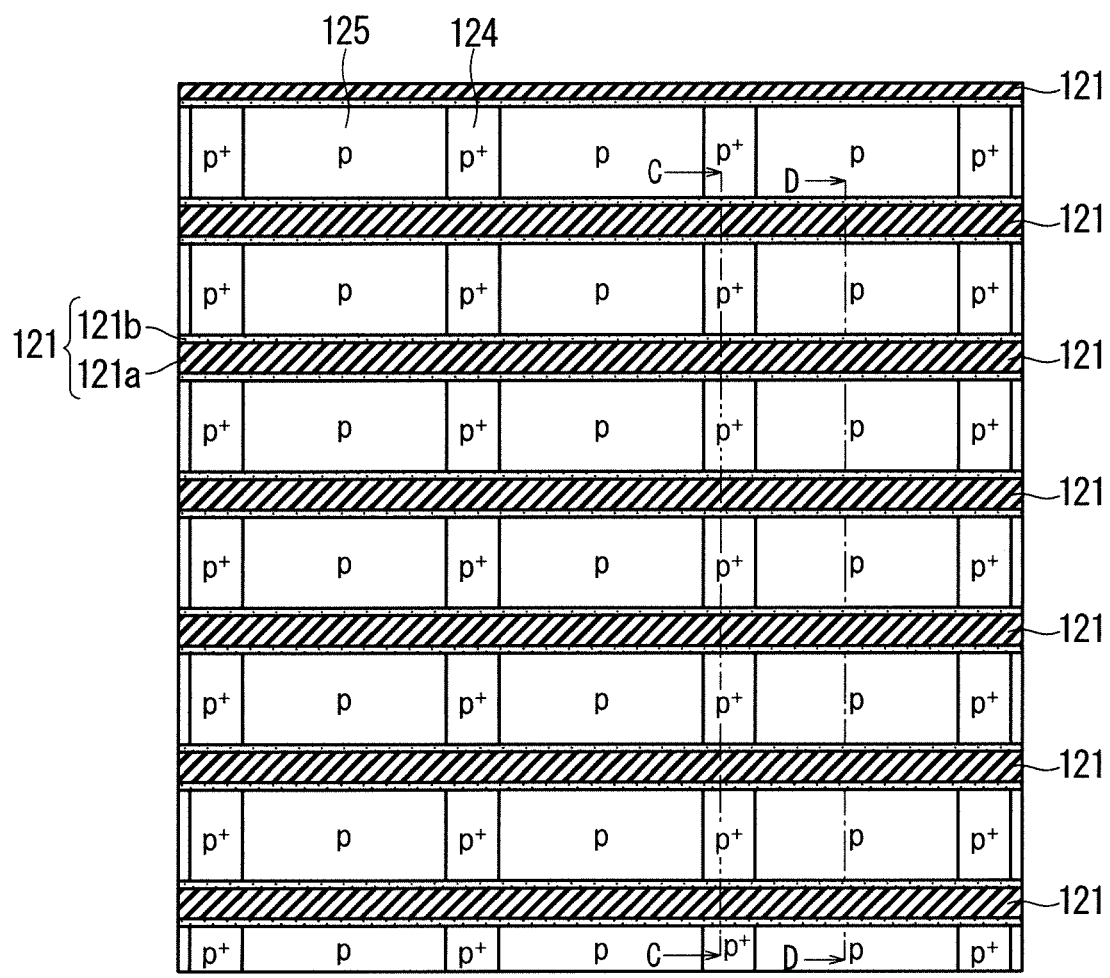

SEMICONDUCTOR DEVICE

BACKGROUND OF THE INVENTION

Field of the Invention

The present disclosure relates to a semiconductor device, and relates to a semiconductor device having a reduced recovery loss.

Description of the Background Art

In general, power devices are required to meet various requirements such as withstand voltage holding capacity and guarantee of a safe operating area so that the device does not break during its operation. One of the requirements is low loss. Reducing loss in power devices has the effects of reducing the size and weight of the device, and in a broad sense, it has an effect that leads to the conservation of the global environment by reducing energy consumption. It is further required to realize a power device that achieves these effects at the lowest possible cost.

As means for meeting the above requirements, an RC-IGBT (Reverse-Conducting Insulated Gate Bipolar Transistor) that achieves the characteristics of an IGBT and an FWD (Free Wheeling Diode) by one structure has been proposed, as disclosed, for example, in Proceedings of International symposium on Power Semiconductor devices 2004 pp. 133-136.

This RC-IGBT has some technical problems, one of which is that the recovery loss during the operation of the diode is large. In the RC-IGBT, a p-n junction, formed by an anode part (p-type anode) and p$^+$-type contact of a diode part and an n$^-$-type drift layer, becomes a forward bias during the operation of the FWD, and conductivity modulation occurs by holes flowing into the n$^-$-type drift layer, whereby forward voltage drop can be reduced. However, when the concentration of p-type impurities in an anode region is high, the existence of a large amount of excess carriers makes it difficult for the carriers inside the device to be discharged. Therefore, there has been a problem that the recovery loss is increased.

Japanese Patent Application Laid-Open No. 2017-224685 discloses some configurations that solve these problems. In Japanese Patent Application Laid-Open No. 2017-224685, recovery capability during the operation of a diode is improved by separating a guard ring in an outer peripheral region from a cathode layer by a certain distance or more.

In the disclosure of Japanese Patent Application Laid-Open No. 2017-224685, no countermeasure is taken against the inflow of holes from the outer peripheral region having a deep p-type diffusion layer whose concentration is generally high, so that the countermeasure against a drop in a reverse bias safe operating area (RBSOA) is insufficient.

SUMMARY

An object of the present disclosure is to provide a semiconductor device that suppresses a drop in a reverse bias safe operating area.

A semiconductor device according to the present disclosure is a semiconductor device in which a transistor and a diode are formed on a common semiconductor substrate, in which: the semiconductor substrate has a transistor region where the transistor is formed, a diode region where the diode is formed, and an outer peripheral region surrounding a cell region including the transistor region and the diode region; the transistor region is divided into a plurality of transistor unit cell regions by a plurality of gate electrodes each having a stripe shape; the diode region is divided into a plurality of diode unit cell regions by the plurality of gate electrodes; each of the plurality of transistor unit cell regions has a first semiconductor layer of a first conductivity type provided on a second main surface side of the semiconductor substrate, a second semiconductor layer of a second conductivity type provided on the first semiconductor layer, a third semiconductor layer of the first conductivity type provided on a first main surface side of the semiconductor substrate with respect to the second semiconductor layer, a fourth semiconductor layer of the second conductivity type selectively provided on an upper layer part of the third semiconductor layer, a fifth semiconductor layer of the first conductivity type selectively provided such that a side surface of the fifth semiconductor layer is in contact with a side surface of the fourth semiconductor layer, a first electrode electrically connected to the first semiconductor layer, and a second electrode electrically connected to the fourth semiconductor layer and the fifth semiconductor layer via a contact hole; each of the plurality of diode unit cell regions has a sixth semiconductor layer of the second conductivity type provided on the second main surface side of the semiconductor substrate, the second semiconductor layer provided on the sixth semiconductor layer, a seventh semiconductor layer of the first conductivity type provided on the first main surface side of the semiconductor substrate with respect to the second semiconductor layer, an eighth semiconductor layer of the first conductivity type selectively provided on an upper layer part of the seventh semiconductor layer, the first electrode electrically connected to the sixth semiconductor layer, and the second electrode electrically connected to the seventh semiconductor layer and the eighth semiconductor layer via the contact hole; the fifth semiconductor layer in the transistor region is provided to be in contact with an impurity layer of the first conductivity type that is provided in the outer peripheral region and defines a boundary with the cell region, or to enter the impurity layer; and the contact hole is provided to extend to an upper portion of the impurity layer in the outer peripheral region.

According to the above semiconductor device, the fifth semiconductor layer is provided to be in contact with the impurity layer provided in the outer peripheral region or to enter the impurity layer and the fourth semiconductor layer is not arranged near the diode region, so that a configuration less likely to latch up is created, a potential is less likely to be increased even if the flow of hole current is increased, the flow of hole current into the fourth semiconductor layer is reduced, and a drop in the reverse bias safe operating area can be minimized. Further, since the contact hole extends to the upper portion of the impurity layer in the outer peripheral region, holes can be efficiently extracted even in the outer peripheral region near the transistor region, and a drop in the reverse bias safe operating area can be suppressed.

These and other objects, features, aspects and advantages of the present disclosure will become more apparent from the following detailed description of the present disclosure when taken in conjunction with the accompanying drawings.

BRIEF DESCRIPTION OF THE DRAWINGS

FIGS. 28 to 31 are each a partial cross-sectional view of the RC-IGBT according to the sixth preferred embodiment;

FIG. 47 is a partial plan view of an RC-IGBT according to a tenth preferred embodiment;

FIGS. 53 to 57 are each a partial cross-sectional view of the RC-IGBT according to the eleventh preferred embodiment;

FIG. 68 is a partial plan view illustrating another configuration of an RC-IGBT.

DESCRIPTION OF THE PREFERRED EMBODIMENTS

Introduction

Figure 1:
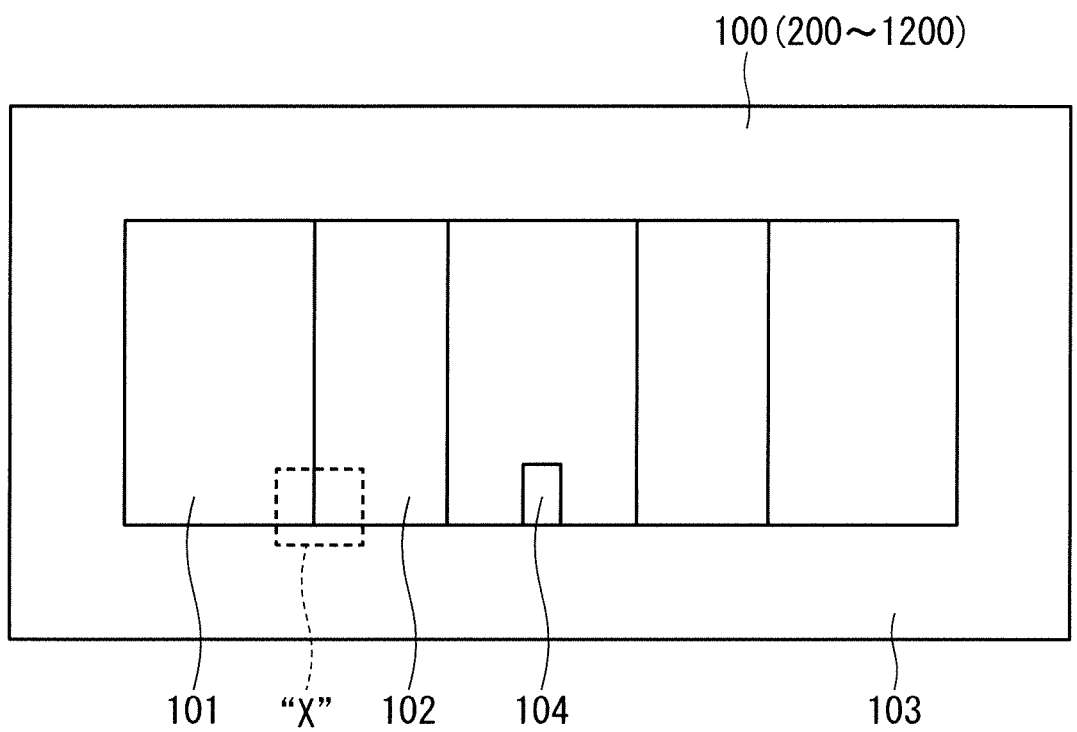
FIG. 1 is a plan view illustrating an entire chip of an RC-IGBT according to a first preferred embodiment.

In the following description, an n-type and a p-type indicate the conductivity types of a semiconductor. In the present disclosure, description will be made by describing a first conductivity type as the p-type and a second conductivity type as the n-type, but the first conductivity type may be described as the n-type and the second conductivity type as the p-type. In addition, it is indicated that an $n^-$-type has a lower concentration of impurities than the n-type and an $n^+$-type has a higher concentration of impurities than the n-type. Similarly, it is indicated that a $p^-$-type has a lower concentration of impurities than the p-type and a $p^+$-type has a higher concentration of impurities than the p-type.

In addition, the drawings are schematically shown, and the interrelationships between the sizes and positions of the images illustrated in different drawings are not necessarily illustrated exactly, and may be changed as appropriate. In addition, in the following description, similar constituents are designated by the same reference numerals, and their names and functions are set to be the same. Therefore, detailed description about them may be omitted.

In the following description, terms that mean specific positions and directions, such as "top", "bottom", "side", "front", and "back", may be used. These terms are used for convenience to facilitate understanding of the contents of preferred embodiments, and have nothing to do with the directions when the preferred embodiments are actually implemented.

First Preferred Embodiment

<Device Configuration>

Figure 2:
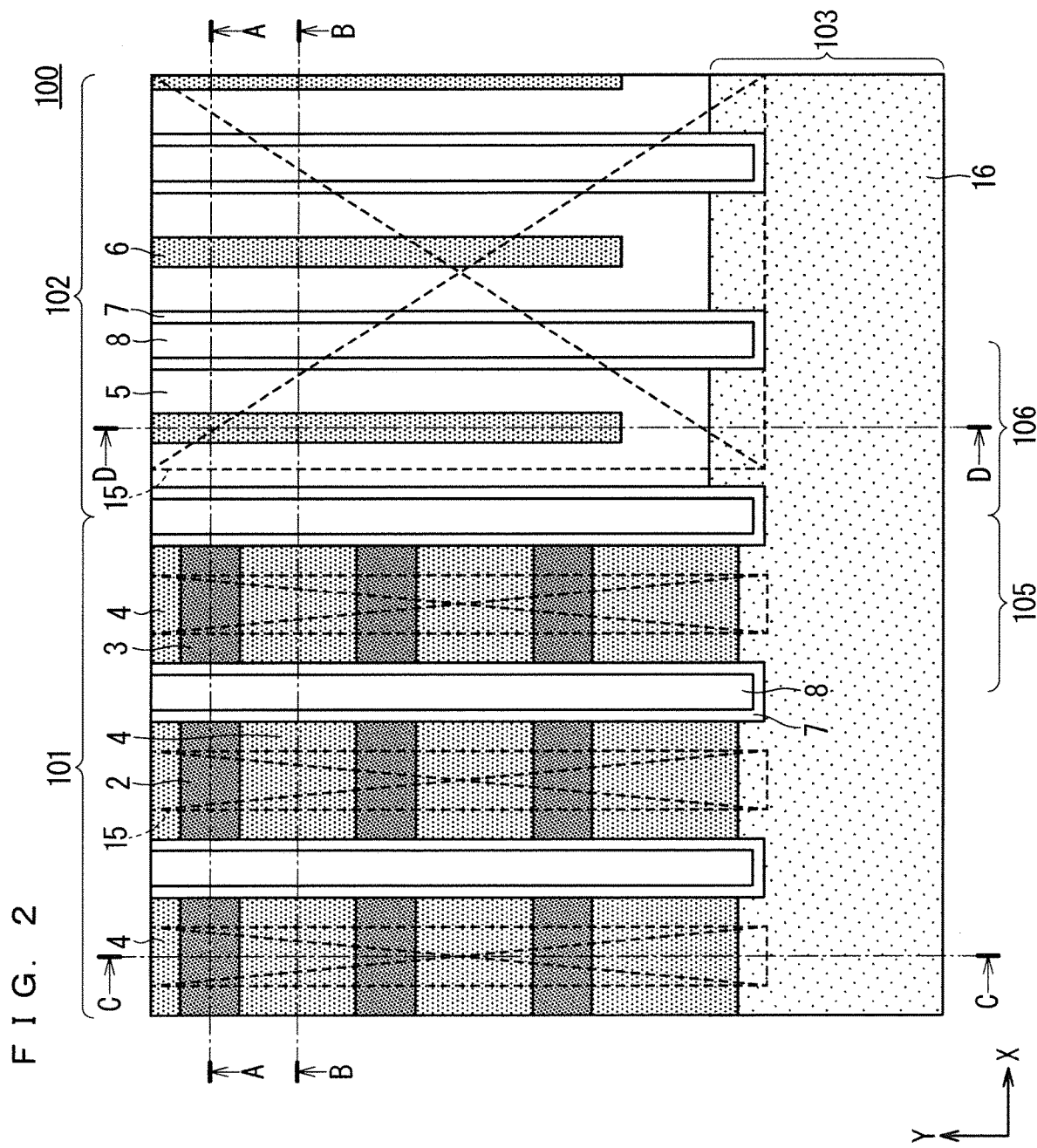
FIG. 2 is a partial plan view of the RC-IGBT according to the first preferred embodiment.

FIG. 1 is a plan view illustrating an entire chip of an RC-IGBT 100 according to a first preferred embodiment, and FIG. 2 is a plan view illustrating a region X surrounded by the dashed line in FIG. 1. The RC-IGBT 100 illustrated in FIG. 1 has IGBT regions 101 (transistor regions) and FWD regions 102 (diode regions) arranged side by side in a stripe shape, which is referred to as a "stripe type".

As illustrated in FIG. 1, an outer peripheral region 103 is provided to surround the IGBT regions 101 and the FWD regions 102, and one of the IGBT regions 101 is partially provided with a gate pad region 104. It should be noted that the plan view illustrating the entire chip is also the same in each of RC-IGBTs 200 to 1200 of the second to twelfth preferred embodiments described later.

As illustrated in FIG. 2, the IGBT region 101 is divided into a plurality of IGBT unit cell regions 105 (transistor unit cell regions) by a plurality of embedded gate electrodes 8 each having a trench structure and a stripe shape. Similarly, the FWD region 102 is divided into a plurality of FWD unit cell regions 106 (diode unit cell regions) by the embedded gate electrodes 8. The IGBT regions 101 and the FWD regions 102 are collectively referred to as a cell region.

The IGBT unit cell regions 105 are provided to sandwich the embedded gate electrode 8 between two of them and repeat in an X direction (horizontal direction), which is the arrangement direction of the embedded gate electrodes 8, and each IGBT unit cell region 105 is provided with a contact hole 15. The contact hole 15 is provided to extend not only over the IGBT unit cell region 105 but also over a p-type well layer 16 (impurity layer) in the outer peripheral region 103. This is referred to as a second feature of the first preferred embodiment.

In the IGBT unit cell region 105, $n^+$-type emitter layers 3 (fourth semiconductor layers) and $p^+$-type contact layers 4 (fifth semiconductor layers) are alternately formed in a Y direction (vertical direction), which is the extending direction of the embedded gate electrode 8.

In the IGBT unit cell region 105, it is configured such that the p+-type contact layer 4 is provided at the boundary with the p-type well layer 16 in the outer peripheral region 103, and the p+-type contact layer 4 is connected to the p-type well layer 16.

The FWD unit cell regions 106 are provided to sandwich the embedded gate electrode 8 between two of them and repeat in the X direction (horizontal direction), which is the arrangement direction of the embedded gate electrodes 8. Each FWD unit cell region 106 is provided with a p-type anode layer 5 (seventh semiconductor layer) and a p+-type contact layer 6 (eighth semiconductor layer) having a stripe shape and extending in the Y direction, and the p+-type contact layer 6 is formed in a continuous single line shape extending in parallel with the embedded gate electrode 8. This is referred to as a fourth feature of the first preferred embodiment.

In the entire FWD region 102, the p+-type contact layer 6 is provided such that an area ratio of the p+-type contact layer 6 is lower than that of the p-type anode layer 5. Here, the area ratio is an area ratio to the total area, in plan view, of the p+-type contact layer 6 and the p-type anode layer 5. This is referred to as a fifth feature of the first preferred embodiment.

The p+-type contact layer 6 in the FWD region 102 is provided such that the area ratio is lower than that of the p+-type contact layer 4 in the IGBT region 101. This is referred to as a sixth feature of the first preferred embodiment.

The contact hole 15 is provided to straddle the plurality of FWD unit cell regions 106. The p+-type contact layer 6 is provided such that the end portion on the outer peripheral region 103 side is located farther from the outer peripheral region 103 as compared with the end portion, on the outer peripheral region 103 side, of the p+-type contact layer 4. This is referred to as a third feature of the first preferred embodiment.

Figure 3:
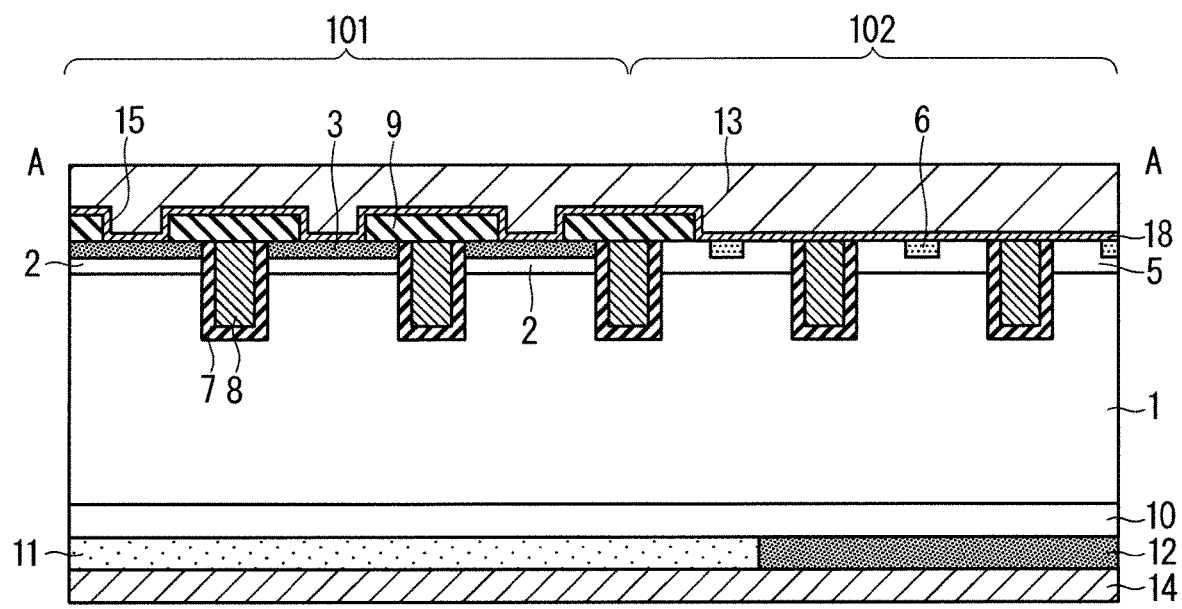
FIGS. 3 to 6 are each a partial cross-sectional view of the RC-IGBT according to the first preferred embodiment.
Figure 4:
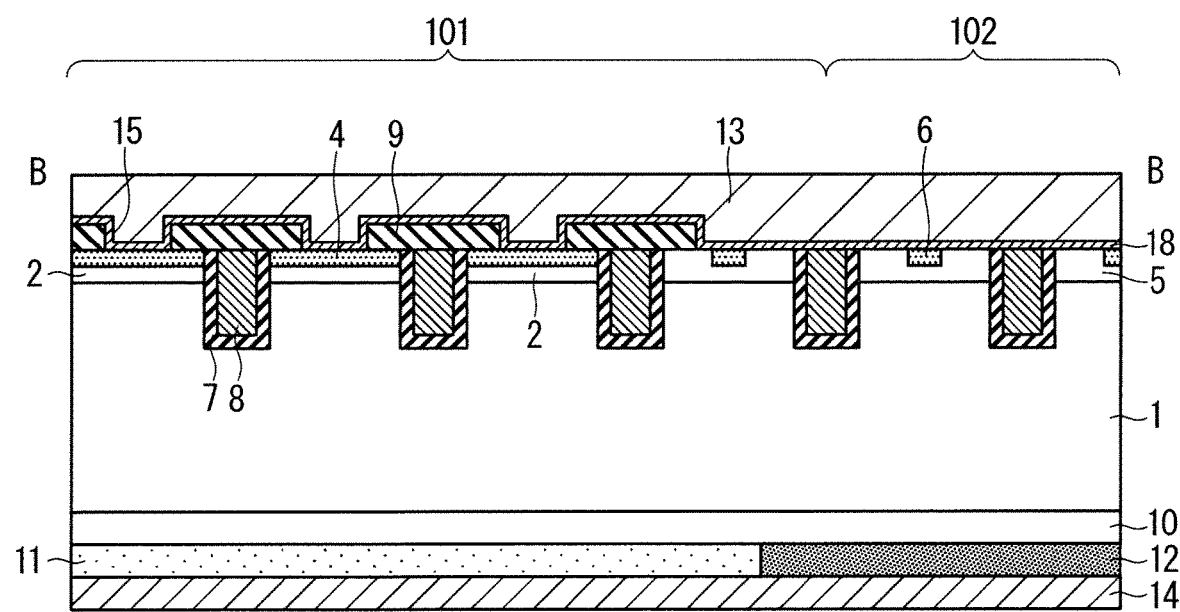
Figure 5:
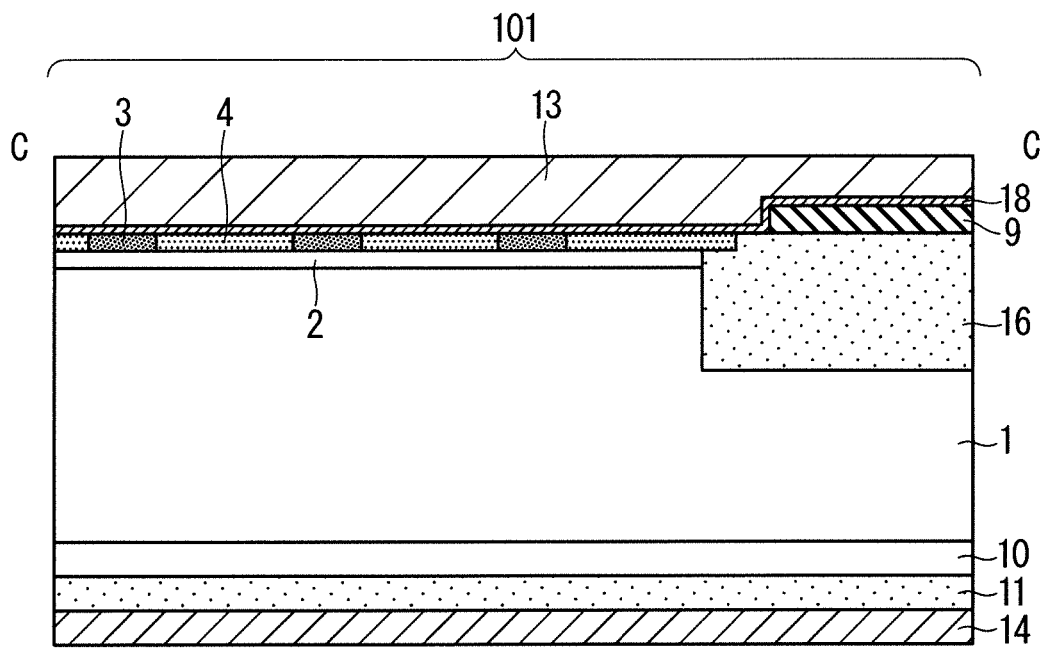
Figure 6:
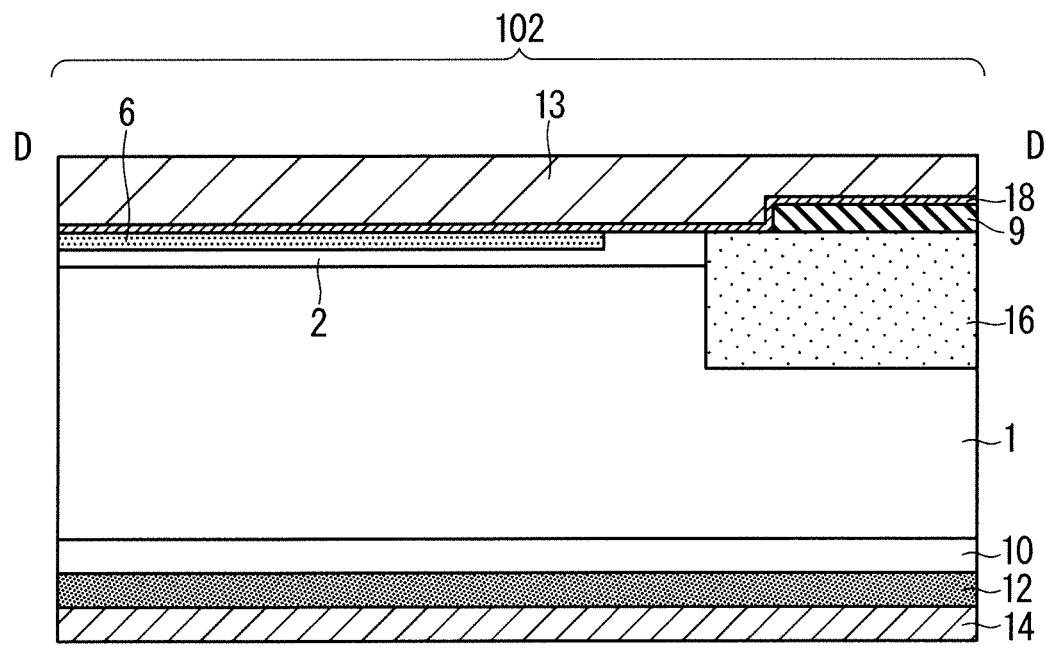

A cross-sectional view taken along the A-A line illustrated in FIG. 2 and viewed from the direction indicated by the arrows is illustrated in FIG. 3, a cross-sectional view taken along the B-B line and viewed from the direction indicated by the arrows is illustrated in FIG. 4, a cross-sectional view taken along the C-C line and viewed from the direction indicated by the arrows is illustrated in FIG. 5, and a cross-sectional view taken along the D-D line and viewed from the direction indicated by the arrows is illustrated in FIG. 6.

As illustrated in FIGS. 3 to 6, the RC-IGBT 100 has an n−-type drift layer 1 (second semiconductor layer) made of a semiconductor substrate such as a silicon (Si) substrate. The n−-type drift layer 1 has, for example, arsenic (As) or phosphorus (P) as n-type impurities, and the concentration of the n-type impurities is $1.0 \times 10^{12}/cm^3$ to $1.0 \times 10^{15}/cm^3$.

In the IGBT region 101, the semiconductor substrate ranges from the n+-type emitter layer 3 and the p+-type contact layer 4 to a p-type collector layer 11 (first semiconductor layer), and in the FWD region 102, the semiconductor substrate ranges from the p+-type contact layer 6 to an n+-type cathode layer 12 (sixth semiconductor layer).

In FIGS. 3 to 6, the top edges of the paper of the n+-type emitter layer 3 and the p+-type contact layer 4 in the IGBT region 101 are called a first main surface of the semiconductor substrate, and the bottom edge of the paper of the p-type collector layer 11 is called a second main surface of the semiconductor substrate. In FIGS. 3 to 6, the top edge of the paper of the p+-type contact layer 6 in the FWD region 102 is called the first main surface of the semiconductor substrate, and the bottom edge of the paper of the n+-type cathode layer 12 is called the second main surface of the semiconductor substrate. The first main surface in the FWD region 102 and the first main surface in the IGBT region 101 are the same surface, and the second main surface in the FWD region 102 and the second main surface in the IGBT region 101 are the same surface.

In the IGBT region 101, a p-type channel doped layer 2 (third semiconductor layer) is provided on the first main surface side of the n−-type drift layer 1, and in the FWD region 102, the p-type anode layer 5 is provided on the first main surface side of the n−-type drift layer 1, as illustrated in FIGS. 3 to 6. The p-type channel doped layer 2 and the p-type anode layer 5 are semiconductor layers having, for example, boron (B) or aluminum (Al) as p-type impurities, and the concentration of the p-type impurities is $1.0 \times 10^{12}/cm^3$ to $1.0 \times 10^{19}/cm^3$.

On the first main surface side of the p-type channel doped layer 2, the n+-type emitter layer 3 is provided in contact with a gate insulating film 7 of the embedded gate electrode 8 in FIG. 3, and the p+-type contact layer 4 is provided in FIG. 4. The n+-type emitter layer 3 and the p+-type contact layer 4 constitute the first main surface of the semiconductor substrate.

The n+-type emitter layer 3 is a semiconductor layer having, for example, arsenic (As) or phosphorus (P) as n-type impurities, and the concentration of the n-type impurities is $1.0 \times 10^{17}/cm^3$ to $1.0 \times 10^{20}/cm^3$.

The p+-type contact layer 4 is a semiconductor layer having, for example, boron (B) or aluminum (Al) as p-type impurities, and the concentration of the p-type impurities is $1.0 \times 10^{15}/cm^3$ to $1.0 \times 10^{20}/cm^3$.

In the RC-IGBT 100, an n-type buffer layer 10 having a higher concentration of n-type impurities than the n−-type drift layer 1 is provided on the second main surface side of the n−-type drift layer 1, as illustrated in FIGS. 3 to 6. The n-type buffer layer 10 is provided to suppress, while the RC-IGBT 100 is turned off, a depletion layer, extending from the p-type channel doped layer 2 toward the second main surface, from punching through. The n-type buffer layer 10 may be formed by implanting, for example, phosphorus (P) or protons (H+), or by implanting both phosphorus (P) and protons (H+). The concentration of n-type impurities in the n-type buffer layer 10 is $1.0 \times 10^{12}/cm^3$ to $1.0 \times 10^{18}/cm^3$.

As illustrated in FIGS. 3 to 6, a collector electrode 14 (first electrode) is provided on the first main surface in the IGBT region 101 and the FWD region 102. The collector electrode 14 functions as a cathode electrode in the FWD region 102. On the collector electrode 14, the p-type collector layer 11 is provided in the IGBT region 101, and the n+-type cathode layer 12 is provided in the FWD region 102.

The p-type collector layer 11 is a semiconductor layer having, for example, boron (B) or aluminum (Al) as p-type impurities, and the concentration of the p-type impurities is $1.0 \times 10^{16}/cm^3$ to $1.0 \times 10^{20}/cm^3$.

The n+-type cathode layer 12 is a semiconductor layer having, for example, arsenic (As) or phosphorus (P) as n-type impurities, and the concentration of the n-type impurities is $1.0 \times 10^{16}/cm^3$ to $1.0 \times 10^{21}/cm^3$.

In the outer peripheral region 103, the p-type well layer 16 is provided on the first main surface side of the n+-type drift layer 1, as illustrated in FIG. 5. The p-type well layer 16 is provided to surround the IGBT region 101 and the FWD region 102, which has, for example, arsenic (As) or phosphorus (P) as n-type impurities and is in contact with the side surface of the p-type channel doped layer 2 in the IGBT region 101. The p$^+$-type contact layer 4 in the IGBT region 101 is formed to enter the p-type well layer 16, while the p-type channel doped layer 2 and the n$^+$-type emitter layer 3 do not enter the p-type well layer 16. This is referred to as a first feature of the first preferred embodiment. The top edge of the paper of the p-type well layer 16 is the first main surface of the semiconductor substrate, and an interlayer insulating film 9 is provided on the p-type well layer 16.

Although not illustrated, an FLR (Field Limiting Ring) in which the cell region is surrounded by a p-type well layer (terminal well layer) or a VLD (Variation of Lateral Doping) in which the cell region is surrounded by a p-type well layer with a concentration gradient can be provided in the further outer periphery of the p-type well layer 16. The number of ring-shaped p-type well layers to be used in the FLR and the concentration distribution of the p-type well layer to be used in the VLD can be appropriately selected depending on the withstand voltage design of the RC-IGBT 100.

In the IGBT region 101, a trench, which penetrates the p-type channel doped layer 2 from the first main surface of the semiconductor substrate to reach the n$^-$-type drift layer 1, is formed, and the embedded gate electrode 8 is provided in the trench via the gate insulating film 7, as illustrated in FIGS. 3 and 4. The gate insulating film 7 and the embedded gate electrode 8 are covered with the interlayer insulating film 9, so that it is configured such that the embedded gate electrode 8 is not connected to an emitter electrode 13 (second electrode). The embedded gate electrode 8 in the IGBT region 101 is electrically connected to the gate pad region 104 via a gate wiring (not illustrated) formed inside the IGBT region 101, so that it functions as an active trench gate.

Also, in the FWD region 102, a trench, which penetrates the p-type channel doped layer from the first main surface of the semiconductor substrate to reach the n$^-$-type drift layer 1, is formed, and the embedded gate electrode 8 is provided in the trench via the gate insulating film 7, as illustrated in FIGS. 3 and 4. The gate insulating film 7 and the embedded gate electrode 8 in the FWD region 102 are connected to the emitter electrode 13, so that the embedded gate electrode 8 functions as a dummy trench gate.

As illustrated in FIGS. 3 to 6, a barrier metal 18 is formed on a region of the first main surface of the semiconductor substrate, where the interlayer insulating film 9 is not provided, and on the interlayer insulating film 9. The barrier metal 18 may be a conductor containing, for example, titanium (Ti), may be, for example, titanium nitride, or may be TiSi in which titanium and Si are alloyed. As illustrated in FIG. 3, the barrier metal 18 is in ohmic contact with the n$^+$-type emitter layer 3, the p$^+$-type contact layer 6, and the embedded gate electrode 8 in the FWD region 102, so that it is electrically connected to the n$^+$-type emitter layer 3, the p$^+$-type contact layer 6, and the embedded gate electrode 8 in the FWD region 102. The emitter electrode 13 is provided on the barrier metal 18. The emitter electrode 13 may be formed of, for example, an aluminum alloy such as an aluminum silicon alloy (Al—Si based alloy), or may be an electrode made of multiple layers of metal films obtained by forming a plating film on the electrode formed of the aluminum alloy by electroless plating or electrolytic plating. The plating film formed by electroless plating or electrolytic plating may be, for example, a nickel (Ni) plating film.

The gate pad region 104 illustrated in FIG. 1 is connected to a gate wiring formed inside the IGBT region 101, and an oxide film is formed directly under the gate pad region 104, so that the gate pad region 104 and the emitter electrode 13 are electrically separated from each other. Directly under the oxide film, the n$^-$-type drift layer 1 may be located, or a p-type terminal well layer may be provided.

Regarding a manufacturing method of the RC-IGBT 100 of the first preferred embodiment described above, the RC-IGBT 100 can be manufactured by: using a general manufacturing technique of an IGBT; changing a mask pattern in a lithography process; and changing arranging patterns of impurity layers in the IGBT region 101 and the FWD region 102. Therefore, detailed description thereof will be omitted.

<Operation>

The operation of the RC-IGBT 100 will be described. First, a case where the RC-IGBT 100 operates as an IGBT will be described. An on-state of the IGBT is started when a positive voltage is applied to the embedded gate electrode 8 and an n-channel MOSFET, composed of the n$^-$-type drift layer 1, the p-type channel doped layer 2, the n$^+$-type emitter layer 3, the gate insulating film 7, and the embedded gate electrode 8, is turned on. That is, with electrons implanted from the n$^+$-type emitter layer 3, holes flowing in from the p$^+$-type collector layer 11, and conductivity modulation occurring in the n$^-$-type drift layer 1, an emitter-collector voltage drops and the on-state of the IGBT is realized.

An off-state of the IGBT is realized by applying a negative voltage to the embedded gate electrode 8. That is, when the n-channel MOSFET is turned off, a small amount of carriers accumulated in the n$^-$-type drift layer 1 are discharged from the emitter electrode 13 and the collector electrode 14, so that the n$^-$-type drift layer 1 is gradually depleted. By the depleted region sharing the voltage, the emitter-collector voltage is increased, and the off-state is realized.

Next, a case where the RC-IGBT 100 operates as a diode will be described. A diode structure is formed by the p-type anode layer 5, the p$^+$-type contact layer 6, the n$^-$-type drift layer 1, and the n$^+$-type cathode layer 12, and while the operation of the FWD is turned on, a state is created in which in an off-state of the IGBT acting as its pair, a positive voltage is applied to the emitter electrode 13 with respect to the collector electrode 14. Holes flow in from an anode region composed of the p-type anode layer 5 and the p$^+$-type contact layer 6, and electrons flow in from a cathode region composed of the n$^+$-type cathode layer 12. Thereby, conductivity modulation occurs and the diode becomes conductive.

Next, when the IGBT acting as its pair is turned on, a state is created in which a negative voltage is applied to the emitter electrode 13 with respect to the collector electrode 14. The holes in the n$^-$-type drift layer 1 escape from the p-type anode layer 5 and the p$^+$-type contact layer 6 to the emitter electrode 13, and the electrons escape from the n$^+$-type cathode layer 12 to the collector electrode. However, a current continues to flow until when excess carriers near the anode region disappear and a p-n junction formed by the p-type anode layer 5, the p$^+$-type contact layer 6, and the n$^-$-type drift layer 1 becomes reverse biased.

Then, when the excess carriers near the anode region escape and the p-n junction formed by the p-type anode layer 5, the p$^+$-type contact layer 6, and the n$^-$-type drift layer 1 becomes reverse biased, a reverse recovery current begins to decrease. When the excess carriers in the n$^-$-type drift layer 1 are discharged, a recovery step is completed and a blocked state is created.

In the RC-IGBT 100, the FWD region 102 is formed adjacent to the IGBT region 101, and during the operation of IGBT, holes flow from the p$^+$-type collector layer 11 into not only the IGBT region 101 but also the FWD region 102 by diffusion. Therefore, while the operation of the IGBT is turned off, the holes that has flowed into the IGBT region 101 and a part of the FWD region 102 are discharged from the emitter electrode 13.

Therefore, hole currents are concentrated on the IGBT region 101 near the FWD region 102, and the potential of the p-type channel doped layer 2 becomes high. When a voltage that cancels a built-in potential is applied to the $n^+$-type emitter layer 3 and the p-type channel doped layer 2 that forms a p-n junction along with the $n^+$-type emitter layer 3, a thyristor formed by the $n^+$-type emitter layer 3, the p-type channel doped layer 2, the $n^-$-type drift layer 1, and the $p^+$-type collector layer 11 is turned on, and control by the gate electrode becomes impossible. Therefore, the device may be damaged. This is called a drop in a reverse bias safe operating area (RBSOA). Further, hole components diffused into the outer peripheral portion are also included near the outer peripheral region 103, so that a drop in the RBSOA is more likely to occur.

However, the RC-IGBT 100 has the first feature, second feature, and third feature described above, so that a drop in the reverse bias safe operating area, possibly occurring during the operation of the IGBT, can be suppressed.

The first feature is that the $p^+$-type contact layer 4 in the IGBT region 101 is formed to enter the p-type well layer 16 and the p-type channel doped layer 2 and the $n^+$-type emitter layer 3 do not enter the p-type well layer 16.

Therefore, the $n^+$-type emitter layer 3 is not arranged near the FWD region 102, so that a configuration less likely to latch up is created. Further, by forming the $p^+$-type contact layer 4 so as to enter the p-type well layer 16, the resistance of a p-type impurity layer that forms a p-n junction along with the $n^+$-type emitter layer 3, in this case, of a portion where the p-type well layer 16 and the $p^+$-type contact layer 4 overlap each other, becomes low, so that: the potential is less likely to be increased even if the inflow of hole current is increased; the inflow of hole current into the $n^+$-type emitter layer 3 is reduced; and a drop in the reverse bias safe operating area (RBSOA) can be minimized.

The second feature is that the contact hole 15 in the IGBT region 101 is provided to extend not only over the IGBT unit cell region 105 but also over the p-type well layer 16 in the outer peripheral region 103.

Therefore, holes can be efficiently extracted even in the outer peripheral region 103 near the IGBT region 101, so that a drop in the RBSOA can be suppressed.

The third feature is that the end portion, on the outer peripheral region 103 side, of the $p^+$-type contact layer 6 is located farther from the outer peripheral region 103 as compared with the end portion, on the outer peripheral region 103 side, of the $p^+$-type contact layer 4.

Therefore, the concentration of p-type impurities at the boundary between the FWD region 102 and the outer peripheral region 103 is reduced, and the discharge paths for holes are reduced, so that a drop in the RBSOA at each of the boundaries between the IGBT region 101 and the outer peripheral region 103 and between the FWD region 102 and the outer peripheral region 103 can be suppressed.

The configuration in which the $p^+$-type contact layer 4 enters the p-type well layer 16 is adopted as the first feature, but the effects of the first feature can be obtained as long as the $p^+$-type contact layer 4 and the p-type well layer 16 are in contact with each other. Since the RC-IGBT 100 further has the third feature, fifth feature, and sixth feature described above, the recovery loss during the operation of the FWD can be reduced.

The third feature is that the end portion, on the outer peripheral region 103 side, of the $p^+$-type contact layer 6 is located farther from the outer peripheral region 103 as compared with the end portion, on the outer peripheral region 103 side, of the $p^+$-type contact layer 4. With this, the average concentration of p-type impurities in the anode region of the FWD region 102 can be reduced, and the recovery loss can be reduced.

The fifth feature is that the area ratio of the $p^+$-type contact layer 6 to the entire FWD region 102 is set to be smaller than the area ratio of the p-type anode layer 5, whereby the recovery loss can be further reduced.

The sixth feature is that the area ratio of the $p^+$-type contact layer 6 in the FWD region 102 is set to be lower than the area ratio of the $p^+$-type contact layer 4 in the IGBT region 101. With this, the concentration of the excess carriers at the boundary with the IGBT region 101 can be reduced, and the recovery loss during the operation of the FWD can be reduced.

In the fourth feature described above, the $p^+$-type contact layer 6 is formed in a continuous single line shape extending in parallel with the embedded gate electrode 8, so that a pattern size becomes large, the dimensional variation during manufacturing can be suppressed, and a contact width can be stabilized. Thereby, the concentration of p-type impurities in the anode region of the FWD region 102 can be stabilized, and the recovery characteristics can be stably improved.

Second Preferred Embodiment

Figure 7:
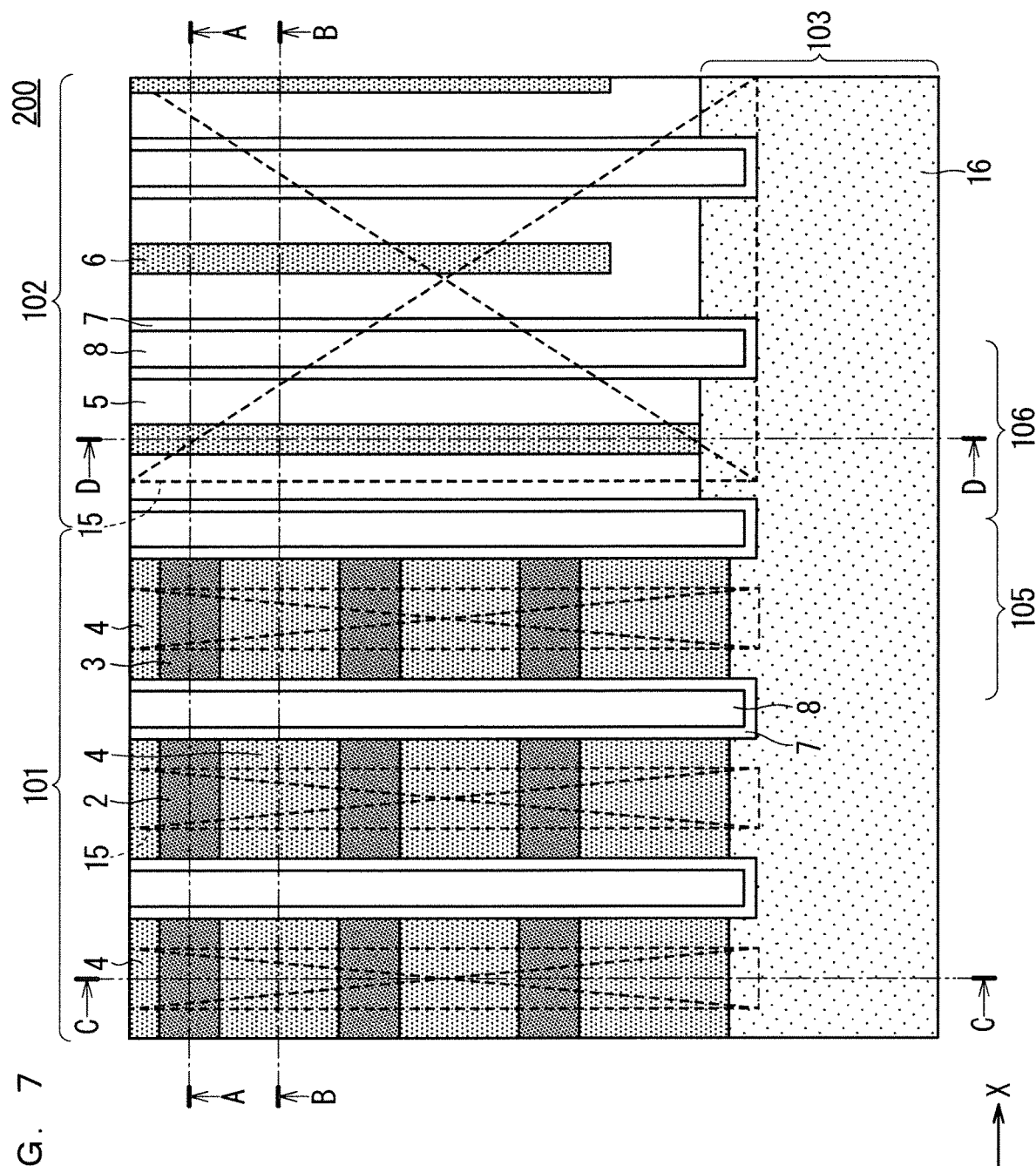
FIG. 7 is a partial plan view of an RC-IGBT according to a second preferred embodiment.
Figure 8:
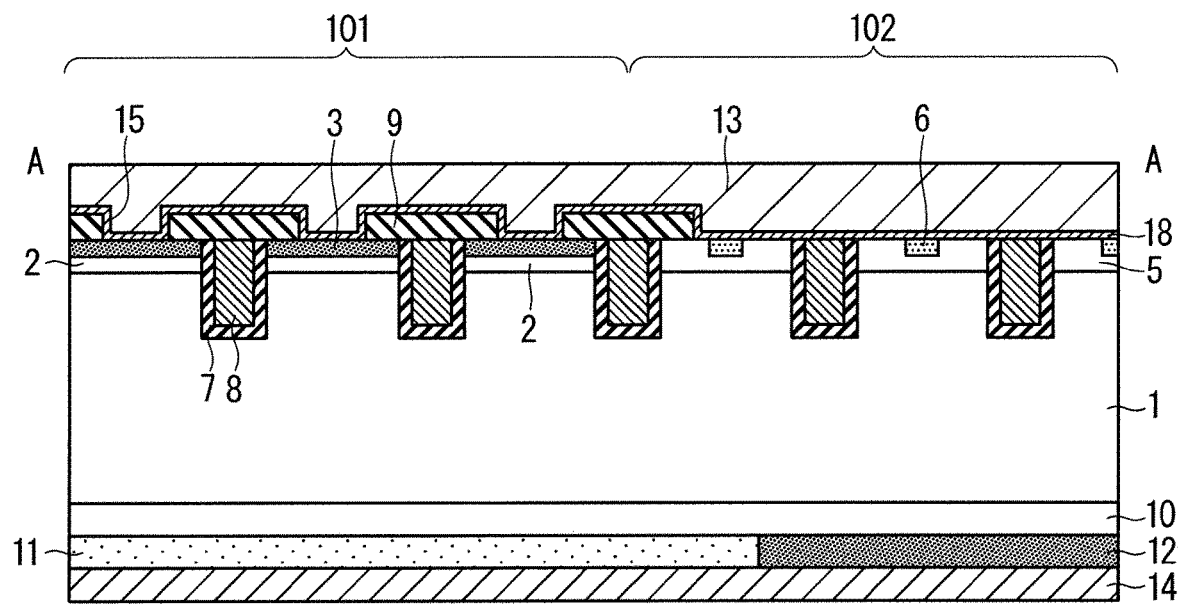
FIGS. 8 to 11 are each a partial cross-sectional view of the RC-IGBT according to the second preferred embodiment.
Figure 9:
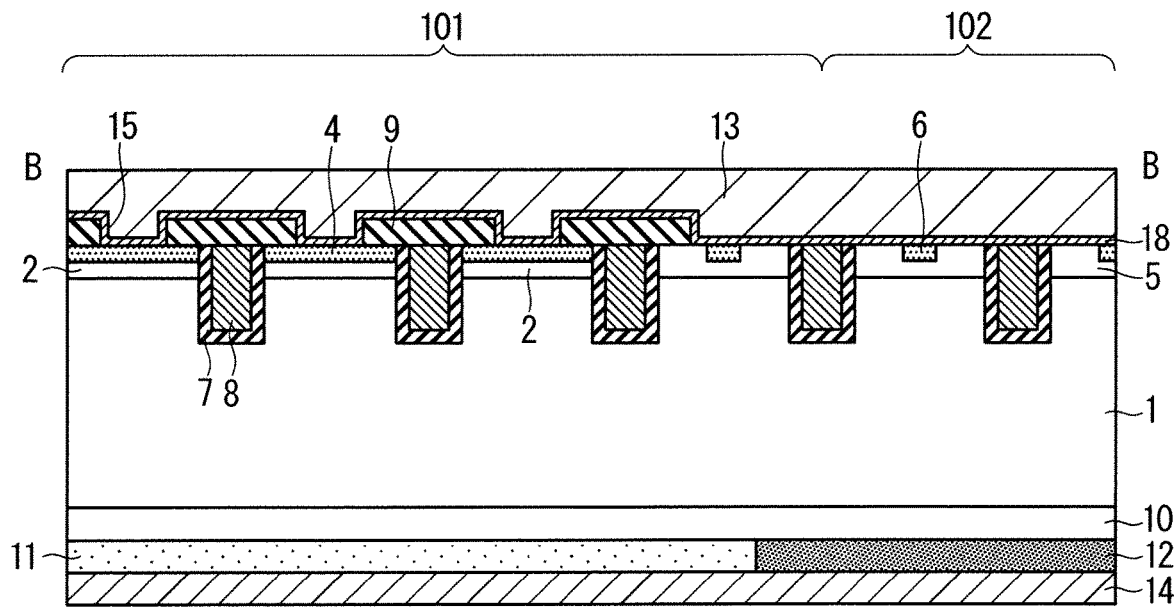
Figure 10:
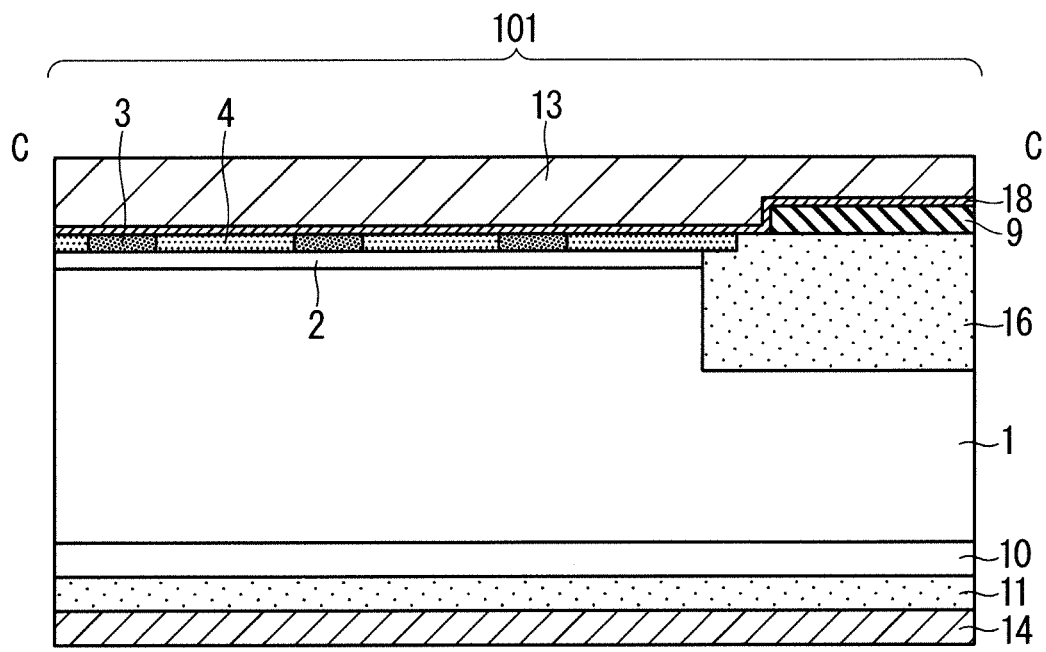
Figure 11:
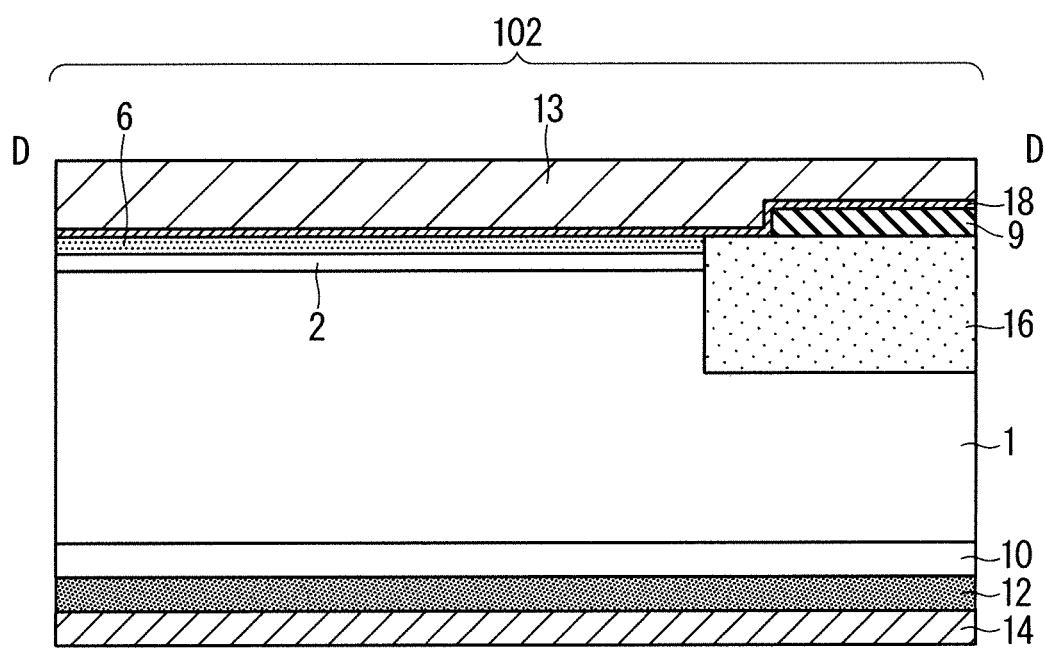

Next, an RC-IGBT 200 according to a second preferred embodiment will be described with reference to FIGS. 7 to 10. A plan view illustrating an entire chip of the RC-IGBT 200 is the same as FIG. 1, and FIG. 7 is a plan view illustrating the region X surrounded by the dashed line in FIG. 1. A cross-sectional view taken along the A-A line illustrated in FIG. 7 and viewed from the direction indicated by the arrows is illustrated in FIG. 8, a cross-sectional view taken along the B-B line and viewed from the direction indicated by the arrows is illustrated in FIG. 9, a cross-sectional view taken along the C-C line and viewed from the direction indicated by the arrows is illustrated in FIG. 10, and a cross-sectional view taken along the D-D line and viewed from the direction indicated by the arrows is illustrated in FIG. 11. In FIGS. 7 to 10, the same configurations as those of the RC-IGBT 100 described with reference to FIGS. 2 to 6 are designated by the same reference numerals, and duplicate description will be omitted.

In the RC-IGBT 200, a $p^+$-type contact layer 6 in an FWD unit cell region 106 that is a part of an FWD region 102 is formed to have a length by which the $p^+$-type contact layer 6 is connected to a p-type well layer 16 in an outer peripheral region 103, as illustrated in FIG. 7. FIG. 7 illustrates a configuration in which the $p^+$-type contact layer 6 in the FWD unit cell region 106 adjacent to an IGBT region 101 is formed to be longer than the other $p^+$-type contact layers 6 and its end portion is connected to the p-type well layer 16. However, it is not limited to this, and in each of a plurality of the FWD unit cell regions 106, the $p^+$-type contact layer 6 may be formed to have a length by which the $p^+$-type contact layer 6 is connected to the p-type well layer 16 in the outer peripheral region 103.

In the case of a structure corresponding to low-speed operation with a low carrier frequency, it is required to keep the collector-emitter voltage drop (VCEsat) of the IGBT and the forward voltage drop (VF) of the diode relatively low. To meet such a demand, it is necessary to take measures to enhance conductivity modulation in an on-state by: increasing the concentrations of impurities in a p$^+$-type collector layer 11, a p-type anode layer 5, etc.; or other means. In such a case, a tendency, in which while the operation of the IGBT is turned off, hole currents are concentrated on the boundaries between the IGBT region 101 and the outer peripheral region 103 and between the FWD region 102 and the outer peripheral region 103, is increased as described in the first preferred embodiment.

On the other hand, in the RC-IGBT 200 of the second preferred embodiment, the p$^+$-type contact layers 6 in the FWD unit cell regions 106 near the boundaries with the IGBT region 101 and with the outer peripheral region 103 are in contact with the p-type well layer 16 in the outer peripheral region 103. Further, a contact hole 15 is formed from the upper portion of the p$^+$-type contact layer 6 to the upper portion of the p-type well layer 16 in the outer peripheral region 103. Thereby, a region where the p-type well layer 16 and the p$^+$-type contact layer 6 are arranged becomes low in resistance, the potential becomes less likely to be increased even if the hole current is increased, so that a drop in the RBSOA can be suppressed.

Third Preferred Embodiment

Figure 12:
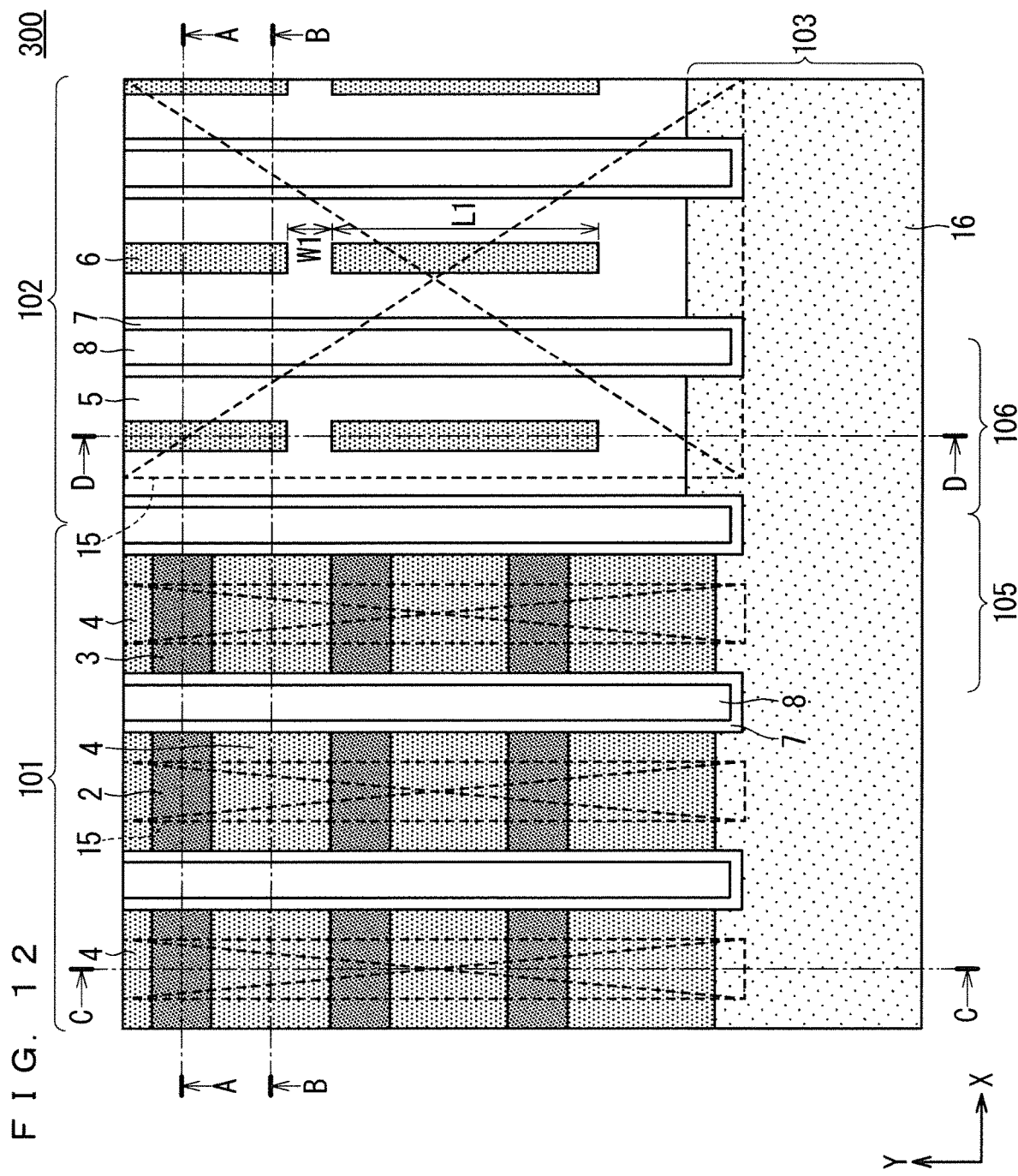
FIG. 12 is a partial plan view of an RC-IGBT according to a third preferred embodiment.
Figure 13:
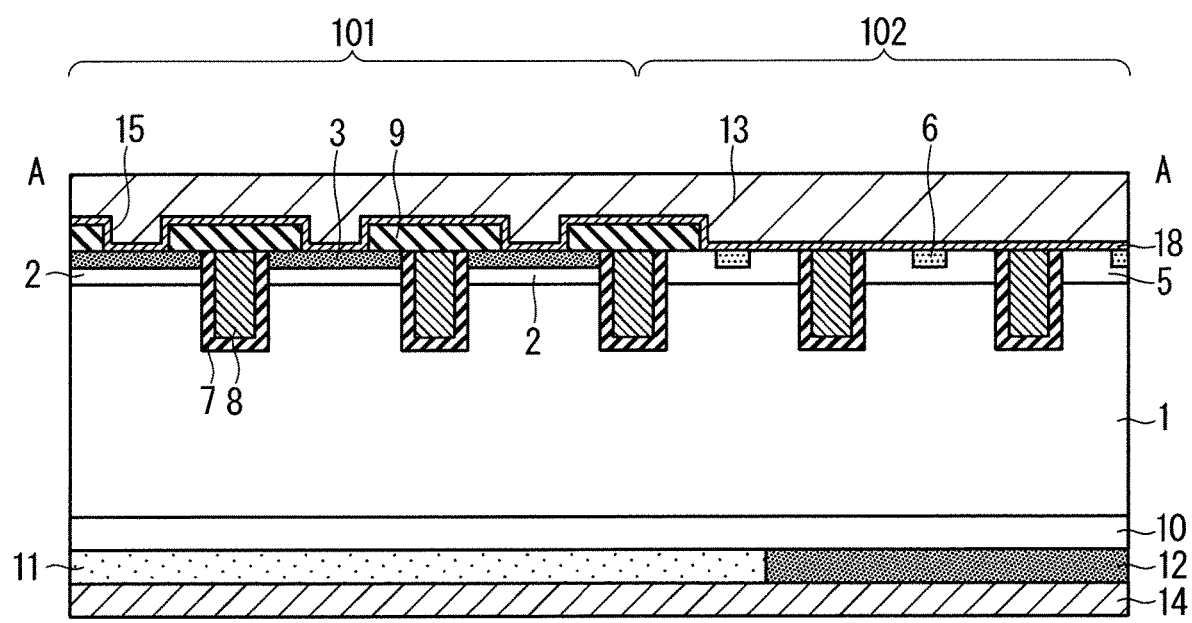
FIGS. 13 to 16 are each a partial cross-sectional view of the RC-IGBT according to the third preferred embodiment.
Figure 14:
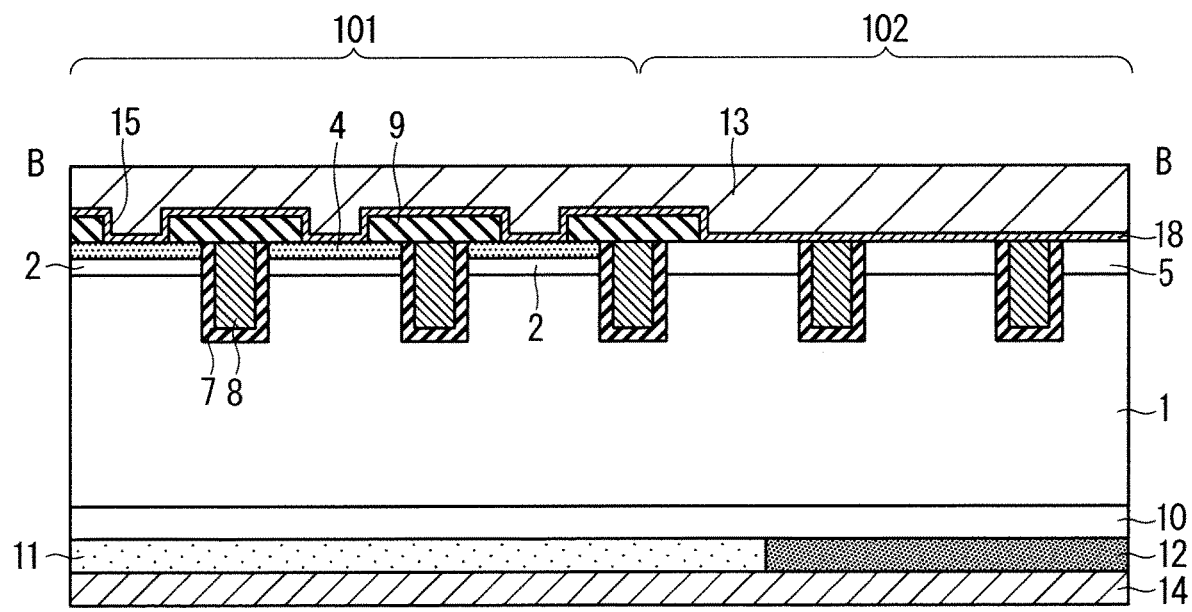
Figure 15:
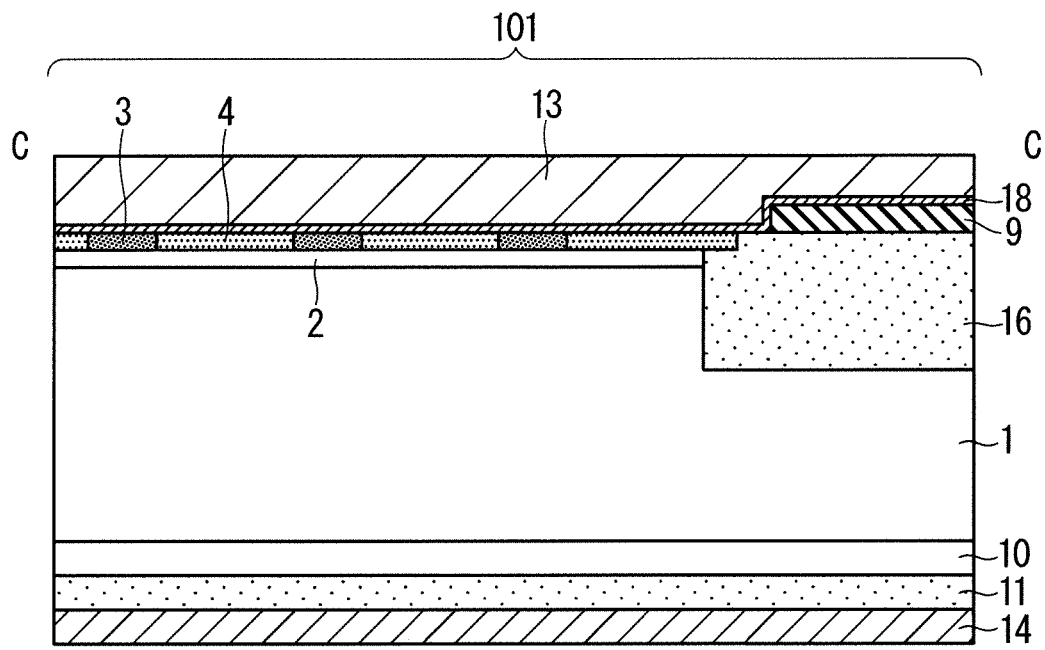
Figure 16:
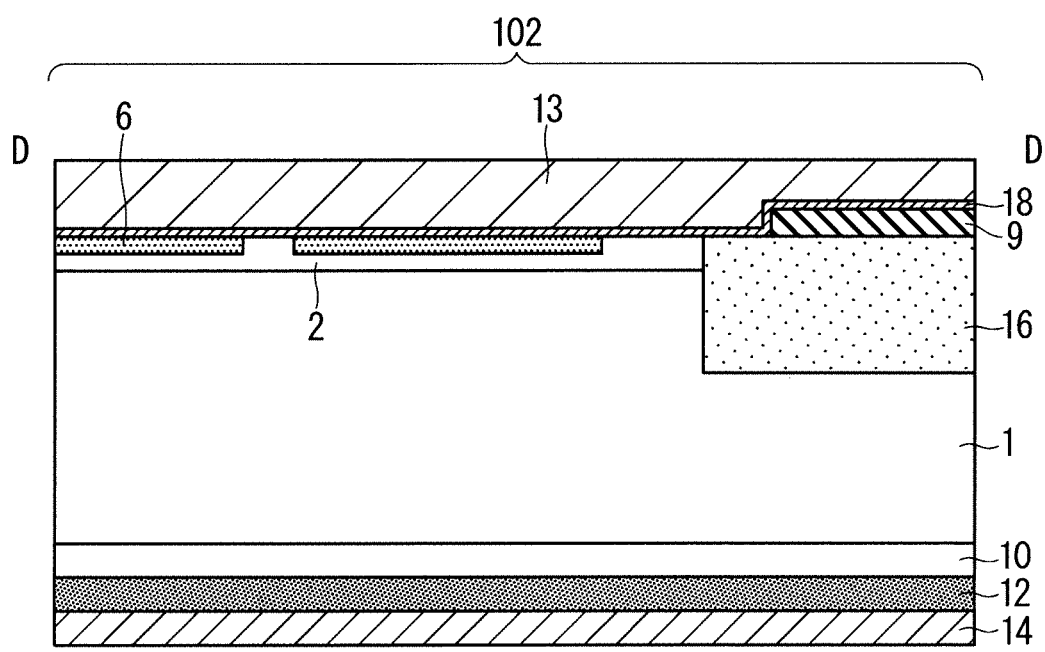

Next, an RC-IGBT 300 according to a third preferred embodiment will be described with reference to FIGS. 12 to 16. A plan view illustrating an entire chip of the RC-IGBT 300 is the same as FIG. 1, and FIG. 12 is a plan view illustrating the region X surrounded by the dashed line in FIG. 1. A cross-sectional view taken along the A-A line illustrated in FIG. 12 and viewed from the direction indicated by the arrows is illustrated in FIG. 13, a cross-sectional view taken along the B-B line and viewed from the direction indicated by the arrows is illustrated in FIG. 14, a cross-sectional view taken along the C-C line and viewed from the direction indicated by the arrows is illustrated in FIG. 15, and a cross-sectional view taken along the D-D line and viewed from the direction indicated by the arrows is illustrated in FIG. 16. In FIGS. 12 to 16, the same configurations as those of the RC-IGBT 100 described with reference to FIGS. 2 to 6 are designated by the same reference numerals, and duplicate description will be omitted.

As a first feature of the RC-IGBT 300, a plurality of p$^+$-type contact layers 6 each having, in plan view, an elongated rectangular shape extending in the Y direction, that are formed in an FWD region 102 are arranged discontinuously at intervals so as to form a line in the longitudinal direction thereof, as illustrated in FIG. 12. An arrangement interval W1 is set to be smaller than a length L1 in the longitudinal direction (L1>W1).

Thereby, a pattern size becomes large, the dimensional variation during manufacturing can be suppressed, a contact width can be stabilized, the concentration of p-type impurities in an anode region of the FWD region 102 can be stabilized, and the recovery characteristics can be stably improved.

As a second feature, the area ratio of the p$^+$-type contact layer 6 to the entire FWD region 102 is set to be smaller than the area ratio of a p-type anode layer 5. Thereby, the recovery loss can be further reduced.

Fourth Preferred Embodiment

Figure 17:
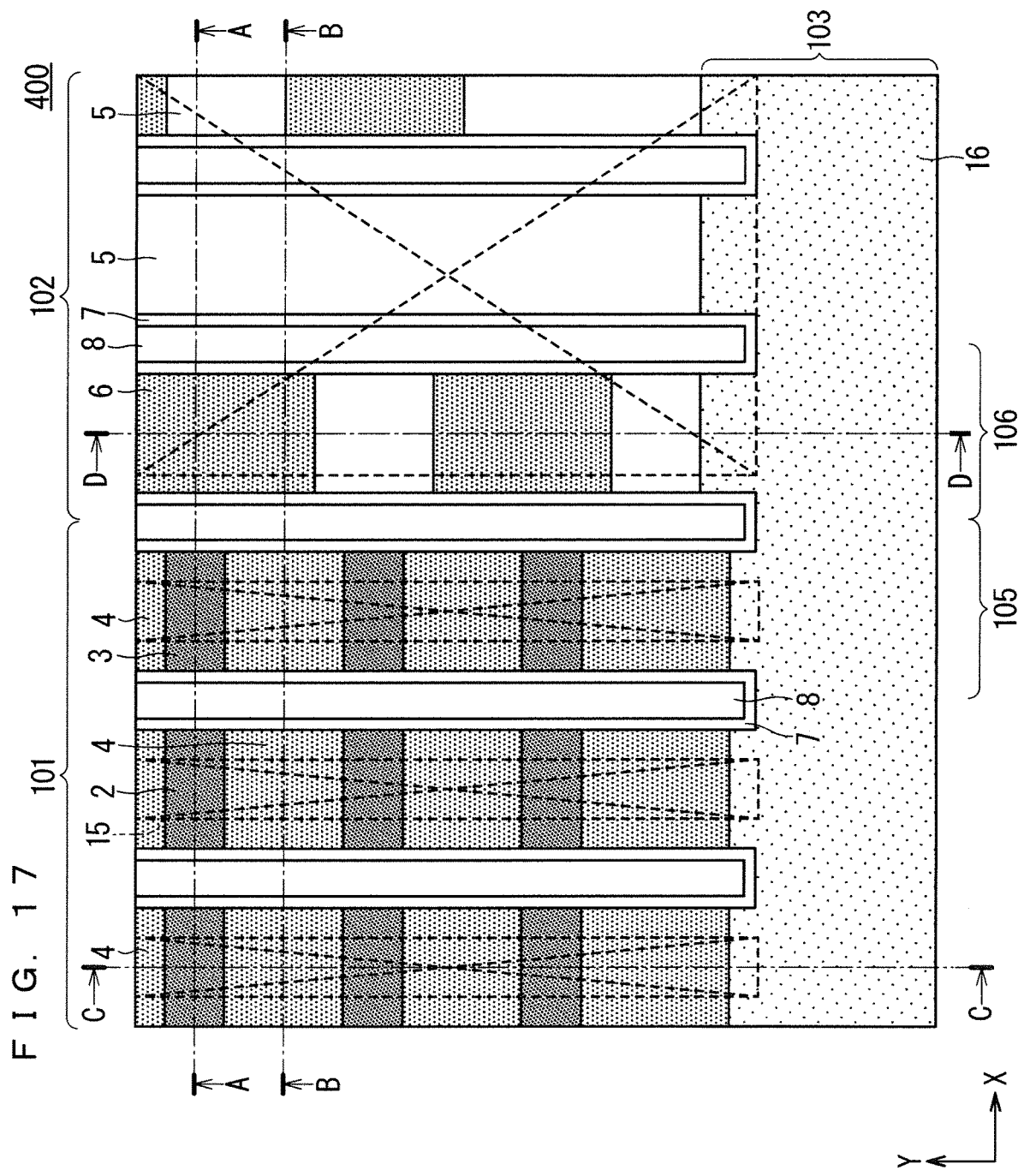
FIG. 17 is a partial plan view of an RC-IGBT according to a fourth preferred embodiment.
Figure 18:
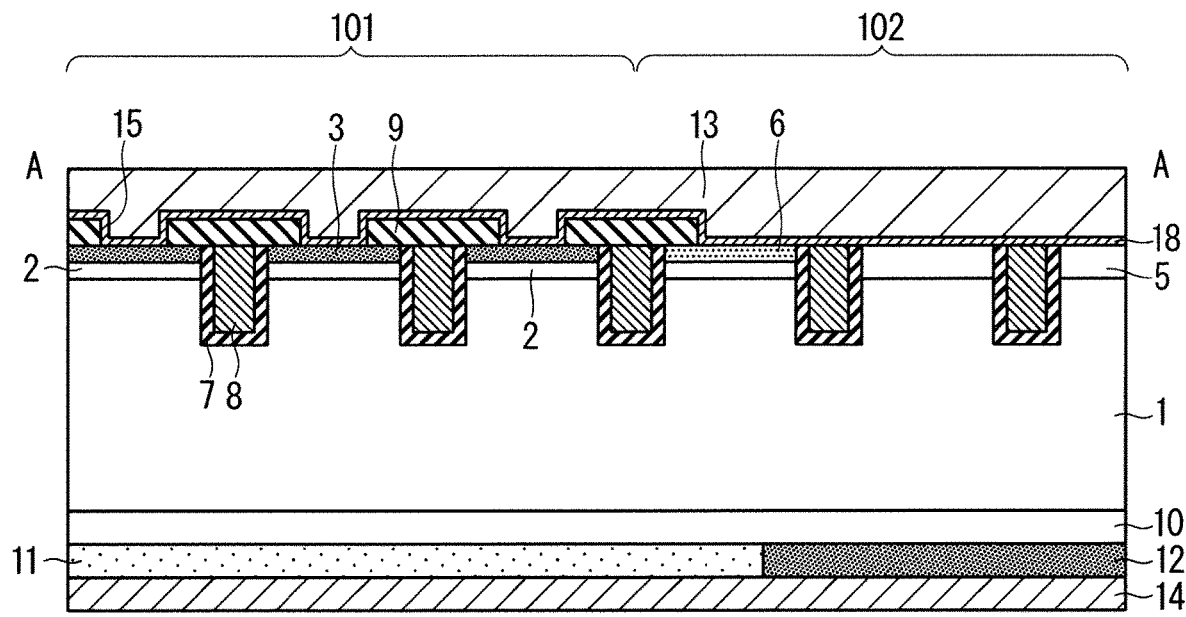
FIGS. 18 to 21 are each a partial cross-sectional view of the RC-IGBT according to the fourth preferred embodiment.
Figure 19:
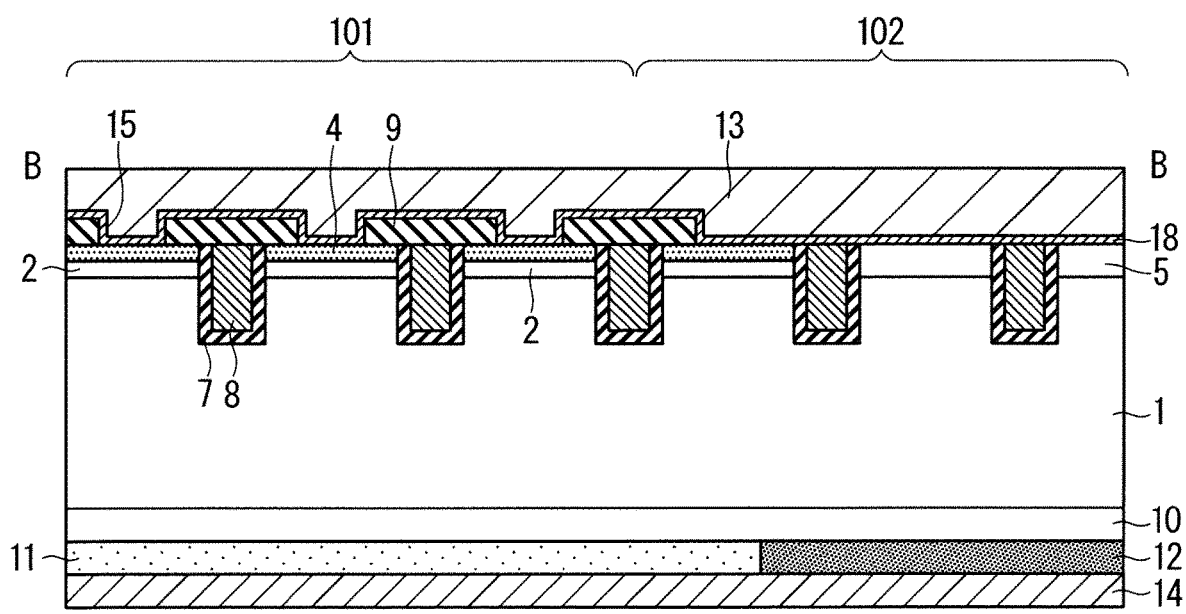
Figure 20:
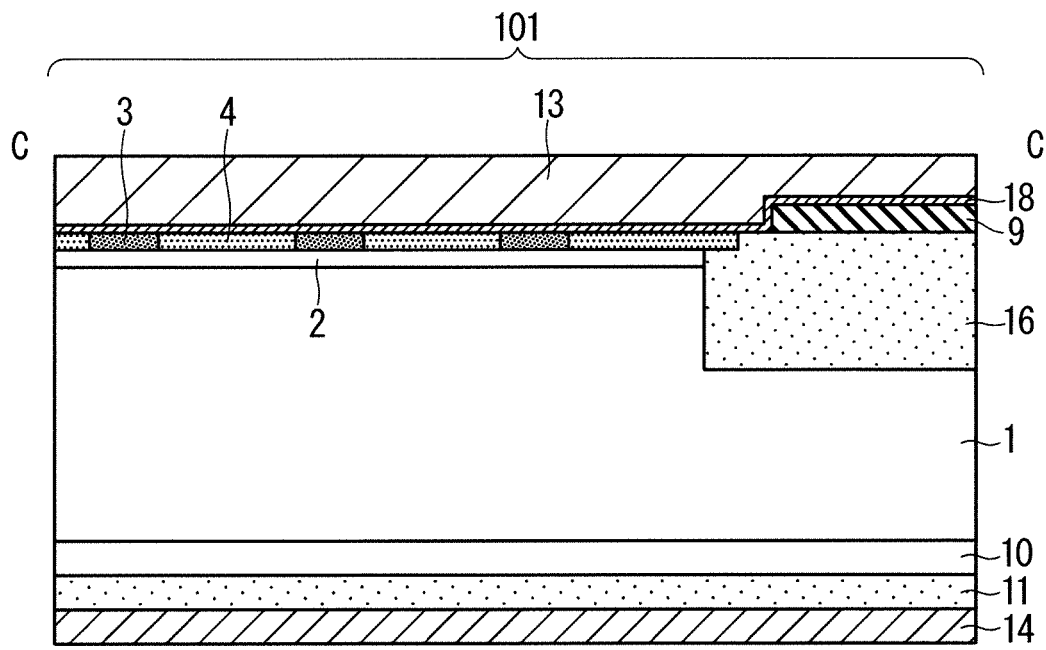
Figure 21:
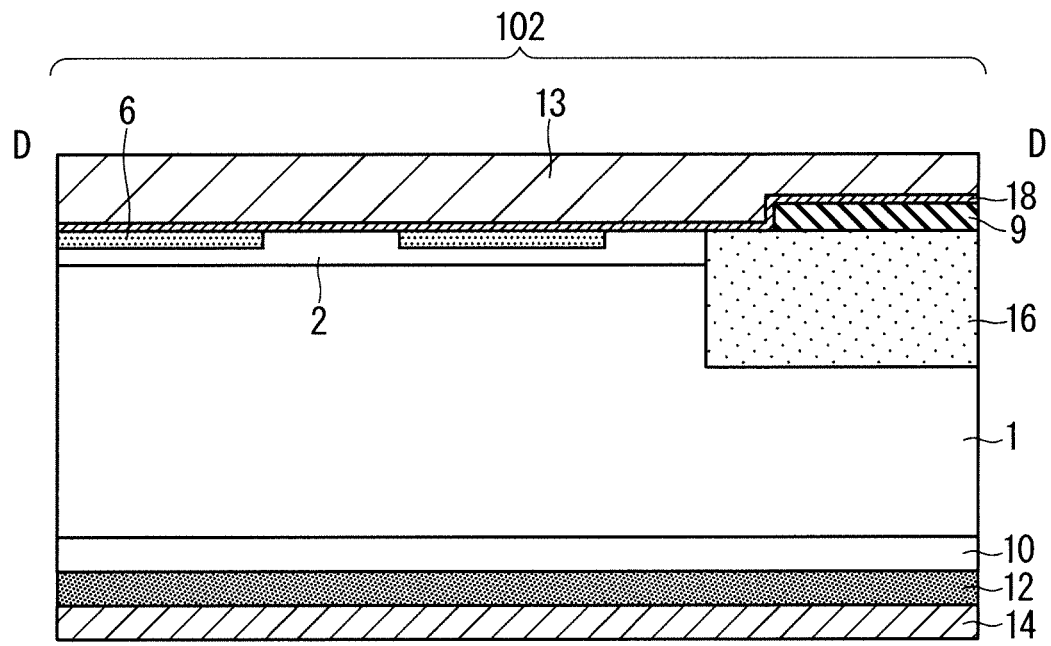

Next, an RC-IGBT 400 according to a fourth preferred embodiment will be described with reference to FIGS. 17 to 21. A plan view illustrating an entire chip of the RC-IGBT 400 is the same as FIG. 1, and FIG. 17 is a plan view illustrating the region X surrounded by the dashed line in FIG. 1. A cross-sectional view taken along the A-A line illustrated in FIG. 17 and viewed from the direction indicated by the arrows is illustrated in FIG. 18, a cross-sectional view taken along the B-B line and viewed from the direction indicated by the arrows is illustrated in FIG. 19, a cross-sectional view taken along the C-C line and viewed from the direction indicated by the arrows is illustrated in FIG. 20, and a cross-sectional view taken along the D-D line and viewed from the direction indicated by the arrows is illustrated in FIG. 21. In FIGS. 17 to 21, the same configurations as those of the RC-IGBT 100 described with reference to FIGS. 2 to 6 are designated by the same reference numerals, and duplicate description will be omitted.

As a first feature of the RC-IGBT 400, a plurality of FWD unit cell regions 106 in an FWD region 102 are composed of: unit cell regions (first diode unit cell regions) in each of which p$^+$-type contact layers 6 and p-type anode layers 5 are alternately formed in the extending direction of an embedded gate electrode 8 (Y direction); and unit cell regions (second diode unit cell regions) in each of which the p-type anode layer 5 is only formed without the p$^+$-type contact layer 6, as illustrated in FIG. 17. In the unit cell regions provided with the p$^+$-type contact layers 6, the area ratio of the p$^+$-type contact layer 6 is equal for every unit cell region. The unit cell regions provided with the p$^+$-type contact layers 6 and the unit cell regions provided with only the p-type anode layer 5 are alternately arranged.

Thereby, in two adjacent unit cell regions, the area ratio of the p$^+$-type contact layer 6 to the p-type anode layer 5 becomes equal to the area ratio of the p$^+$-type contact layer 6 to the p-type anode layer 5 in other two adjacent unit cell regions. Therefore, the area ratios of the p$^+$-type contact layer 6 to the entire FWD region 102 become equal, and the area ratio of the p$^+$-type contact layer 6 to the entire FWD region 102 becomes smaller than the area ratio of the p-type anode layer 5, so that the total area of the p$^+$-type contact layer 6 in the entire FWD region 102 can be made smaller than the total area of the p-type anode layer 5, whereby the recovery loss can be further reduced.

Further, the pattern size of the p$^+$-type contact layer 6 becomes large, the dimensional variation during manufacturing can be suppressed, a contact width can be stabilized, the concentration of p-type impurities in an anode region of the FWD region 102 can be stabilized, and the recovery characteristics can be stably improved.

As a second feature, the two unit cell regions each provided with the p$^+$-type contact layer 6, between which the unit cell region provided with only the p-type anode layer 5 is interposed, are formed such that the arrangement positions of the p$^+$-type contact layer 6 are different from each other in the Y direction, that is, the p$^+$-type contact layers 6 are arranged in a staggered pattern, as illustrated in FIG. 17. Thereby, the uniformity of the two-dimensional arrangement of the p$^+$-type contact layers 6 can be improved.

It should be noted that without having the second feature, the arrangement positions of the p$^+$-type contact layer 6 may be formed to be the same in the Y direction in the two unit cell regions each provided with the p$^+$-type contact layer 6.

Fifth Preferred Embodiment

Figure 22:
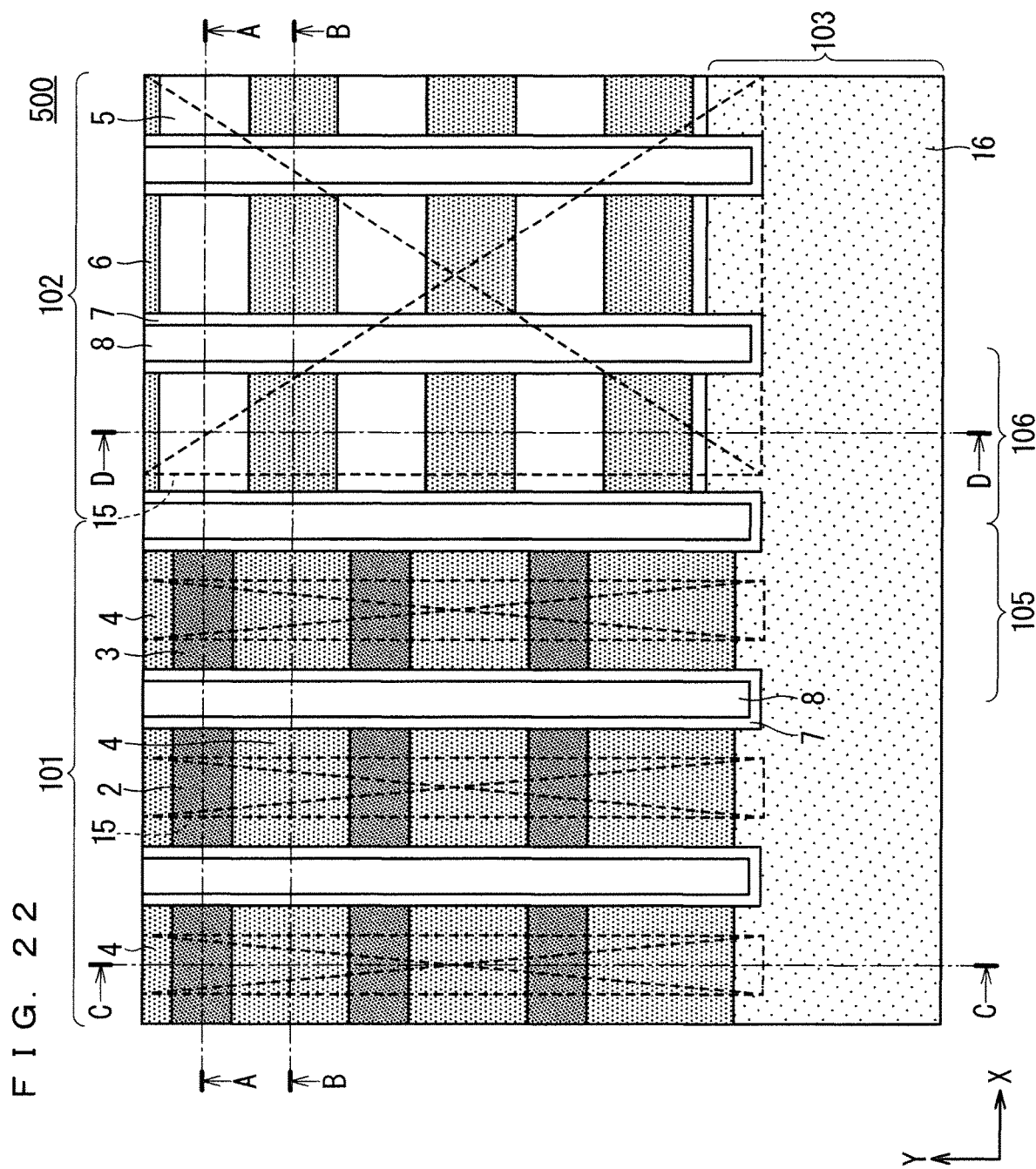
FIG. 22 is a partial plan view of an RC-IGBT according to a fifth preferred embodiment.
Figure 23:
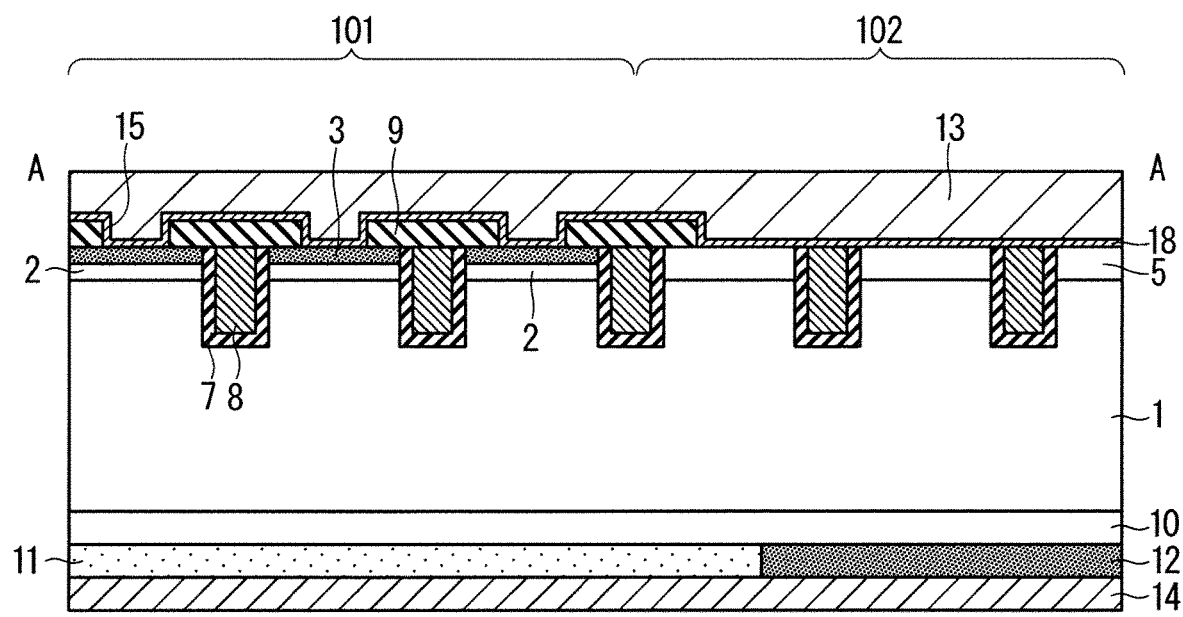
FIGS. 23 to 26 are each a partial cross-sectional view of the RC-IGBT according to the fifth preferred embodiment.
Figure 24:
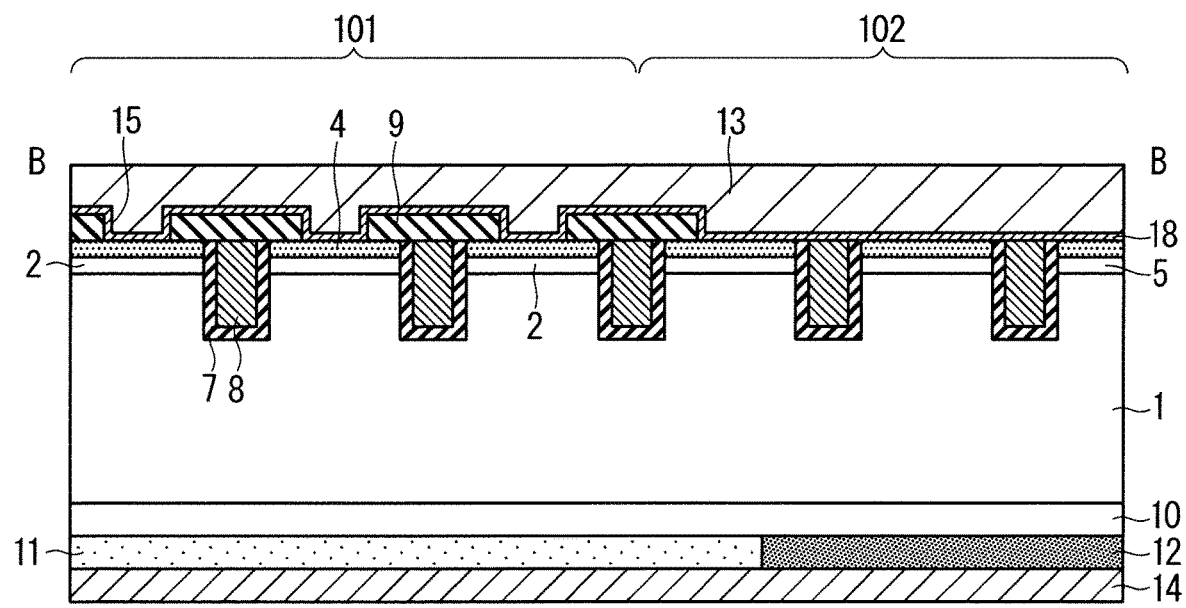
Figure 25:
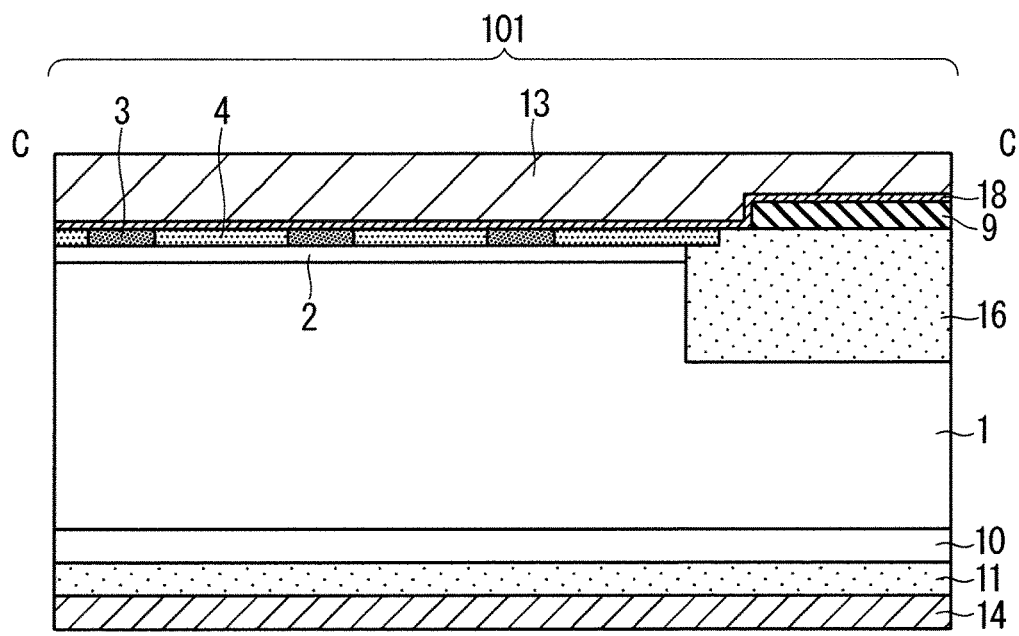
Figure 26:
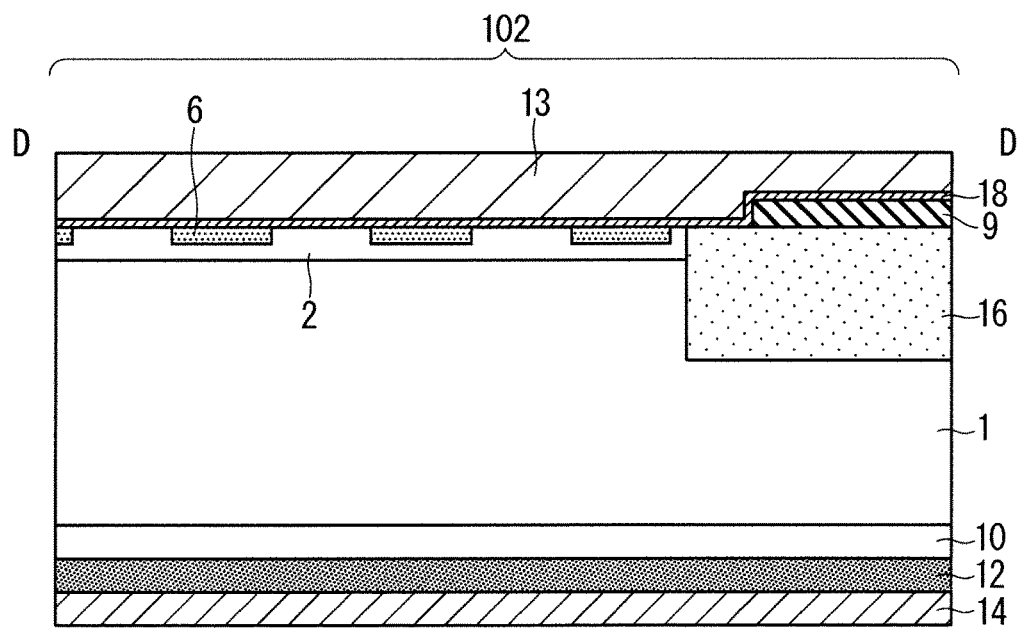

Next, an RC-IGBT 500 according to a fifth preferred embodiment will be described with reference to FIGS. 22 to 26. A plan view illustrating an entire chip of the RC-IGBT 500 is the same as FIG. 1, and FIG. 22 is a plan view illustrating the region X surrounded by the dashed line in FIG. 1. A cross-sectional view taken along the A-A line illustrated in FIG. 22 and viewed from the direction indicated by the arrows is illustrated in FIG. 23, a cross-sectional view taken along the B-B line and viewed from the direction indicated by the arrows is illustrated in FIG. 24, a cross-sectional view taken along the C-C line and viewed from the direction indicated by the arrows is illustrated in FIG. 25, and a cross-sectional view taken along the D-D line and viewed from the direction indicated by the arrows is illustrated in FIG. 26. In FIGS. 22 to 26, the same configurations as those of the RC-IGBT 100 described with reference to FIGS. 2 to 6 are designated by the same reference numerals, and duplicate description will be omitted.

As illustrated in FIG. 22, the RC-IGBT 500 is formed such that in an FWD unit cell region 106 of an FWD region 102, $p^+$-type contact layers 6 and p-type anode layers 5 are alternately formed in the extending direction of an embedded gate electrode 8 (Y direction) and the area ratio of the $p^+$-type contact layer 6 is smaller than the area ratio of the p-type anode layer 5.

Thereby, the total area of the $p^+$-type contact layer 6 in the entire FWD region 102 can be made smaller than the total area of the p-type anode layer 5, so that the recovery loss can be further reduced.

Further, the pattern size of the $p^+$-type contact layer 6 becomes large, the dimensional variation during manufacturing can be suppressed, a contact width can be stabilized, the concentration of p-type impurities in an anode region of the FWD region 102 can be stabilized, and the recovery characteristics can be stably improved.

Sixth Preferred Embodiment

Figure 27:
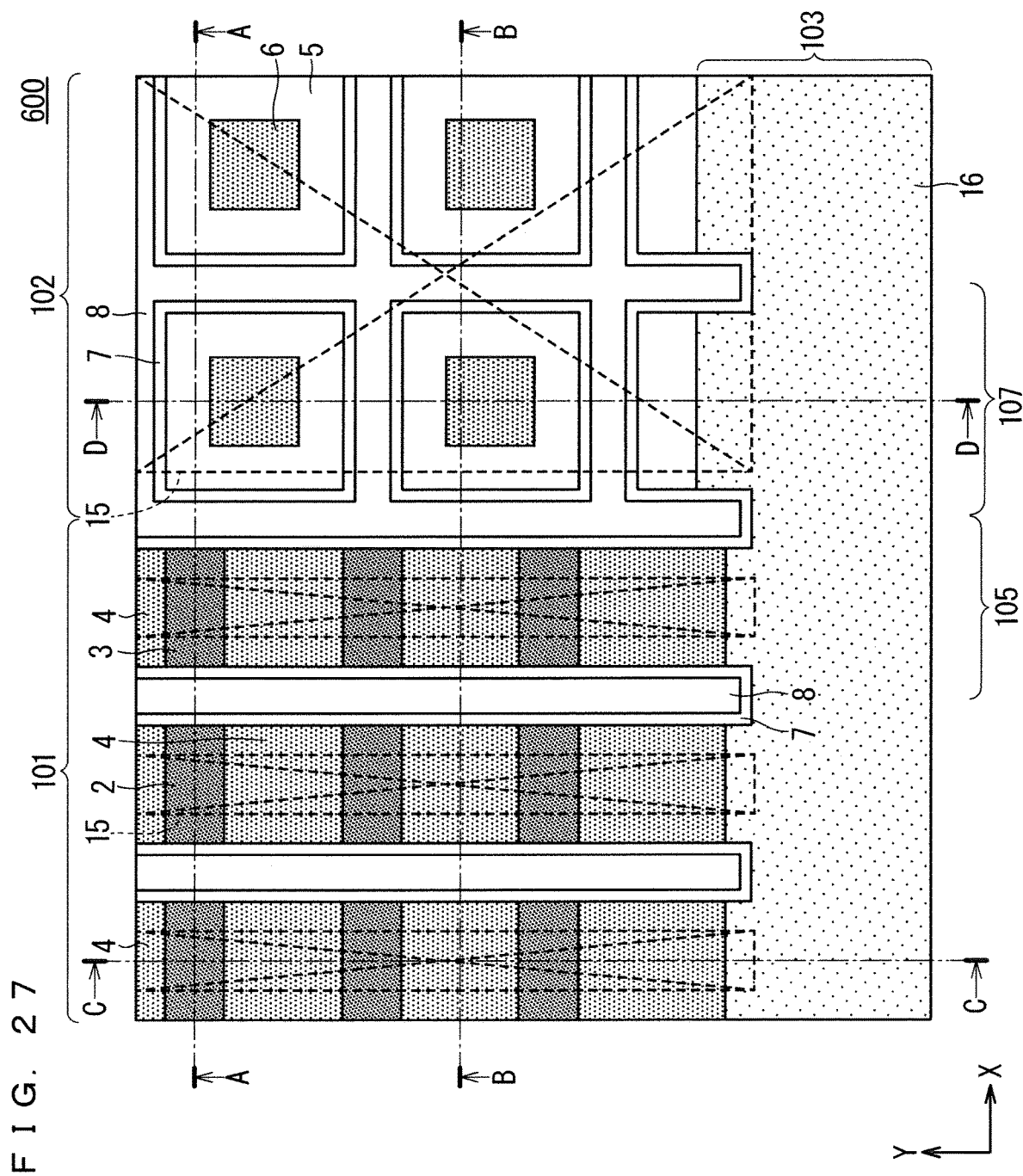
FIG. 27 is a partial plan view of an RC-IGBT according to a sixth preferred embodiment.
Figure 28:
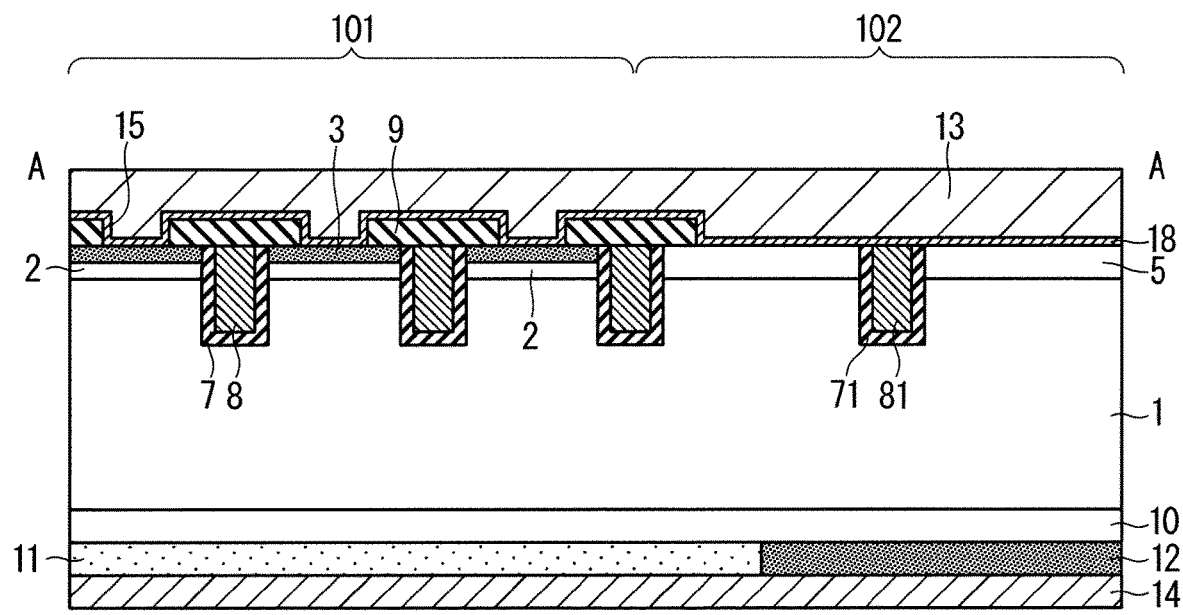
Figure 29:
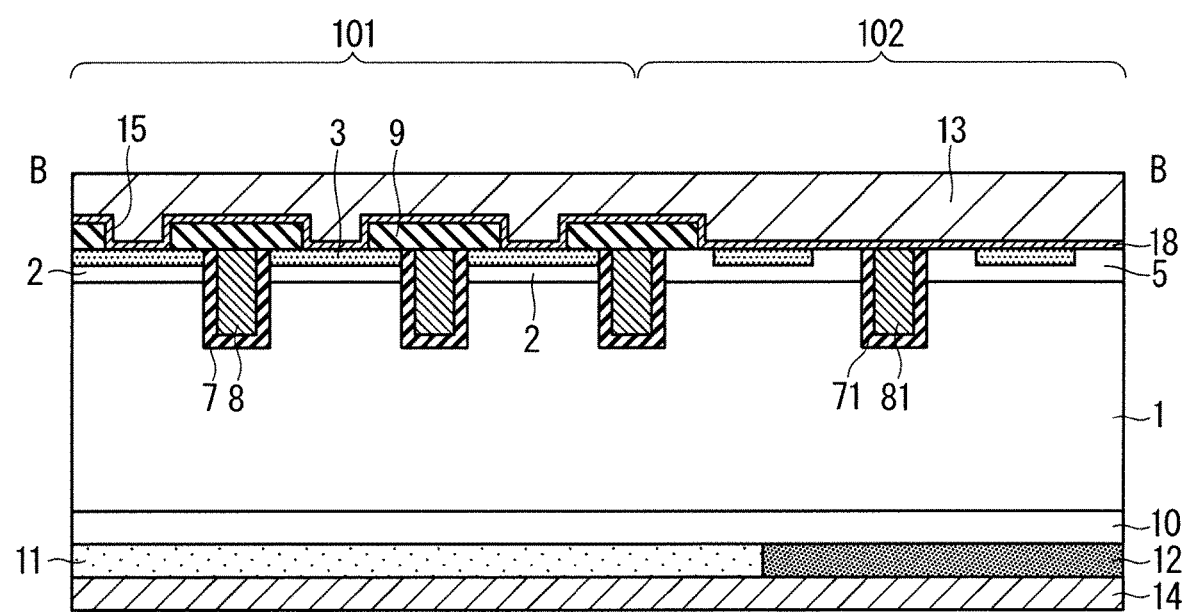

Next, an RC-IGBT 600 according to a sixth preferred embodiment will be described with reference to FIGS. 27 to 31. A plan view illustrating an entire chip of the RC-IGBT 600 is the same as FIG. 1, and FIG. 27 is a plan view illustrating the region X surrounded by the dashed line in FIG. 1. A cross-sectional view taken along the A-A line illustrated in FIG. 27 and viewed from the direction indicated by the arrows is illustrated in FIG. 28, a cross-sectional view taken along the B-B line and viewed from the direction indicated by the arrows is illustrated in FIG. 29, a cross-sectional view taken along the C-C line and viewed from the direction indicated by the arrows is illustrated in FIG. 30, and a cross-sectional view taken along the D-D line and viewed from the direction indicated by the arrows is illustrated in FIG. 31. In FIGS. 27 to 31, the same configurations as those of the RC-IGBT 100 described with reference to FIGS. 2 to 6 are designated by the same reference numerals, and duplicate description will be omitted.

In the RC-IGBT 600, an FWD region 102 is divided into a plurality of FWD unit cell regions 107 each having a rectangular shape by a mesh-shaped embedded gate electrode 81 having a trench structure, as illustrated in FIG. 27. In the mesh-shaped embedded gate electrode 81, embedded gate electrodes each having a stripe shape are provided not only in the Y direction but also in the X direction to form a so-called matrix. The cross-sectional shape of the mesh-shaped embedded gate electrode 81 is the same as that of the embedded gate electrode 8 in the X and Y directions, and as illustrated in FIGS. 28 and 31, a gate insulating film 71 is provided on the side surface and bottom surface of the embedded gate electrode 81.

A $p^+$-type contact layer 6 having a rectangular shape is provided in the central portion of the FWD unit cell region 107, and a p-type anode layer 5 is provided around the $p^+$-type contact layer 6. It is formed such that in the FWD unit cell region 107, the area ratio of the $p^+$-type contact layer 6 is smaller than the area ratio of the p-type anode layer 5.

Thereby, the total area of the $p^+$-type contact layer 6 in the entire FWD region 102 can be made smaller than the total area of the p-type anode layer 5, so that the recovery loss can be further reduced.

Further, the pattern size of the $p^+$-type contact layer 6 becomes large, the dimensional variation during manufacturing can be suppressed, a contact width can be stabilized, the concentration of p-type impurities in an anode region of the FWD region 102 can be stabilized, and the recovery characteristics can be stably improved.

Seventh Preferred Embodiment

Figure 32:
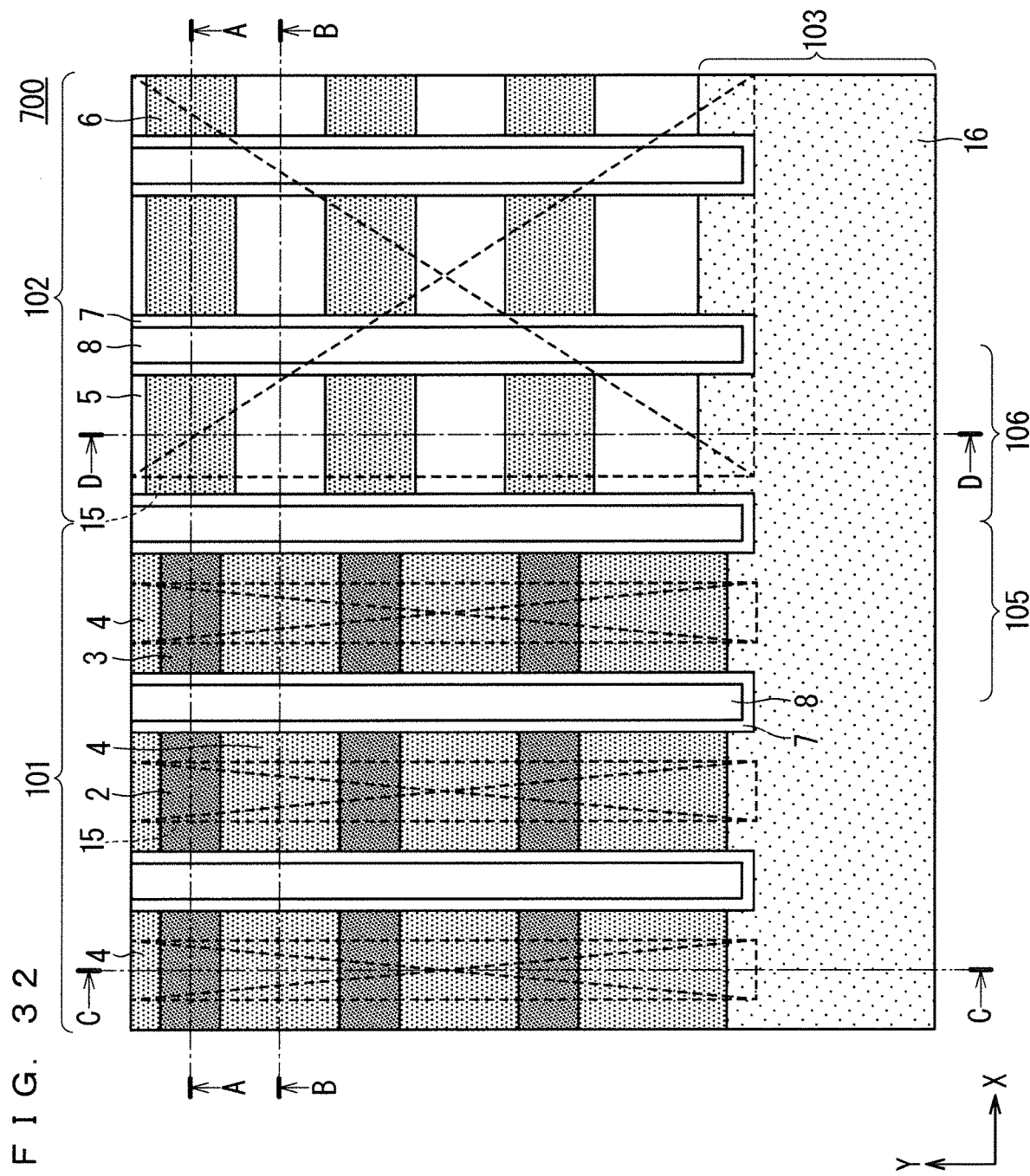
FIG. 32 is a partial plan view of an RC-IGBT according to a seventh preferred embodiment.
Figure 33:
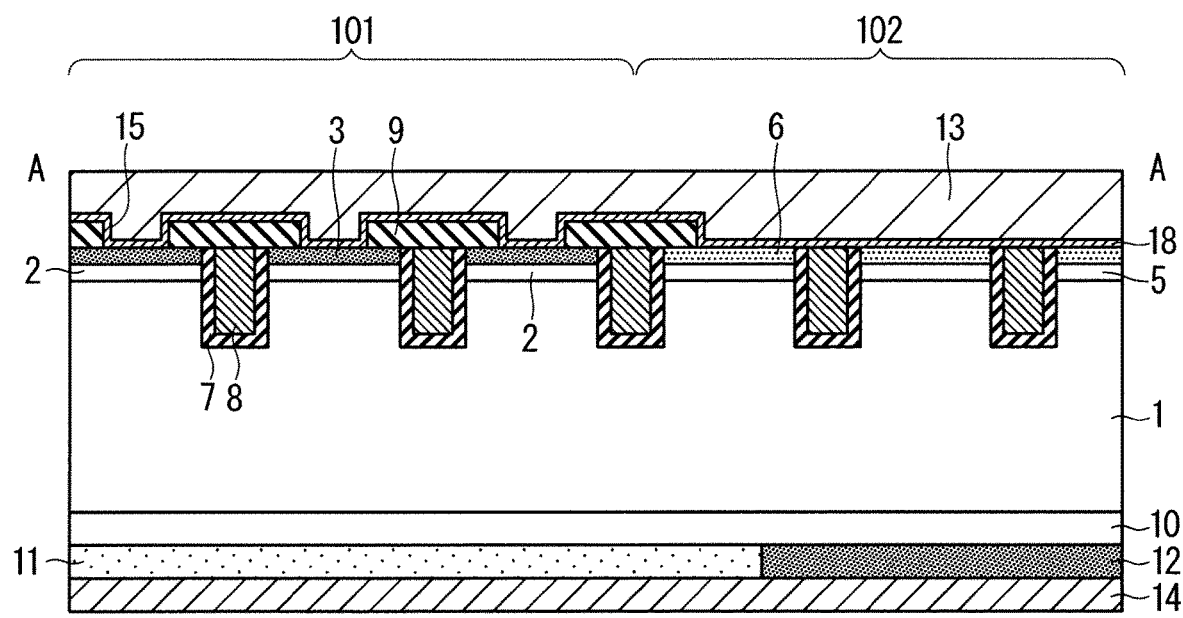
FIGS. 33 to 36 are each a partial cross-sectional view of the RC-IGBT according to the seventh preferred embodiment.
Figure 34:
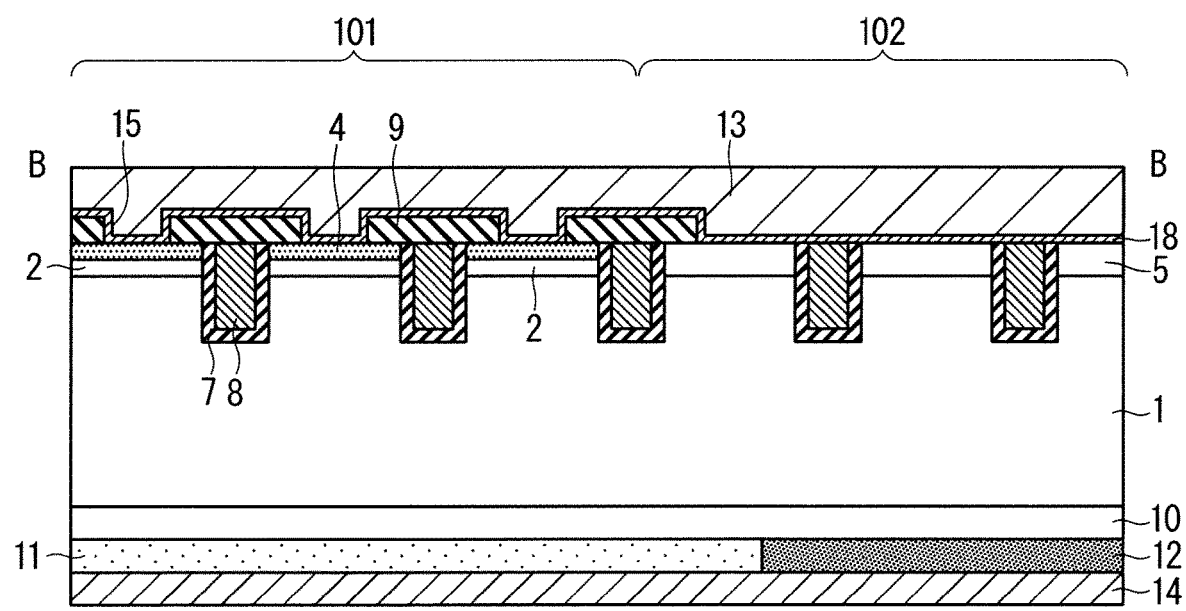
Figure 35:
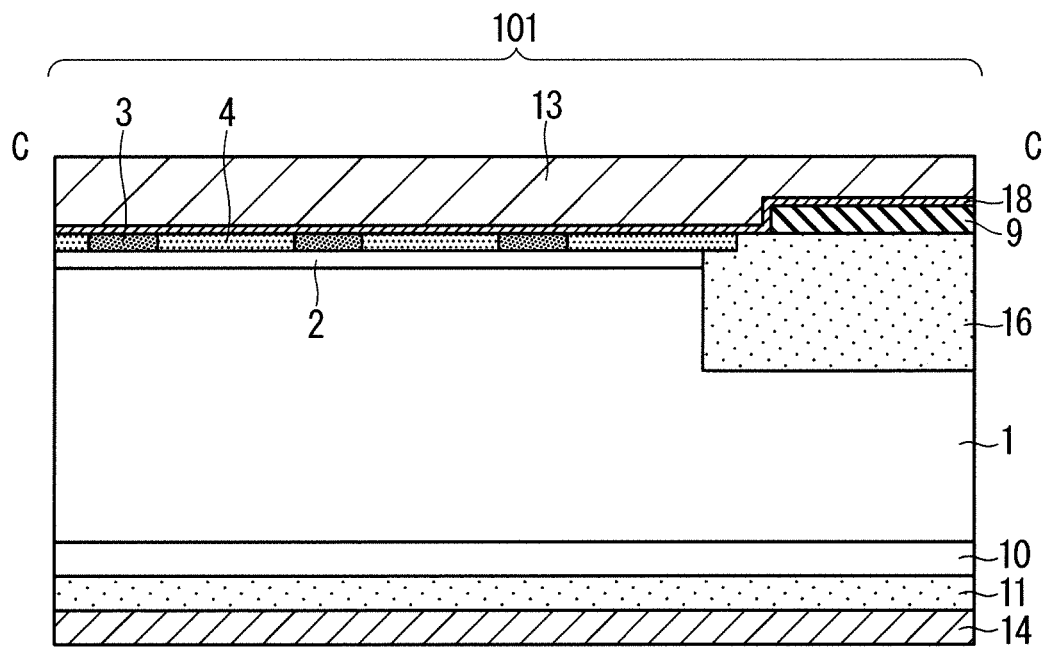
Figure 36:
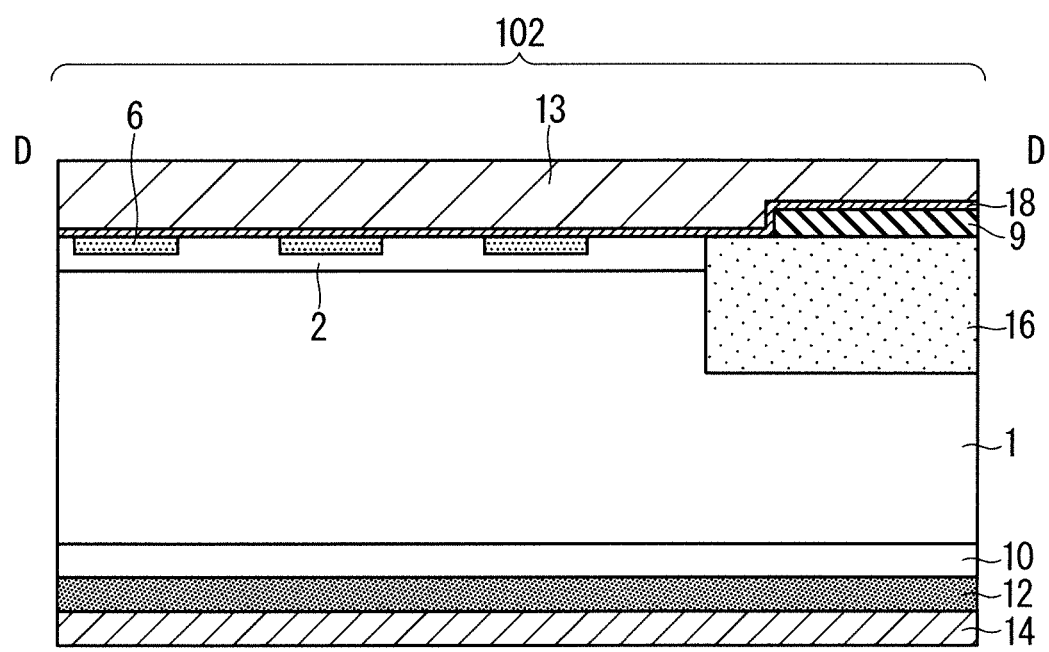

Next, an RC-IGBT 700 according to a seventh preferred embodiment will be described with reference to FIGS. 32 to 36. A plan view illustrating an entire chip of the RC-IGBT 700 is the same as FIG. 1, and FIG. 32 is a plan view illustrating the region X surrounded by the dashed line in FIG. 1. A cross-sectional view taken along the A-A line illustrated in FIG. 32 and viewed from the direction indicated by the arrows is illustrated in FIG. 33, a cross-sectional view taken along the B-B line and viewed from the direction indicated by the arrows is illustrated in FIG. 34, a cross-sectional view taken along the C-C line and viewed from the direction indicated by the arrows is illustrated in FIG. 35, and a cross-sectional view taken along the D-D line and viewed from the direction indicated by the arrows is illustrated in FIG. 36. In FIGS. 32 to 36, the same configurations as those of the RC-IGBT 100 described with reference to FIGS. 2 to 6 are designated by the same reference numerals, and duplicate description will be omitted.

In the RC-IGBT 700, $p^+$-type contact layers 6 and p-type anode layers 5 are alternately formed in the extending direction of an embedded gate electrode 8 (Y direction) in an FWD unit cell region 106 of an FWD region 102, as illustrated in FIG. 32.

Here, the arrangement positions of the $p^+$-type contact layer 6 in the FWD unit cell region 106 face, in plan view, $n^+$-type emitter layers 3 in an IGBT unit cell region 105 via the embedded gate electrode 8.

Thereby, a structure is created in which a hole current is less likely to flow into a p-type channel doped layer 2, where the $n^+$-type emitter layer 3 is formed, in the IGBT unit cell region 105 near the FWD unit cell region 106, so that a drop in the safe operating area during the operation of the IGBT can be suppressed.

It is formed such that in the FWD unit cell region 106, the area ratio of the $p^+$-type contact layer 6 is smaller than the area ratio of the p-type anode layer 5.

Thereby, the total area of the $p^+$-type contact layer 6 in the entire FWD region 102 can be made smaller than the total area of the p-type anode layer 5, so that the recovery loss can be further reduced.

Eighth Preferred Embodiment

Figure 37:
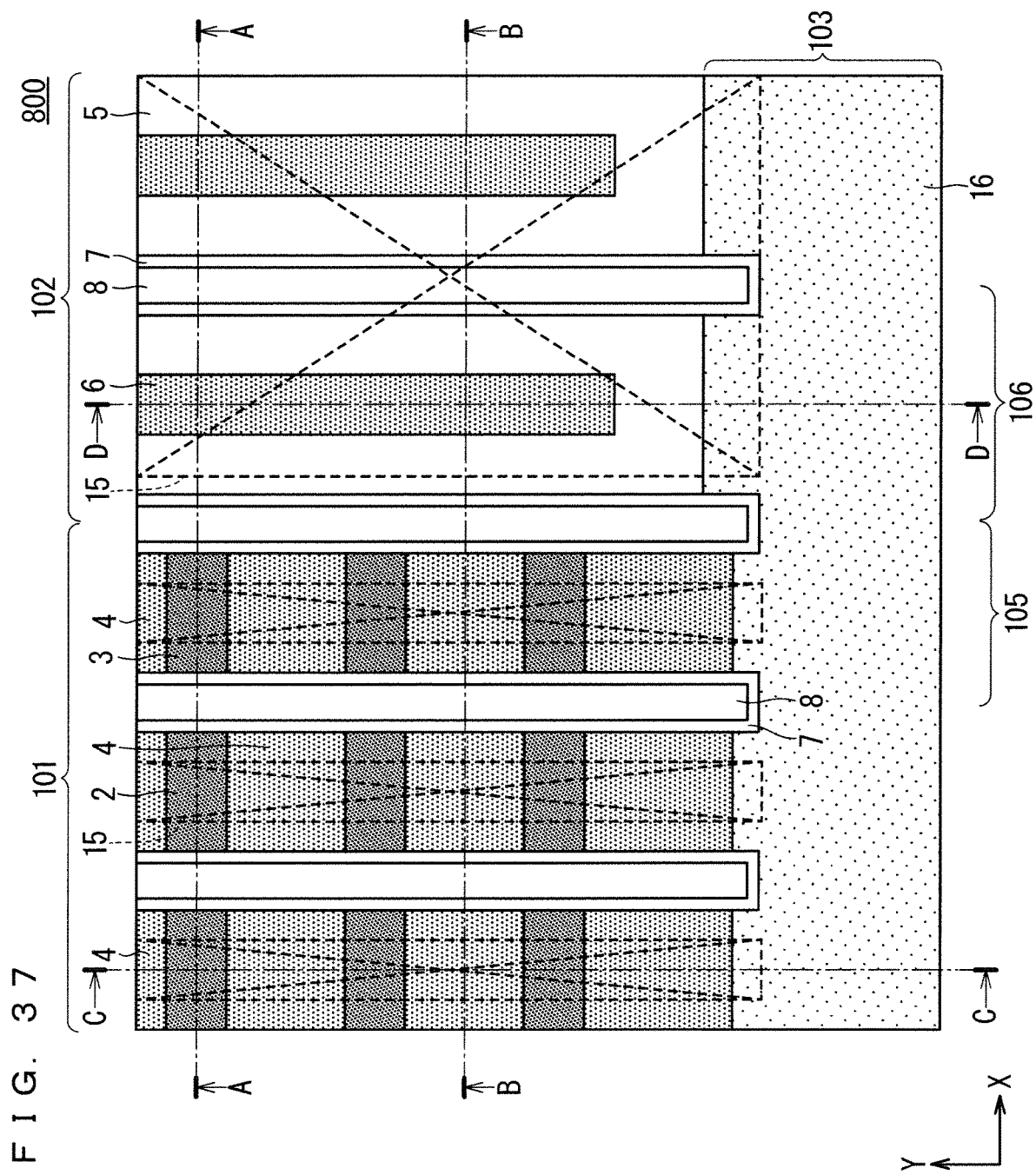
FIG. 37 is a partial plan view of an RC-IGBT according to an eighth preferred embodiment.
Figure 38:
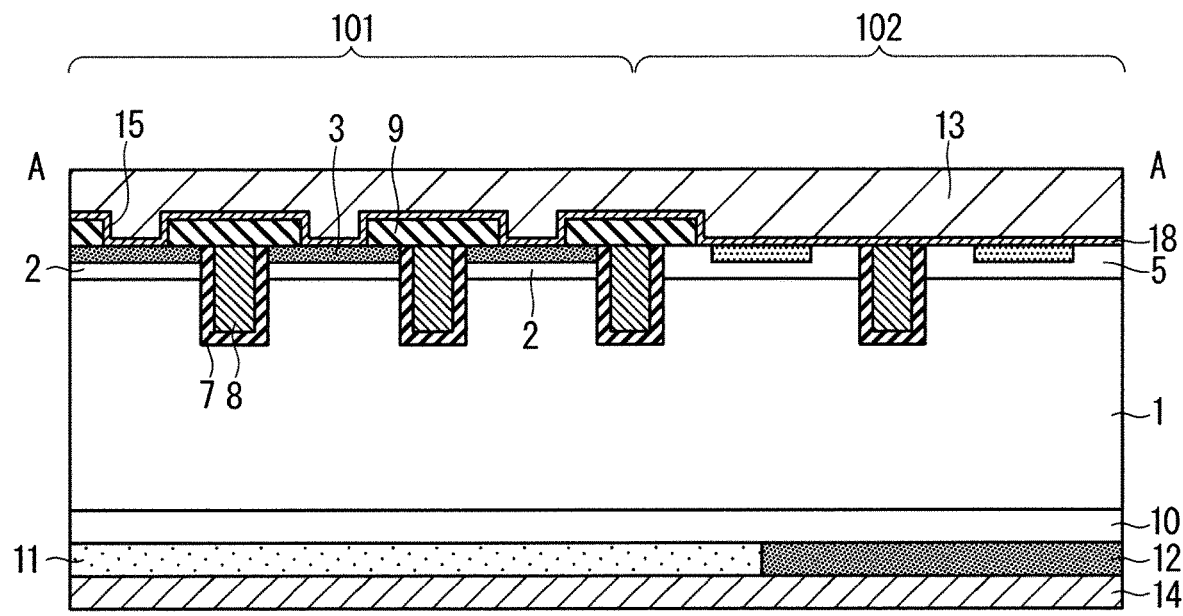
FIGS. 38 to 41 are each a partial cross-sectional view of the RC-IGBT according to the eighth preferred embodiment.
Figure 39:
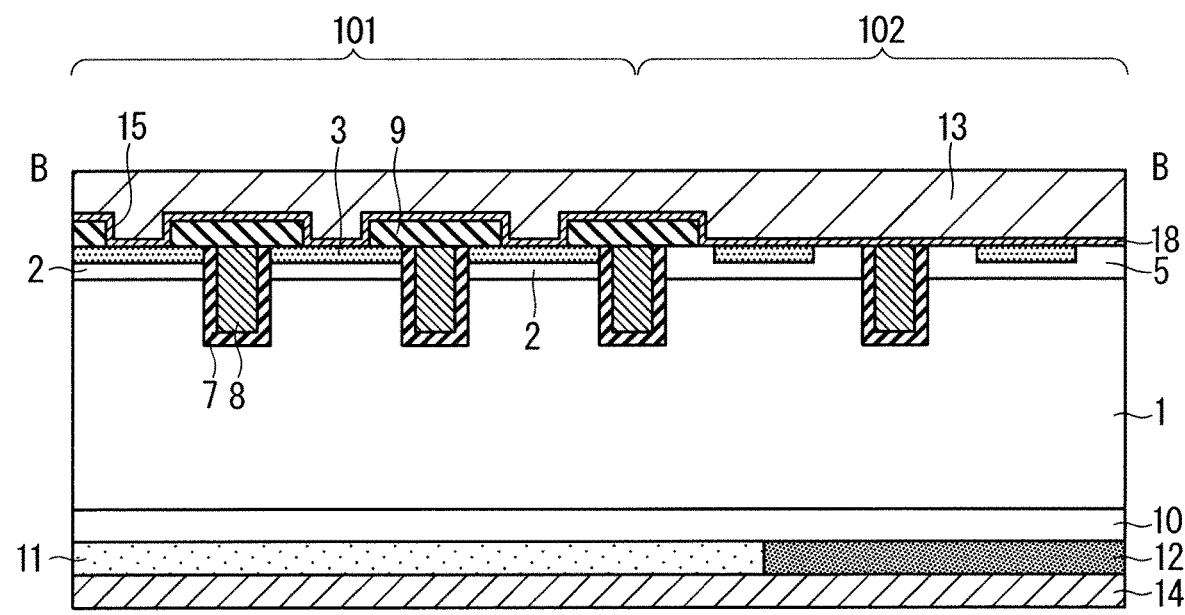
Figure 40:
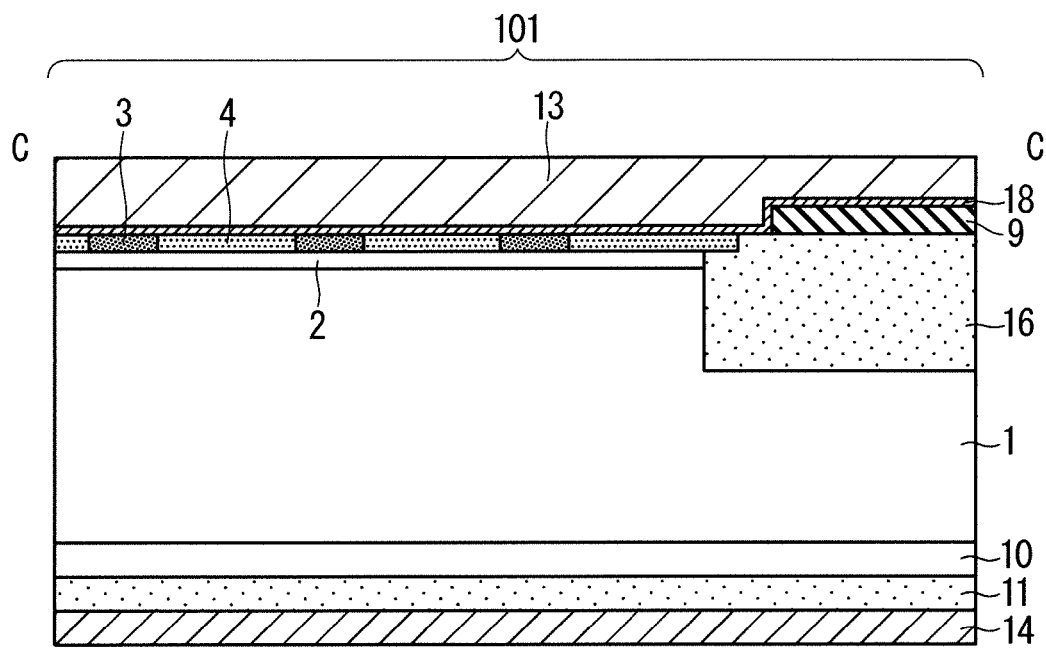
Figure 41:
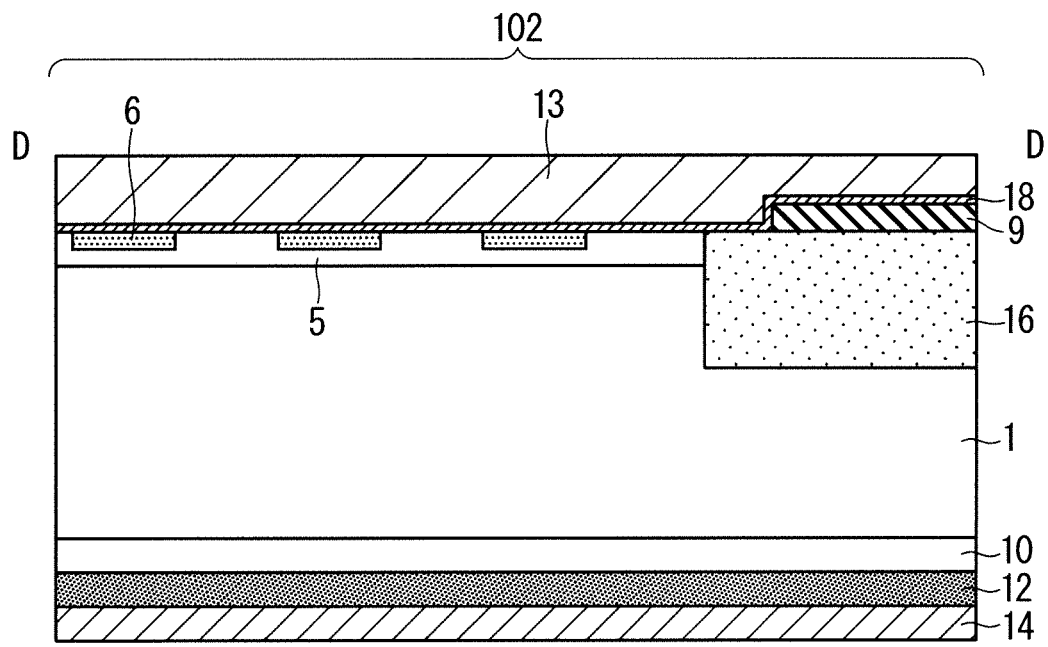

Next, an RC-IGBT 800 according to an eighth preferred embodiment will be described with reference to FIGS. 37 to 41. A plan view illustrating an entire chip of the RC-IGBT 800 is the same as FIG. 1, and FIG. 37 is a plan view illustrating the region X surrounded by the dashed line in FIG. 1. A cross-sectional view taken along the A-A line illustrated in FIG. 37 and viewed from the direction indicated by the arrows is illustrated in FIG. 38, a cross-sectional view taken along the B-B line and viewed from the direction indicated by the arrows is illustrated in MG. 39, a cross-sectional view taken along the C-C line and viewed from the direction indicated by the arrows is illustrated in FIG. 40, and a cross-sectional view taken along the D-D line and viewed from the direction indicated by the arrows is illustrated in FIG. 41. In FIGS. 37 to 41, the same configurations as those of the RC-IGBT 100 described with reference to FIGS. 2 to 6 are designated by the same reference numerals, and duplicate description will be omitted.

In the RC-IGBT 800, an arrangement interval between embedded gate electrodes 8 in an FWD region 102 is set to be larger than an arrangement interval between embedded gate electrodes 8 in an IGBT region 101, as illustrated in FIG. 37.

This is because it is intended that in a state in which a voltage is applied between an emitter and a collector while the operation of the IGB is turned off, an electric field directly under the embedded gate electrode 8 in the FWD region 102 becomes larger than that directly under the embedded gate electrode 8 in the IGBT region 101.

Thereby, when avalanche breakdown is expected to occur, it can be made to occur in the FWD region 102 instead of the IGBT region 101, so that overvoltage breakdown can be suppressed.

The width (length in the X direction) of an FWD unit cell region 106 is also increased by the increase in the arrangement interval between the embedded gate electrodes 8 in the FWD region 102, but it is formed such that the area ratio of a $p^+$-type contact layer 6 is smaller than the area ratio of a p-type anode layer 5.

Thereby, the total area of the $p^+$-type contact layer 6 in the entire FWD region 102 can be made smaller than the total area of the p-type anode layer 5, so that the recovery loss can be further reduced.

Ninth Preferred Embodiment

Figure 42:
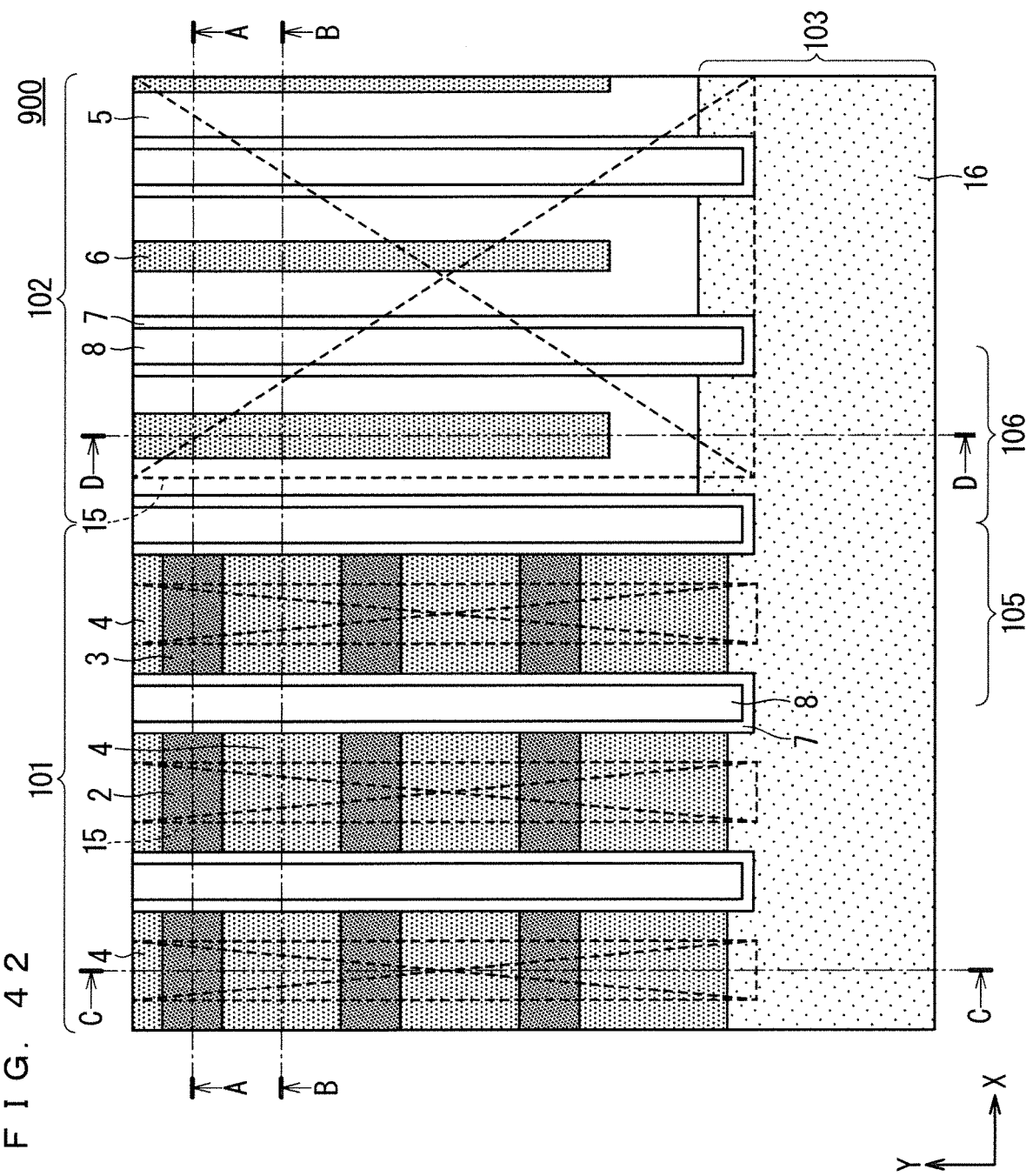
FIG. 42 is a partial plan view of an RC-IGBT according to a ninth preferred embodiment.
Figure 43:
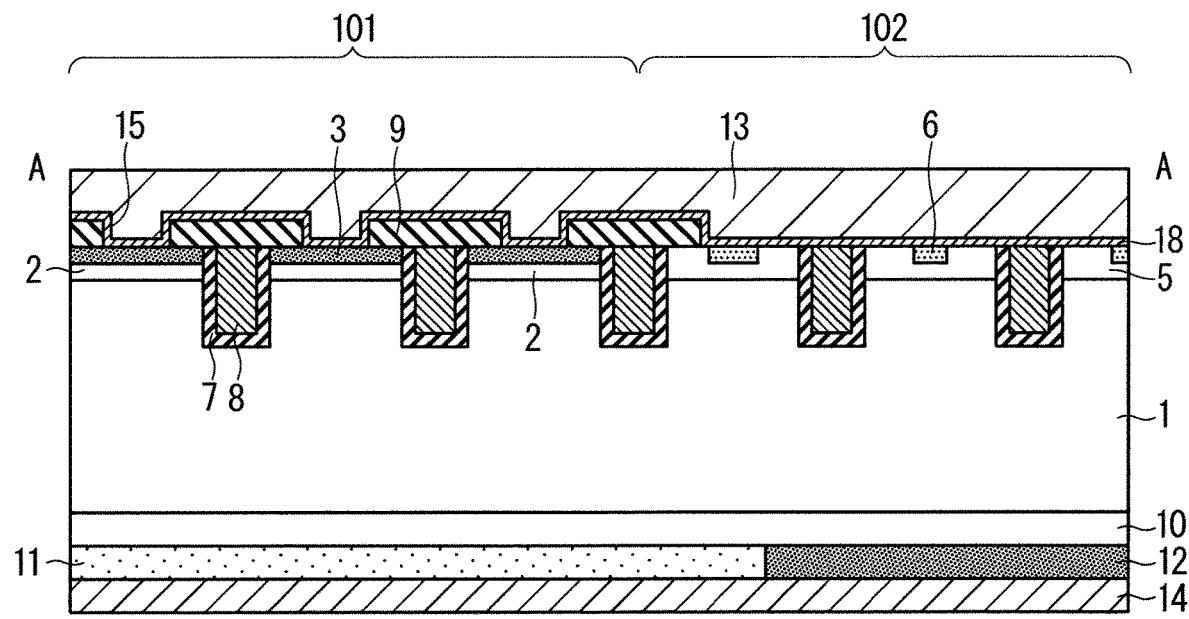
FIGS. 43 to 46 are each a partial cross-sectional view of the RC-IGBT according to the ninth preferred embodiment.
Figure 44:
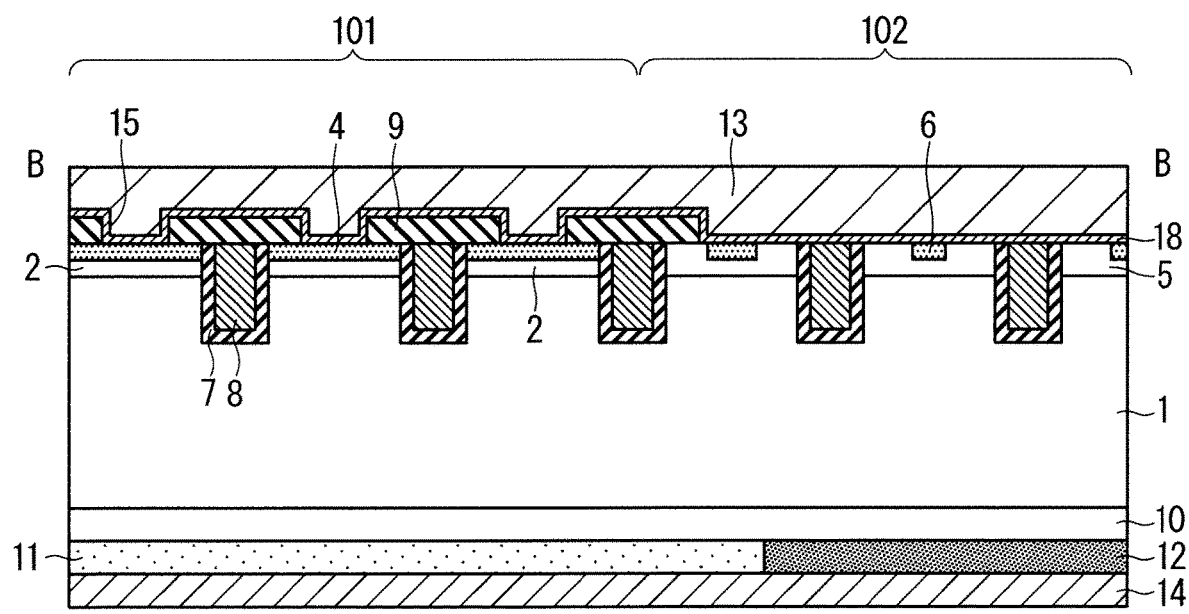
Figure 45:
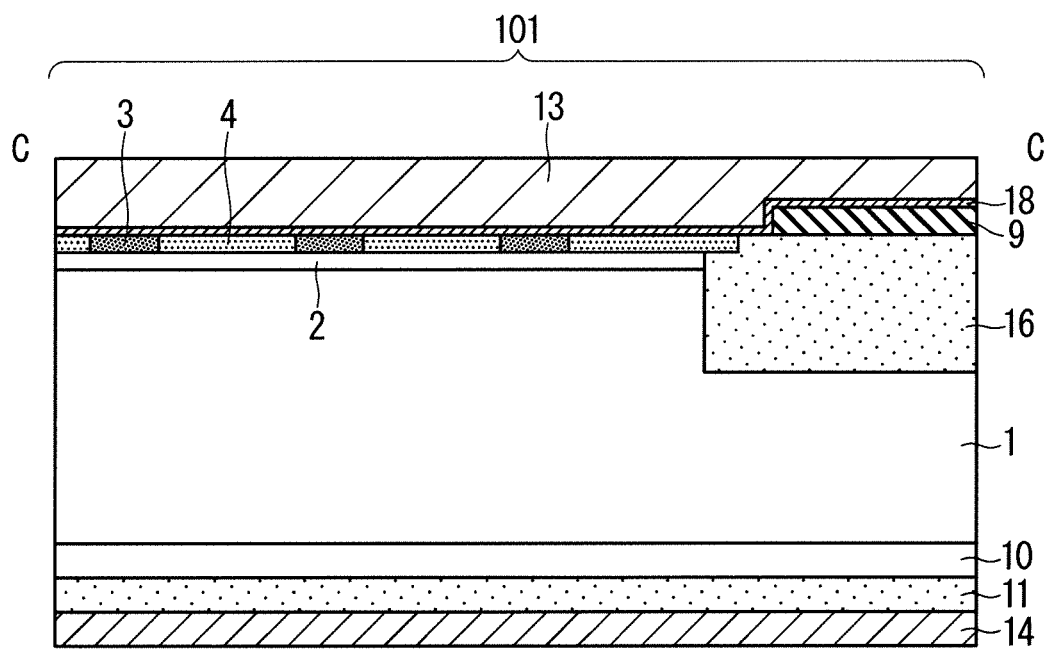
Figure 46:
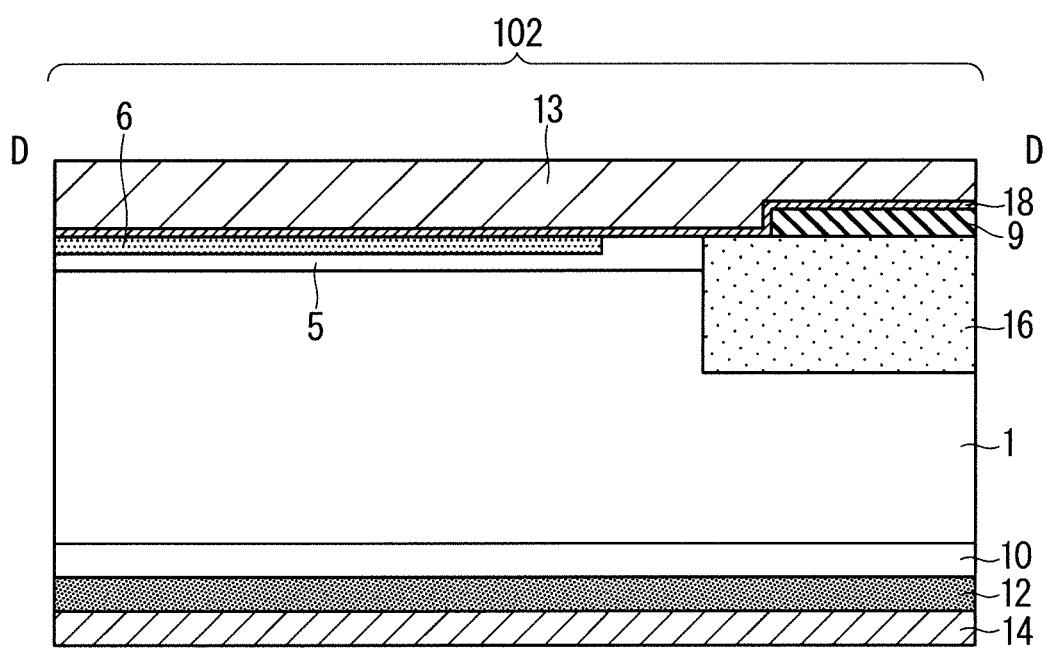

Next, an RC-IGBT 900 according to a ninth preferred embodiment will be described with reference to FIGS. 42 to 46. A plan view illustrating an entire chip of the RC-IGBT 900 is the same as FIG. 1, and FIG. 42 is a plan view illustrating the region X surrounded by the dashed line in FIG. 1. A cross-sectional view taken along the A-A line illustrated in FIG. 42 and viewed from the direction indicated by the arrows is illustrated in FIG. 43, a cross-sectional view taken along the B-B line and viewed from the direction indicated by the arrows is illustrated in FIG. 44, a cross-sectional view taken along the C-C line and viewed from the direction indicated by the arrows is illustrated in FIG. 45, and a cross-sectional view taken along the D-D line and viewed from the direction indicated by the arrows is illustrated in FIG. 46. In FIGS. 42 to 46, the same configurations as those of the RC-IGBT 100 described with reference to FIGS. 2 to 6 are designated by the same reference numerals, and duplicate description will be omitted.

In the RC-IGBT 900, the width (length in the X direction) of a $p^+$-type contact layer 6 in an FWD unit cell region 106 adjacent to an IGBT region 101, among a plurality of the FWD unit cell regions 106 in an FWD region 102, is larger than the width of a $p^+$-type contact layer 6 in each of the other FWD unit cell regions 106, as illustrated in FIG. 42. As a result, a configuration is created in which the concentration of p-type impurities in an anode region is locally increased.

In the RC-IGBT 900, the concentration of p-type impurities in the anode region near the IGBT region 101 is kept high as described above, so that the anode region near the IGBT region 101 becomes low in resistance. Thereby, the potential is less likely to be increased even if a hole current is increased, and a drop in the RBSOA can be suppressed.

Modification Example

FIG. 42 illustrates a configuration in which the width of the $p^+$-type contact layer 6 is increased in the FWD unit cell region 106 adjacent to the IGBT region 101, but the present disclosure is not limited to this. The width of the $p^+$-type contact layer 6 in each of the plurality of the FWD unit cell regions 106 may be increased. Alternatively, it may be configured such that the width of the $p^+$-type contact layer 6 in the FWD unit cell region 106 adjacent to the IGBT region 101 is made largest, and the widths of the $p^+$-type contact layers 6 are gradually made smaller as it goes in the direction of being away from the IGBT region 101 (X direction).

Increasing the width of the $p^+$-type contact layer 6 leads to an increase in the recovery loss, but the increasing can suppress a drop in the RBSOA. Therefore, with the method of the above modification example, design in consideration of the trade-off relationship between an increase in the recovery loss and a drop in the RBSOA can be made.

Tenth Preferred Embodiment

Figure 48:
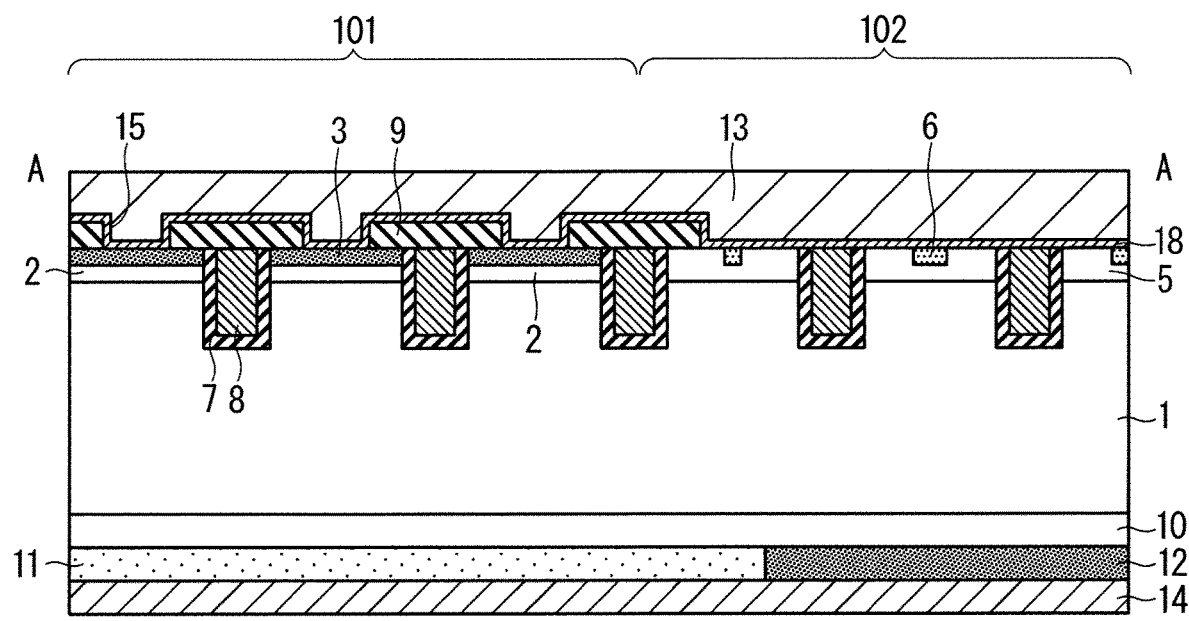
FIGS. 48 to 51 are each a partial cross-sectional view of the RC-IGBT according to the tenth preferred embodiment.
Figure 49:
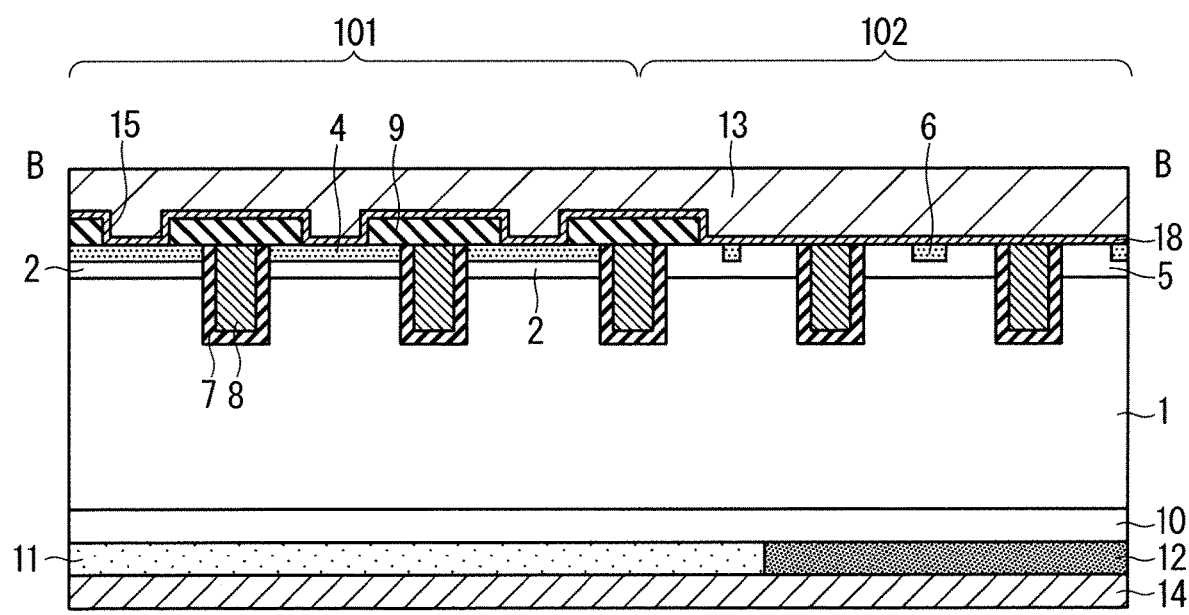
Figure 50:
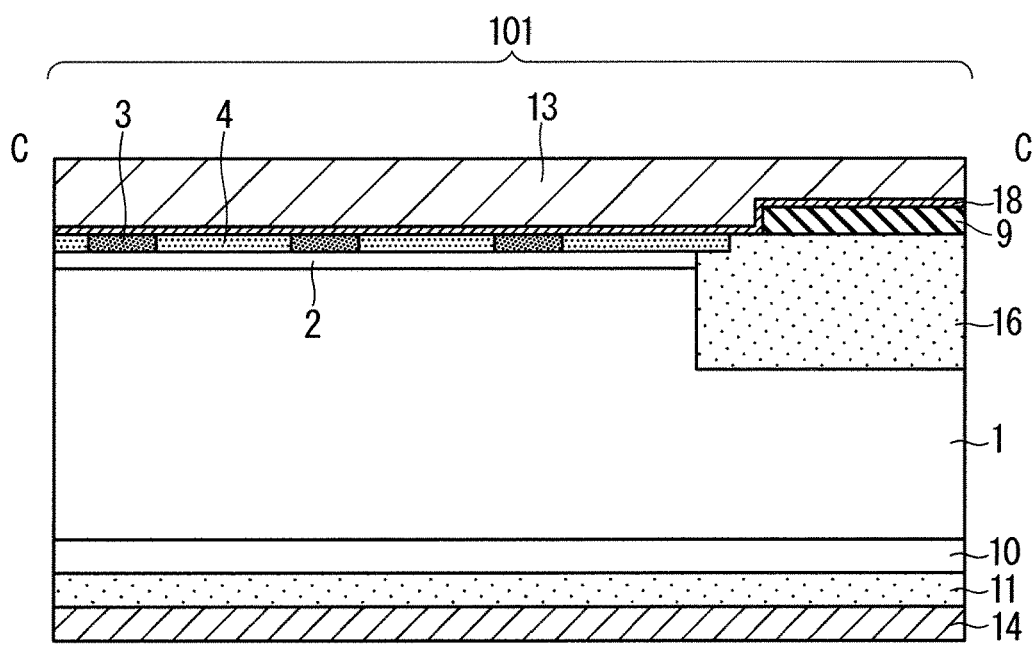
Figure 51:
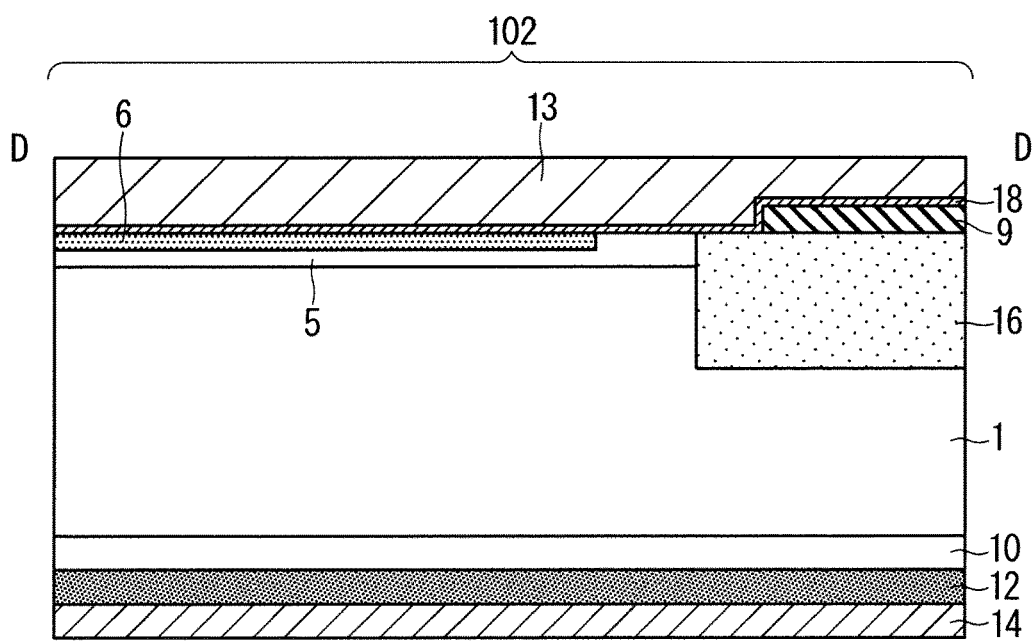

Next, an RC-IGBT 1000 according to a tenth preferred embodiment will be described with reference to FIGS. 47 to 51. A plan view illustrating an entire chip of the RC-IGBT 1000 is the same as FIG. 1, and FIG. 47 is a plan view illustrating the region X surrounded by the dashed line in FIG. 1. A cross-sectional view taken along the A-A line illustrated in FIG. 47 and viewed from the direction indicated by the arrows is illustrated in FIG. 48, a cross-sectional view taken along the B-B line and viewed from the direction indicated by the arrows is illustrated in FIG. 49, a cross-sectional view taken along the C-C line and viewed from the direction indicated by the arrows is illustrated in FIG. 50, and a cross-sectional view taken along the D-D line and viewed from the direction indicated by the arrows is illustrated in FIG. 51. In FIGS. 47 to 51, the same configurations as those of the RC-IGBT 100 described with reference to FIGS. 2 to 6 are designated by the same reference numerals, and duplicate description will be omitted.

In the RC-IGBT 1000, the width (length in the X direction) of a $p^+$-type contact layer 6 in an FWD unit cell region 106 adjacent to an IGBT region 101, among a plurality of the FWD unit cell regions 106 in an FWD region 102, is smaller than the width of a $p^+$-type contact layer 6 in each of the other FWD unit cell regions 106, as illustrated in FIG. 47. As a result, a configuration is created in which the concentration of p-type impurities in an anode region is locally reduced.

In the RC-IGBT 1000, the recovery loss can be effectively reduced by reducing the average concentration of impurities in the anode region near the IGBT region 101, as described above.

Modification Example

FIG. 47 illustrates a configuration in which the width of the $p^+$-type contact layer 6 is reduced in the FWD unit cell region 106 adjacent to the IGBT region 101, but the present disclosure is not limited to this. The width of the p+-type contact layer 6 in each of the plurality of the FWD unit cell regions 106 may be reduced. The diode near the boundary with the IGBT region 101, the planar distance of which from the boundary is between about the thickness of the substance and about 1.5 times the thickness of the substance, is affected by a parasitic diode in the IGBT region 101, so that by reducing the width of the p+-type contact layer 6 in this range by about 10 to 30% of the width of the p+-type contact layer 6 outside this range, the influence from the parasitic diode can be reduced.

Alternatively, it may be configured such that the width of the p+-type contact layer 6 in the FWD unit cell region 106 adjacent to the IGBT region 101 is made smallest, and the widths of the p+-type contact layers 6 are gradually made larger as it goes in the direction of being away from the IGBT region 101 (X direction).

Eleventh Preferred Embodiment

Figure 52:
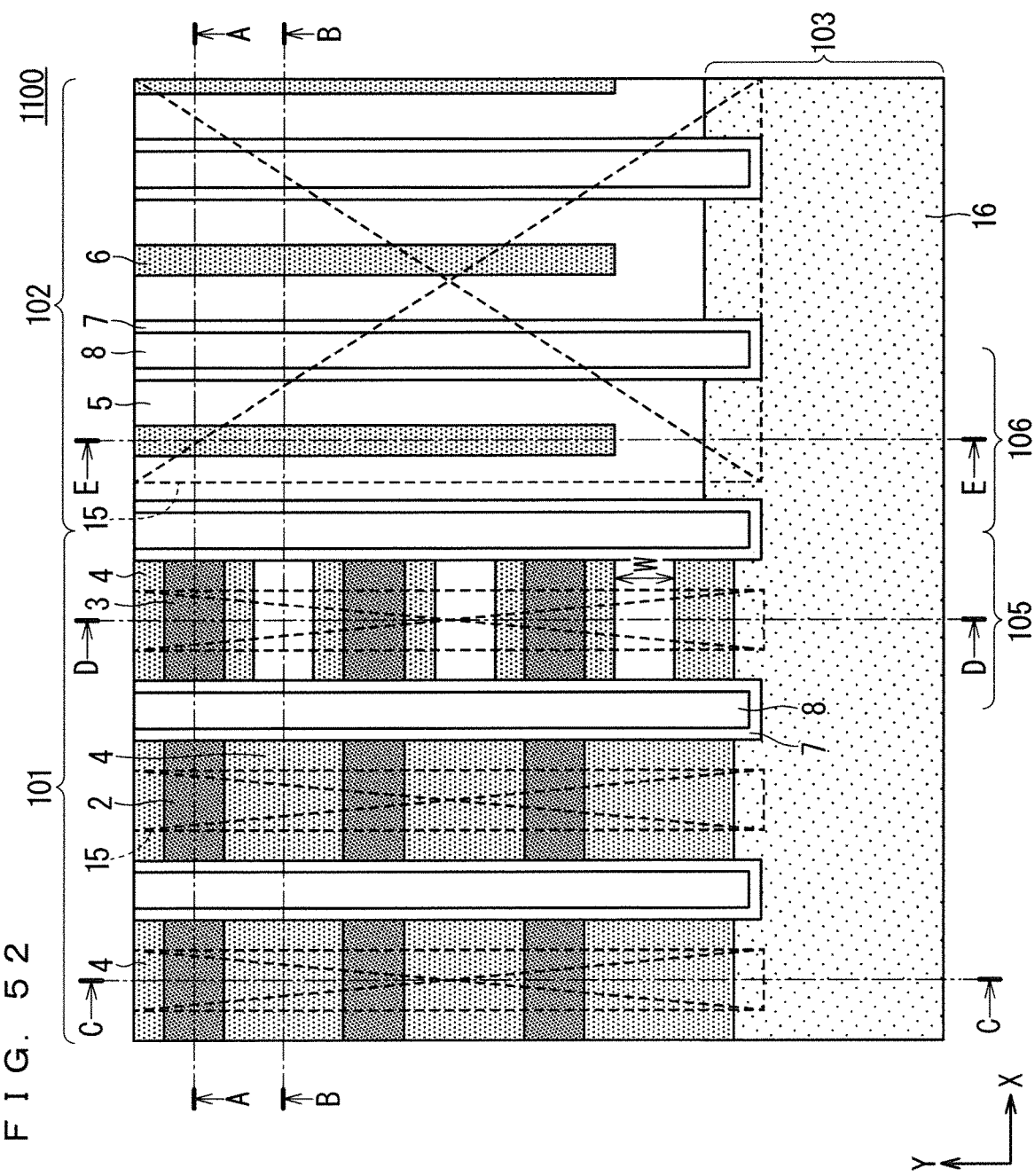
FIG. 52 is a partial plan view of an RC-IGBT according to an eleventh preferred embodiment.
Figure 53:
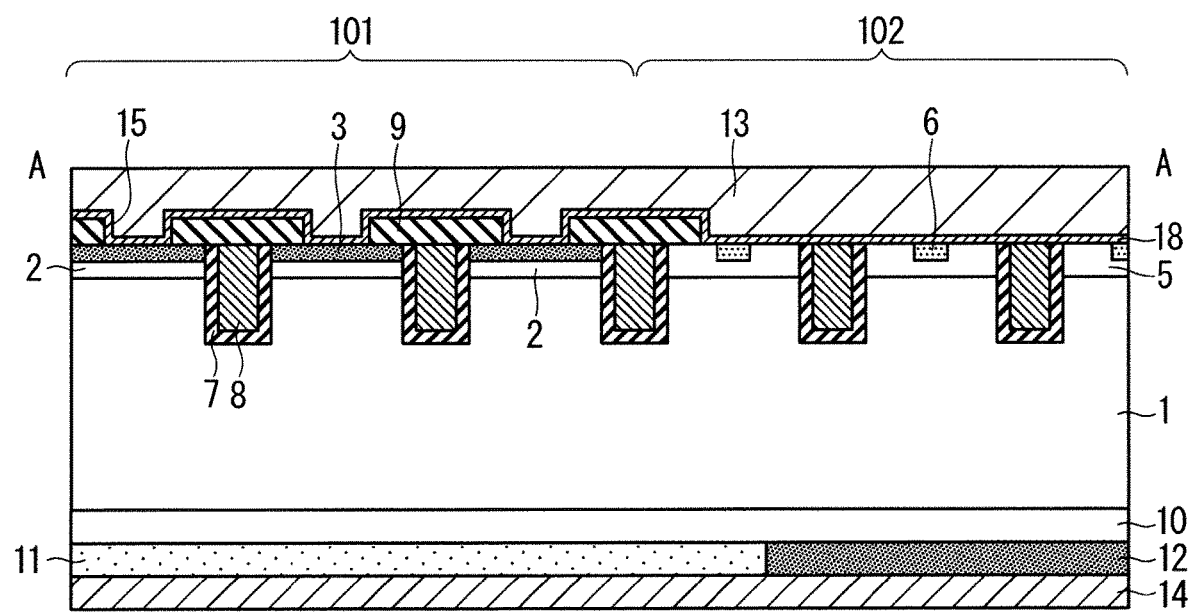
Figure 54:
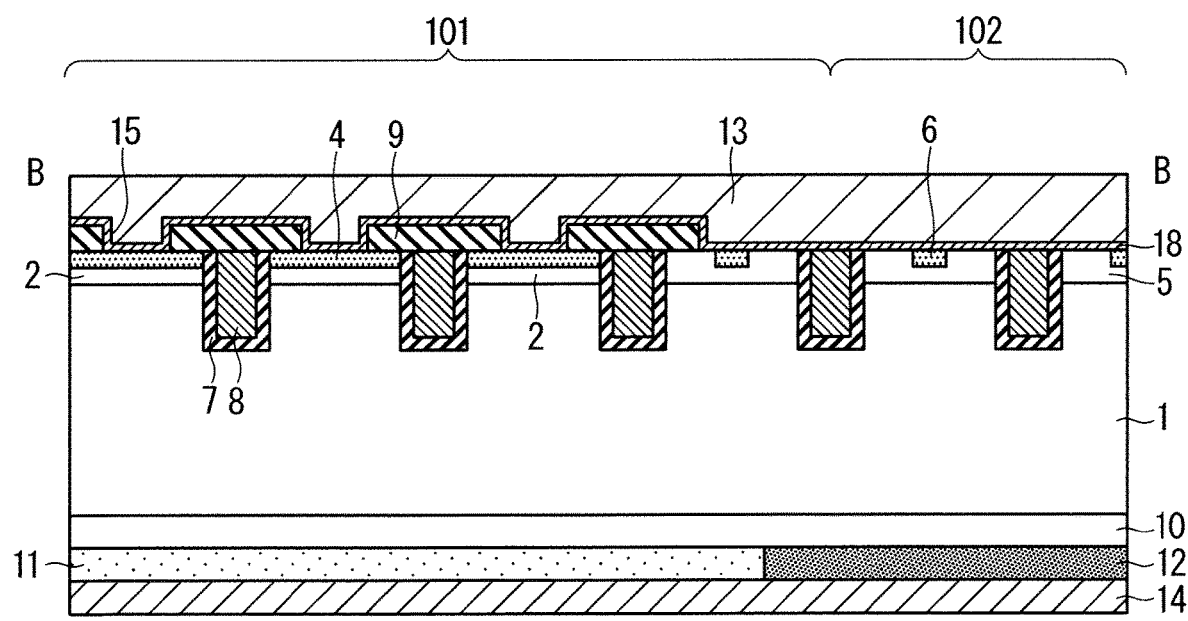
Figure 55:
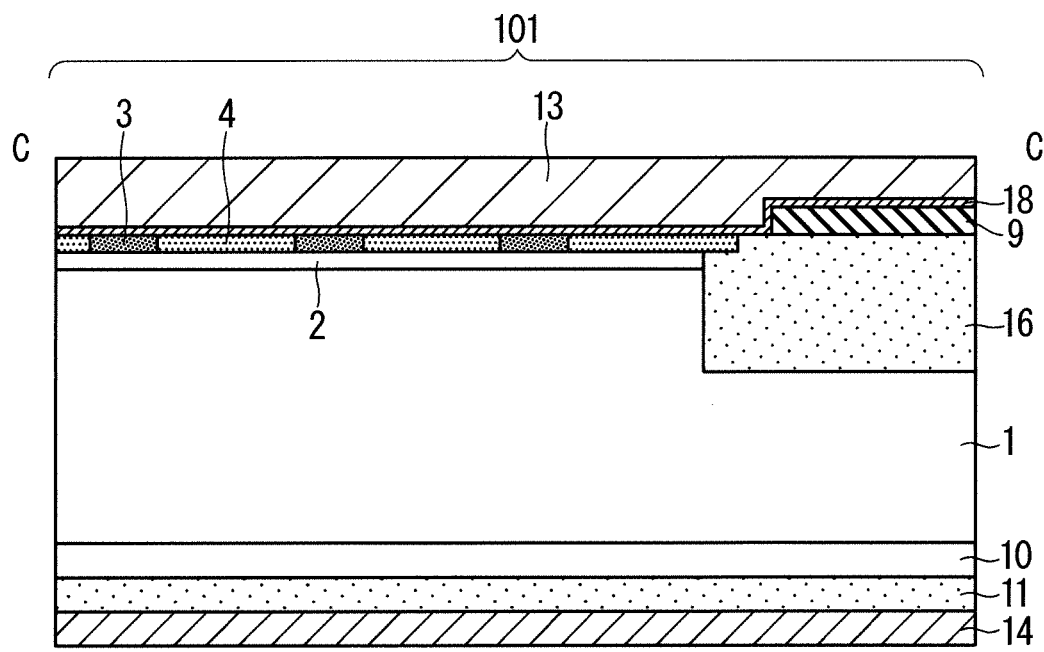
Figure 56:
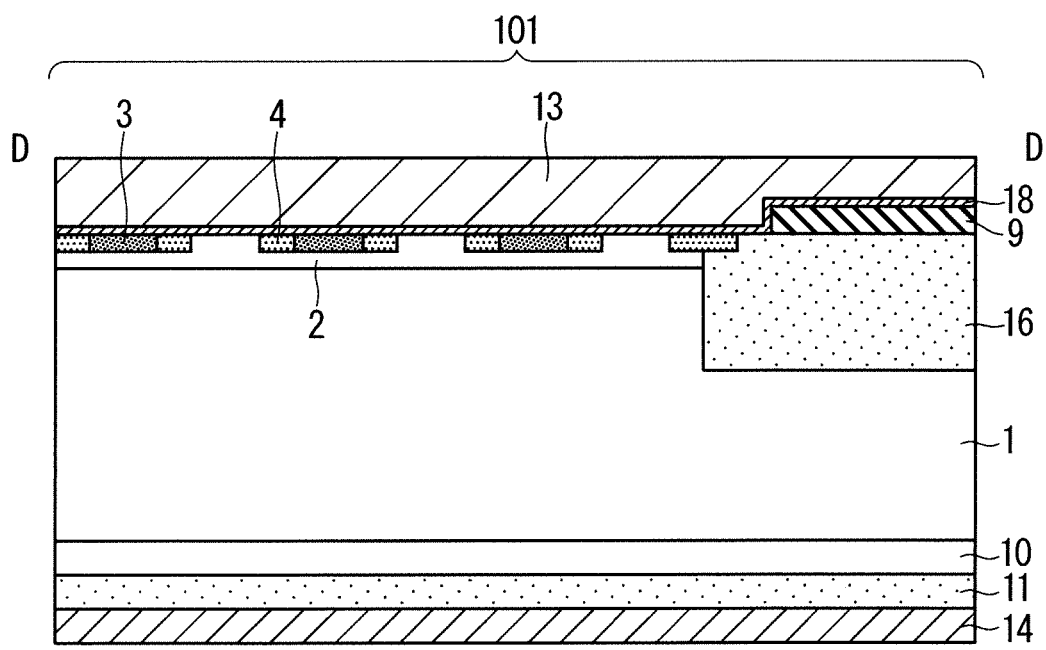

Next, an RC-IGBT 1100 according to an eleventh preferred embodiment will be described with reference to FIGS. 52 to 57. A plan view illustrating an entire chip of the RC-IGBT 1100 is the same as FIG. 1, and FIG. 52 is a plan view illustrating the region X surrounded by the dashed line in FIG. 1. A cross-sectional view taken along the A-A line illustrated in FIG. 52 and viewed from the direction indicated by the arrows is illustrated in FIG. 53, a cross-sectional view taken along the B-B line and viewed from the direction indicated by the arrows is illustrated in FIG. 54, a cross-sectional view taken along the C-C line and viewed from the direction indicated by the arrows is illustrated in FIG. 55, a cross-sectional view taken along the D-D line and viewed from the direction indicated by the arrows is illustrated in FIG. 56, and a cross-sectional view taken along the E-E line and viewed from the direction indicated by the arrows is illustrated in FIG. 57. In FIGS. 52 to 57, the same configurations as those of the RC-IGBT 100 described with reference to FIGS. 2 to 6 are designated by the same reference numerals, and duplicate description will be omitted.

In the RC-IGBT 1100, an IGBT unit cell region 105 adjacent to an FWD region 102, among a plurality of the IGBT unit cell regions 105 in an IGBT region 101, is composed of an n+-type emitter layer 3, a p+-type contact layer 4, and a p-type channel doped layer 2, as illustrated in FIG. 52.

That is, it is configured such that the p+-type contact layers 4 are formed to sandwich the n+-type emitter layer 3, and the p-type channel doped layer 2 is exposed to the outside of the p+-type contact layer 4. Thereby, the average concentration of p-type impurities in the IGBT region 101 near the FWD region 102 is reduced, and hole diffusion in the IGBT region 101, while the operation of the FWD is turned on, is reduced, so that the recovery loss can be reduced.

Modification Example

FIG. 52 illustrates an example in which the IGBT unit cell region 105 adjacent to the FWD region 102 is composed of the n+-type emitter layer 3, the p+-type contact layer 4, and the p-type channel doped layer 2, but the present disclosure is not limited to this. The plurality of the IGBT unit cell regions 105 may be formed in the same way.

In addition, by setting the effective concentrations of p-type impurities so as to change gradually, the average concentration of impurities in the IGBT unit cell region 105 near the FWD region 102 can be adjusted.

Specifically, by increasing an arrangement interval W between the p+-type contact layers 4, the p-type channel doped layer 2 is increased and the p+-type contact layer 4 is reduced, as illustrated in FIG. 52. Thereby, the average concentration of impurities in the IGBT unit cell region 105 05 can be adjusted.

Twelfth Preferred Embodiment

Figure 58:
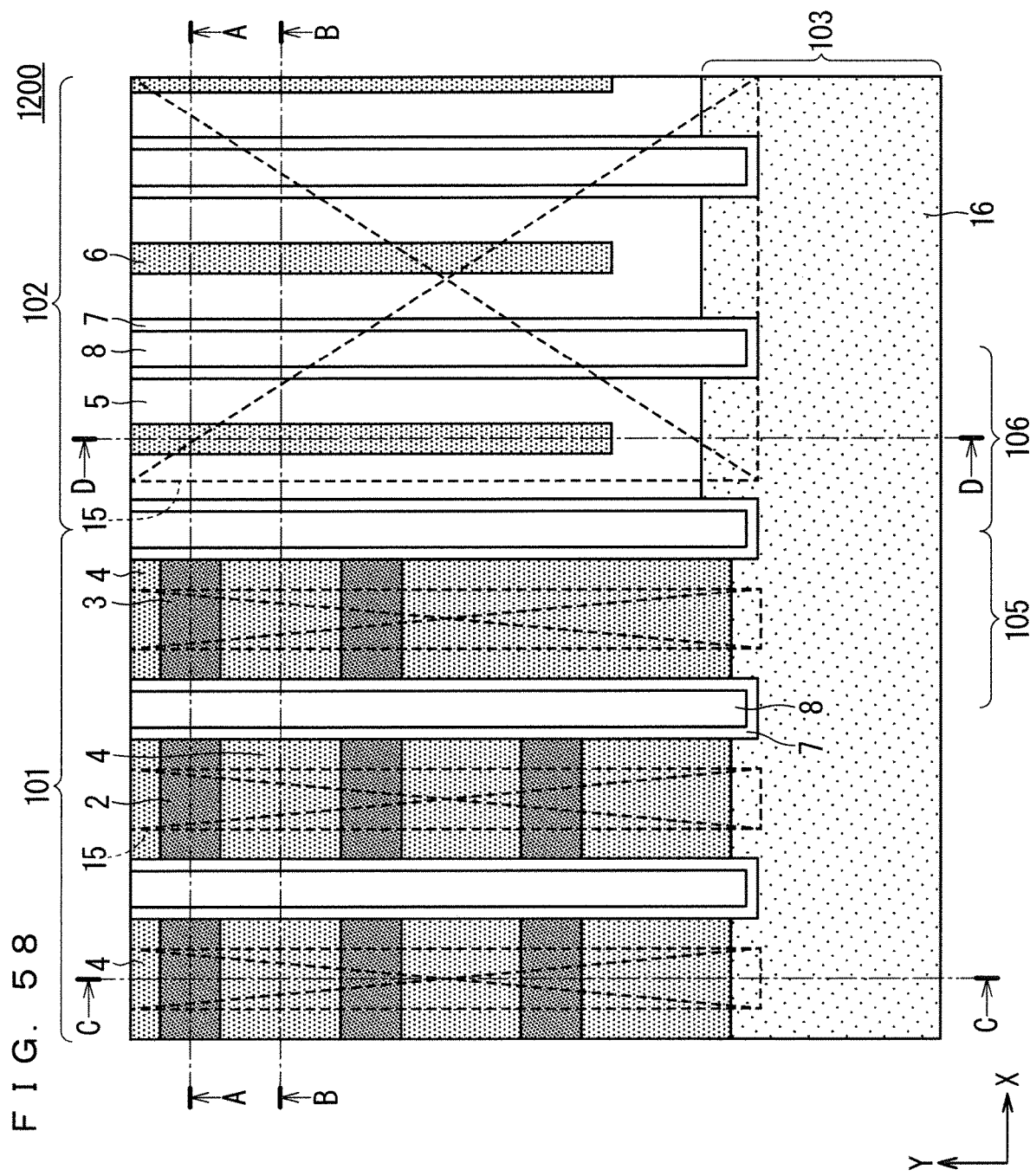
FIG. 58 is a partial plan view of an RC-IGBT according to a twelfth preferred embodiment.
Figure 59:
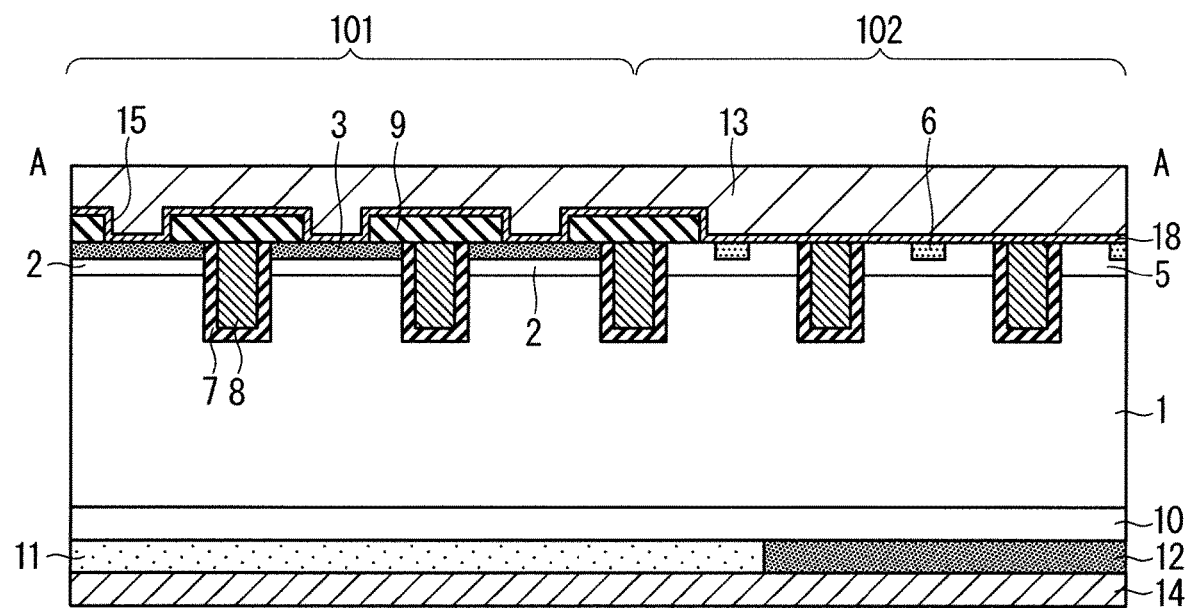
FIGS. 59 to 62 are each a partial cross-sectional view of the RC-IGBT according to the twelfth preferred embodiment.
Figure 60:
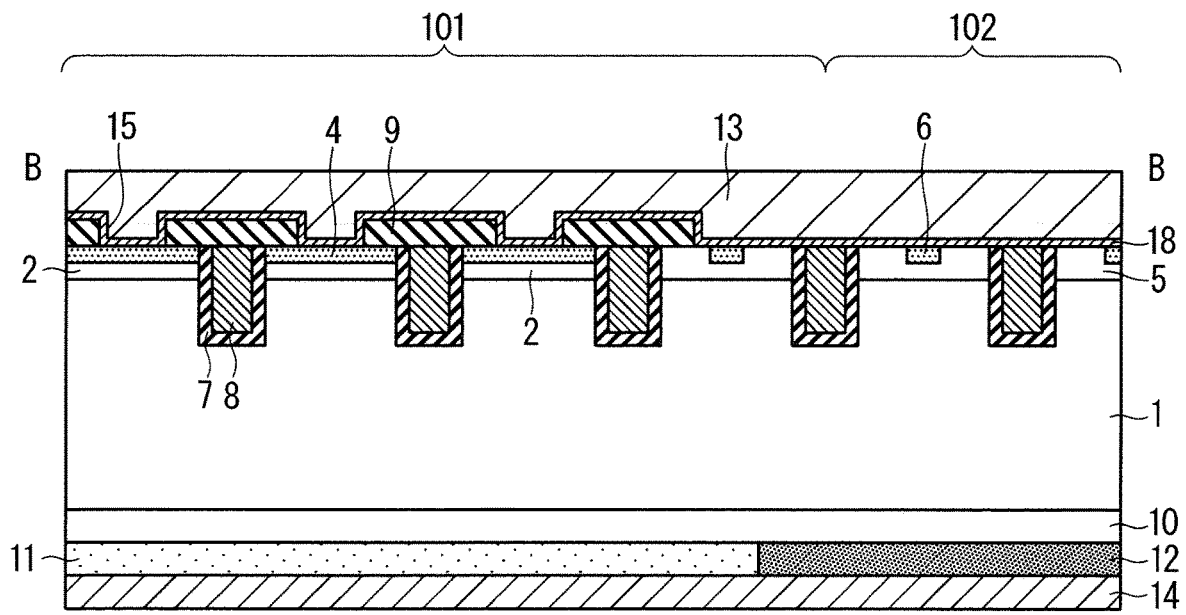
Figure 61:
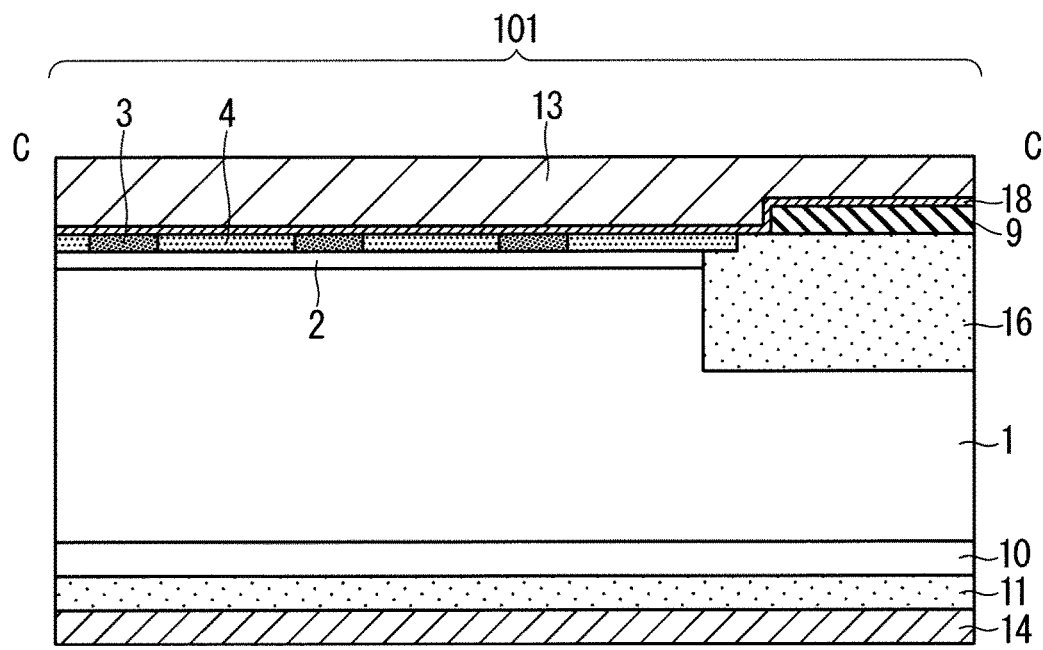
Figure 62:
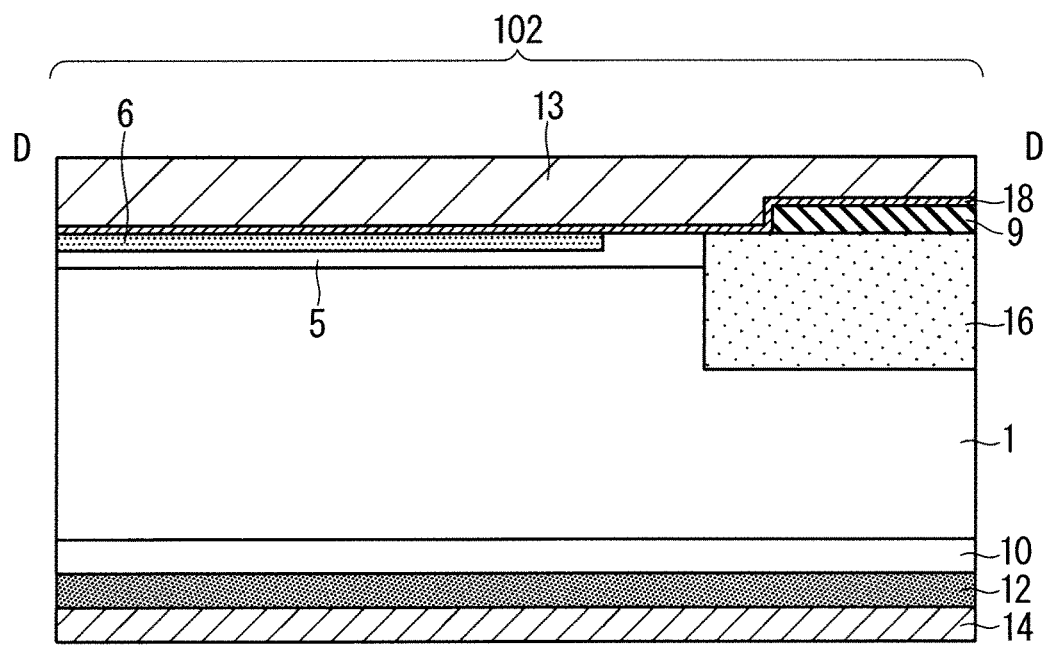

Next, an RC-IGBT 1200 according to a twelfth preferred embodiment will be described with reference to FIGS. 58 to 62. A plan view illustrating an entire chip of the RC-IGBT 1200 is the same as FIG. 1, and FIG. 58 is a plan view illustrating the region X surrounded by the dashed line in FIG. 1. A cross-sectional view taken along the A-A line illustrated in FIG. 58 and viewed from the direction indicated by the arrows is illustrated in FIG. 59, a cross-sectional view taken along the B-B line and viewed from the direction indicated by the arrows is illustrated in FIG. 60, a cross-sectional view taken along the C-C line and viewed from the direction indicated by the arrows is illustrated in FIG. 61, and a cross-sectional view taken along the D-D line and viewed from the direction indicated by the arrows is illustrated in FIG. 62. In FIGS. 58 to 62, the same configurations as those of the RC-IGBT 100 described with reference to FIGS. 2 to 6 are designated by the same reference numerals, and duplicate description will be omitted.

In the RC-IGBT 1200, it is configured such that the area ratio of a p+-type contact layer 4 in an IGBT unit cell region 105 adjacent to an FWD region 102, among a plurality of the IGBT unit cell regions 105 in an IGBT region 101, is made larger than those of the other IGBT unit cell regions 105, as illustrated in FIG. 58.

That is, the area of the p+-type contact layer 4 in contact with a p-type well layer 16 in an outer peripheral region 103 is increased. Thereby, the average concentration of p-type impurities in the IGBT region 101 near the FWD region 102 is increased, so that the effect of suppressing a drop in the RBSOA during the operation of the IGBT can be enhanced.

Modification Example

In FIG. 58, the area of the p+-type contact layer 4 in contact with the p-type well layer 16, in the IGBT unit cell region 105 adjacent to the FWD region 102, is increased, but it is also possible that in the entire region of the IGBT unit cell region 105, the area of n+-type emitter layers 3 is reduced and the area of the p+-type contact layers 4 is increased.

In the first to twelfth preferred embodiments described above, embodiments to be applied to an RC-IGBT have been described, but they can also be applied to a MOSFET, etc.

In addition, a manufacturing method using an Si substrate has been described as an example of the manufacturing method, but semiconductor substrates made of different materials, such as silicon carbide (SiC), can also be used.

In FIG. 2, etc., stripe-shaped cells each having the stripe-shaped embedded gate electrode 8 having a trench structure are illustrated, but the present disclosure can also be applied to a cell called a mesh type that extends vertically and horizontally, and also to a cell structure called a planar type that has a planar gate.

<Other Configuration Examples of RC-IGBT>

Figure 63:
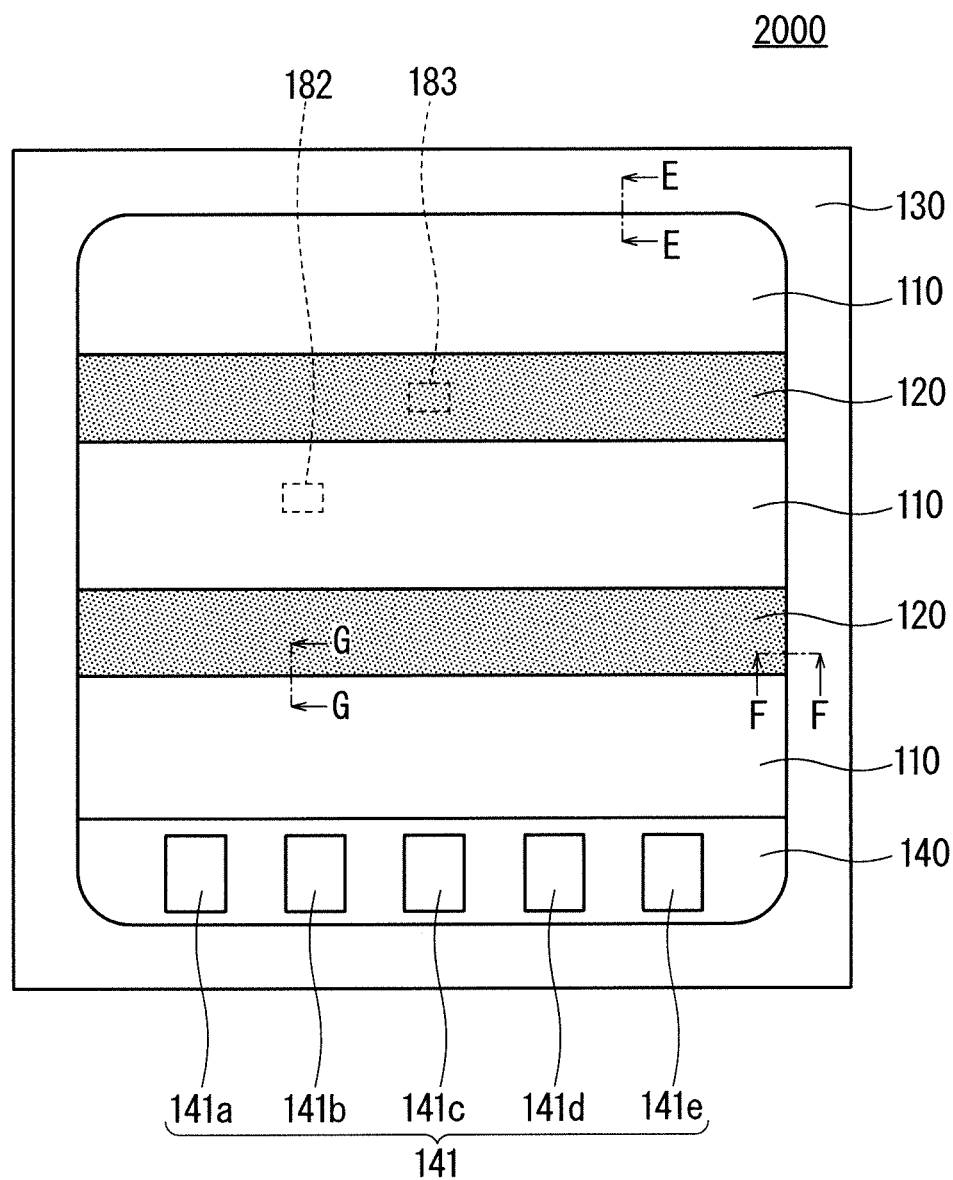
FIGS. 63 and 64 are each a plan view illustrating another configuration of an RC-IGBT.
Figure 64:
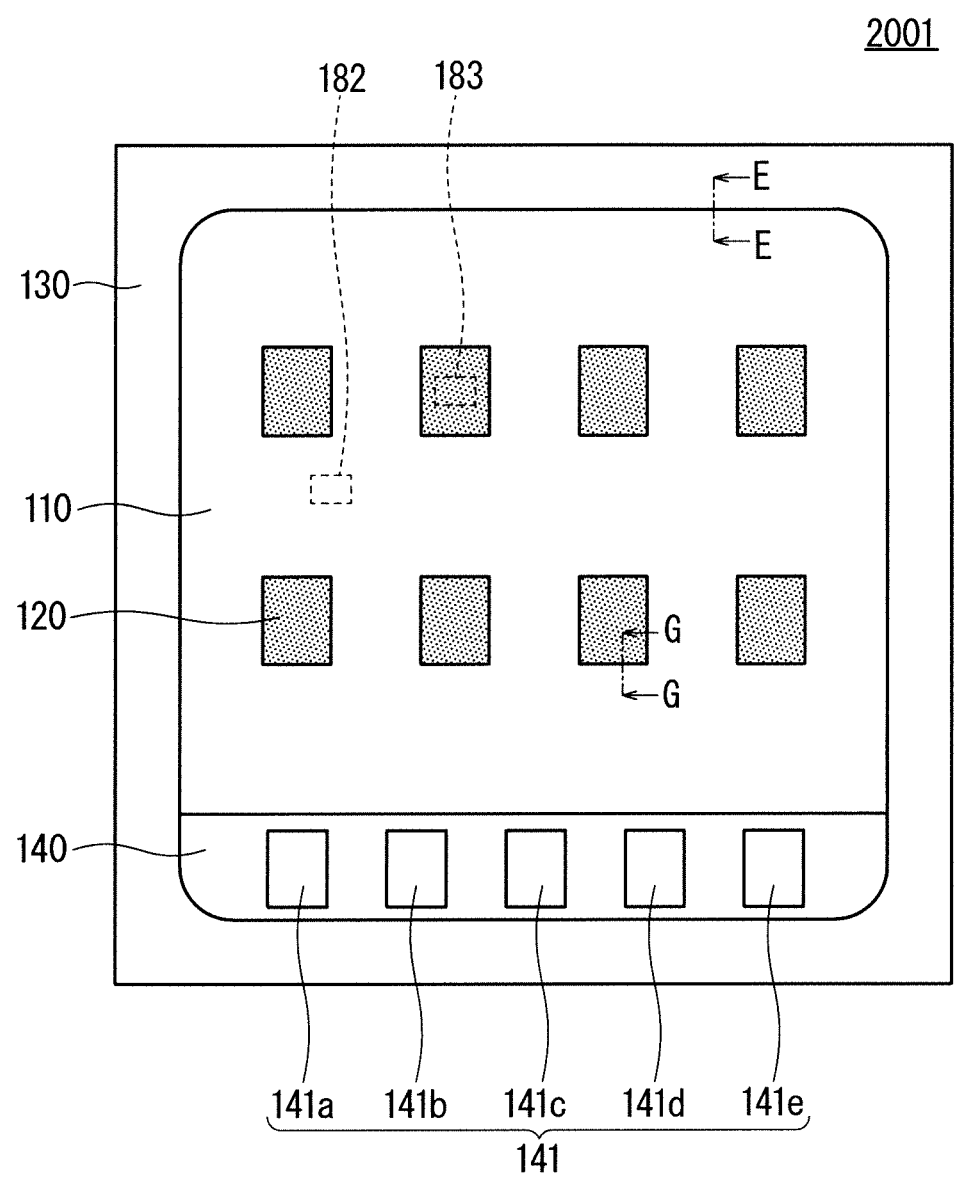

Hereinafter, other configuration examples of the RC-IGBT will be illustrated. FIG. 63 is a plan view illustrating a semiconductor device 2000 that is an RC-IGBT. FIG. 64 is a plan view illustrating a semiconductor device 2001 that is an RC-IGBT. The semiconductor device 2000 illustrated in FIG. 63 is provided with IGBT regions 110 and diode regions 120 that are located side by side in a stripe shape, which may be simply called a "stripe type". The semiconductor device 2001 illustrated in FIG. 64 is provided with a plurality of diode regions 120 that are located in the vertical direction and the horizontal direction and an IGBT region 110 that is located around the diode regions 120, which may be simply called an "island type."

<Overall Planar Structure of Stripe Type>

In FIG. 63, the semiconductor device 2000 includes the IGBT regions 110 and the diode regions 120 in one semiconductor device. The IGBT region 110 and the diode region 120 extend from one end side to the other end side of the semiconductor device 2000, and they are provided alternately in a stripe shape in the direction orthogonal to the extending direction of the IGBT region 110 and the diode region 120. FIG. 63 illustrates a configuration in which three IGBT regions 110 and two diode regions 120 are present and every diode region 120 is sandwiched by the IGBT regions 110. However, the numbers of IGBT regions 110 and diode regions 120 are not limited to these, and the number of IGBT regions 110 may be 3 or more or 3 or less, and the number of diode regions 120 may also be 2 or more or 2 or less. Alternatively, a configuration in which the locations of the IGBT regions 110 and the diode regions 120 in FIG. 63 are interchanged may be adopted, or a configuration in which every IGBT region 110 is sandwiched by the diode regions 120 may be adopted. Alternatively, a configuration in which each of the IGBT regions 110 and each of the diode regions 120 are provided adjacent to each other may be adopted.

As illustrated in FIG. 63, a pad region 140 is provided adjacent to the IGBT region 110 on the bottom side of the paper. The pad region 140 is a region where control pads 141 for controlling the semiconductor device 2000 are provided. The IGBT regions 110 and the diode regions 120 are collectively called a cell region. A terminal region 130 is provided around a region including the cell region and the pad region 140 in order to maintain the withstand voltage of the semiconductor device 2000. A well-known withstand voltage holding structure appropriately selected can be provided in the terminal region 130. The withstand voltage holding structure may be configured, for example, by providing, on a first main surface side, which is a front surface side, of the semiconductor device 2000, an FLR whose cell region is surrounded by a p-type terminal well layer that is a p-type semiconductor and a VLD whose cell region is surrounded by a p-type well layer with a concentration gradient. The number of p-type terminal well layers each having a ring shape that are used in the FLR and the concentration gradient of the VLD may be appropriately selected depending on the withstand voltage design of the semiconductor device 2000. Alternatively, the p-type terminal well layer may be provided over almost the entire pad region 140, or an IGBT cell and a diode cell may be provided in the pad region 140. The control pads 141 may be, for example, a current sense pad 141$a$, a Kelvin emitter pad 141$b$, a gate pad 141$c$, and temperature sense diode pads 141$d$, 141$e$. The current sense pad 141$a$ is a control pad for detecting a current flowing though the cell region of the semiconductor device 2000, which is a control pad electrically connected to an IGBT cell or a diode cell that is a part of the cell region, so that when a current is expected to flow through the cell region of the semiconductor device 2000, one severalth to 1/tens of thousands of the current flowing through the entire cell region flow.

The Kelvin emitter pad 141$b$ and the gate pad 141$c$ are control pads to which a gate drive voltage for on/off control of the semiconductor device 2000 is applied. The Kelvin emitter pad 141$b$ is electrically connected to a p-type base layer of the IGBT cell, and the gate pad 141$c$ is electrically connected to a gate trench electrode of the IGBT cell. The Kelvin emitter pad 141$b$ and the p-type base layer may be electrically connected via a p$^+$-type contact layer. The temperature sense diode pads 141$d$, 141$e$ are control pads electrically connected to an anode and a cathode of a temperature sense diode provided in the semiconductor device 2000. The temperature of the semiconductor device 2000 is measured by measuring the voltage between the anode and the cathode of the temperature sense diode (not shown) provided in the cell region.

<Overall Planar Structure of Island Type>

In FIG. 64, the semiconductor device 2001 is provided with the IGBT region 110 and the diode regions 120 in one semiconductor device. A plurality of the diode regions 120 are arranged, in plan view, side by side in the respective vertical and horizontal directions in the semiconductor device, in which every diode region 120 is surrounded by the IGBT region 110. That is, the plurality of diode regions 120 are provided in an island shape in the IGBT region 110. FIG. 64 illustrates a configuration in which the diode regions 120 are provided in a matrix form with 4 columns in the left-right direction of the paper and 2 rows in the up-down direction of the paper, but the number and arrangement of the diode regions 120 are not limited to these. The configuration is only required to be such that one or more diode regions 120 are provided in a scattered manner in the IGBT region 110 and every diode region 120 is surrounded by the IGBT region 110.

As illustrated in FIG. 64, a pad region 140 is provided adjacent to the bottom edge of the paper of the IGBT region 110. The pad region 140 is a region where the control pad 141 for controlling the semiconductor device 2001 is provided. The IGBT regions 110 and the diode regions 120 are collectively called a cell region. A terminal region 130 is provided around a region including the cell region and the pad region 140 in order to maintain the withstand voltage of the semiconductor device 2001. A well-known withstand voltage holding structure appropriately selected can be provided in the terminal region 130. The withstand voltage holding structure may be configured, for example, by providing, on a first main surface side, which is a front surface side, of the semiconductor device 2001, an FLR whose region including the cell region and the pad region 140 is surrounded by a p-type terminal well layer that is a p-type semiconductor and a VLD whose cell region is surrounded by a p-type well layer with a concentration gradient. The number of p-type terminal well layers each having a ring shape that are used in the FLR and the concentration gradient of the VLD may be appropriately selected depending on the withstand voltage design of the semiconductor device 2001. Alternatively, the p-type terminal well layer may be provided over almost the entire pad region 140, or an IGBT cell and a diode cell may be provided in the pad region 140.

The control pads 141 may be, for example, a current sense pad 141$a$, a Kelvin emitter pad 141$b$, a gate pad 141$c$, and temperature sense diode pads 141$d$, 141$e$. The current sense pad 141$a$ is a control pad for detecting a current flowing though the cell region of the semiconductor device 2001, which is a control pad electrically connected to an IGBT cell or a diode cell that is a part of the cell region, so that when a current is expected to flow through the cell region of the semiconductor device 2001, one severalth to 1/tens of thousands of the current flowing through the entire cell region flow.

The Kelvin emitter pad 141b and the gate pad 141c are control pads to which a gate drive voltage for on/off control of the semiconductor device 2001 is applied. The Kelvin emitter pad 141b is electrically connected to a p-type base layer and an $n^+$-type source layer of the IGBT cell, and the gate pad 141c is electrically connected to a gate trench electrode of the IGBT cell. The Kelvin emitter pad 141b and the p-type base layer may be electrically connected via a $p^+$-type contact layer. The temperature sense diode pads 141d, 141e are control pads electrically connected to an anode and a cathode of a temperature sense diode provided in the semiconductor device 2001. The temperature of the semiconductor device 2001 is measured by measuring the voltage between the anode and the cathode of the temperature sense diode (not shown) provided in the cell region.

<Partial Planar Configuration>

Figure 65:
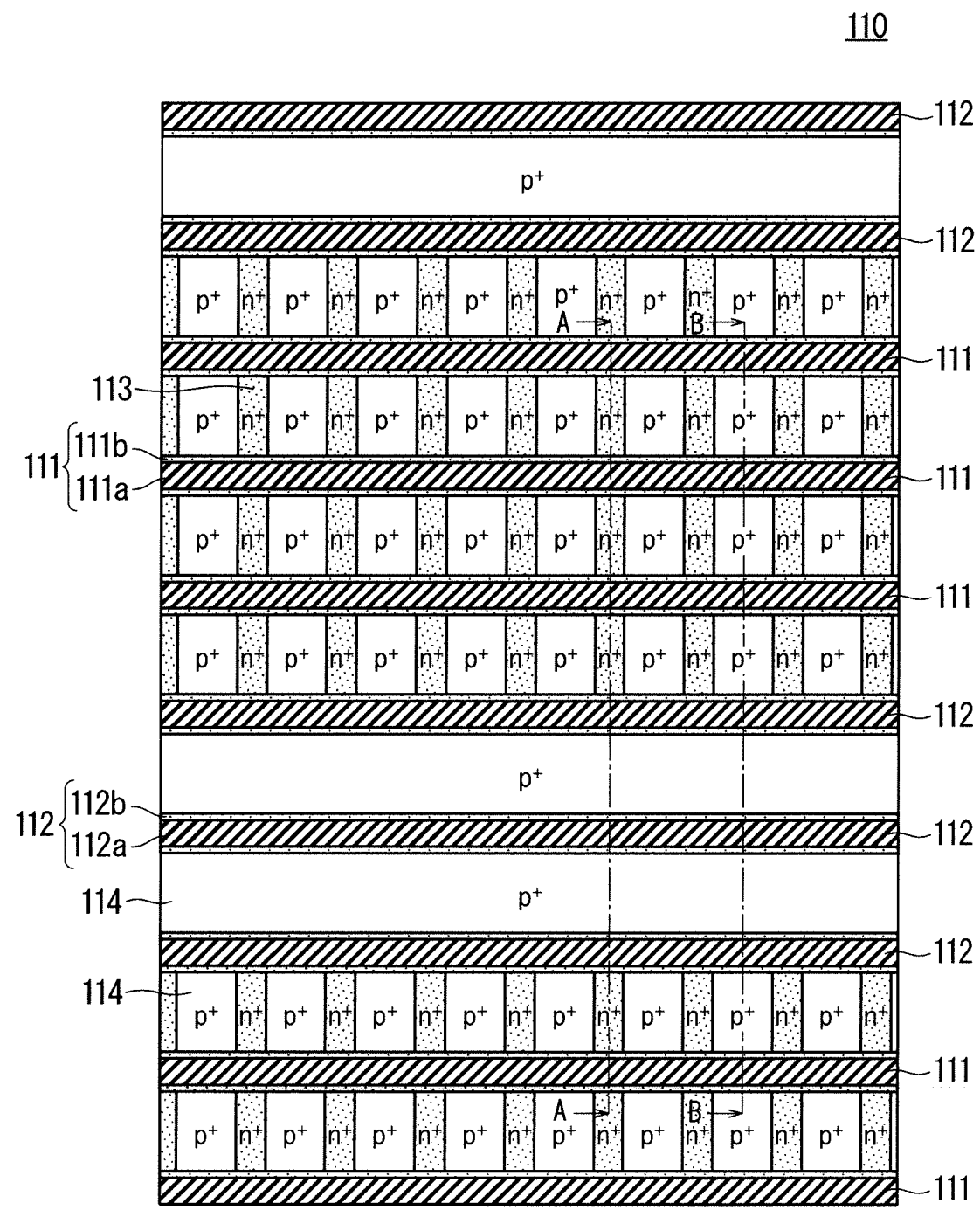
FIG. 65 is a partial plan view illustrating another configuration of an RC-IGBT.

FIG. 65 is a partial plan view illustrating an enlarged region 182, surrounded by a dashed line, of the IGBT region 110 in the semiconductor device 2000 illustrated in FIG. 63 or in the semiconductor device 2001 illustrated in FIG. 64. As illustrated in FIG. 65, active trench gates 111 and dummy trench gates 112 are provided in a stripe shape in the IGBT region 110. In the semiconductor device 2000, the active trench gate 111 and the dummy trench gate 112 extend in the longitudinal direction of the IGBT region 110, and the longitudinal direction of the IGBT region 110 is the longitudinal directions of the active trench gate 111 and the dummy trench gate 112. On the other hand, in the semiconductor device 2001, there is no particular distinction between the longitudinal direction and the lateral direction for the IGBT region 110, but the left-right direction of the paper may be defined as the longitudinal directions of the active trench gate 111 and the dummy trench gate 112, or the up-down direction of the paper may be defined as the longitudinal directions of the active trench gate 111 and the dummy trench gate 112.

The active trench gate 111 is configured by providing a gate trench electrode 111a in a trench formed in the semiconductor substrate via a gate trench insulating film 111b. The dummy trench gate 112 is configured by providing a dummy trench electrode 112a in a trench formed in the semiconductor substrate via a dummy trench insulating film 112b. The gate trench electrode 111a of the active trench gate 111 is electrically connected to the gate pad 141c (FIGS. 63, 64). The dummy trench electrode 112a of the dummy trench gate 112 is electrically connected to an emitter electrode provided on the first main surface of the semiconductor device 2000 or 2001.

An $n^+$-type source layer 113 is provided in contact with the gate trench insulating film 111b on both sides, in the width direction, of the active trench gate 111. The $n^+$-type source layer 113 is a semiconductor layer having, for example, arsenic (As) or phosphorus (P) as n-type impurities, and the concentration of the n-type impurities is $1.0\times10^{17}/cm^3$ to $1.0\times10^{20}/cm^3$. The $n^+$-type source layers 113 are provided alternately with $p^+$-type contact layers 114 along the extending direction of the active trench gate 111. The $p^+$-type contact layer 114 is also provided between two adjacent dummy trench gates 112. The $p^+$-type contact layer 114 is a semiconductor layer having, for example, boron (B) or aluminum (Al) as p-type impurities, and the concentration of the p-type impurities is $1.0\times10^{15}/cm^3$ to $1.0\times10^{20}/cm^3$.

The IGBT region 110 of the semiconductor device 2000 or the semiconductor device 2001 has a configuration in which: three active trench gates 111 are lined up; next to them, three dummy trench gates 112 are lined up; and next to them, three active trench gates 111 are lined up, as illustrated in FIG. 65. The IGBT region 110 has a configuration in which a set of the active trench gates 111 and a set of the dummy trench gates 112 are alternately lined up in this way. In FIG. 65, the number of active trench gates 111 included in one set of the active trench gates 111 is set to 3, but it only has to be 1 or more. The number of dummy trench gates 112 included in one set of the dummy trench gates 112 may be 1 or more, or it may be even zero. That is, all of the trenches provided in the IGBT region 110 may be the active trench gates 111.

<Partial Cross-Sectional Structure>

Figure 66:
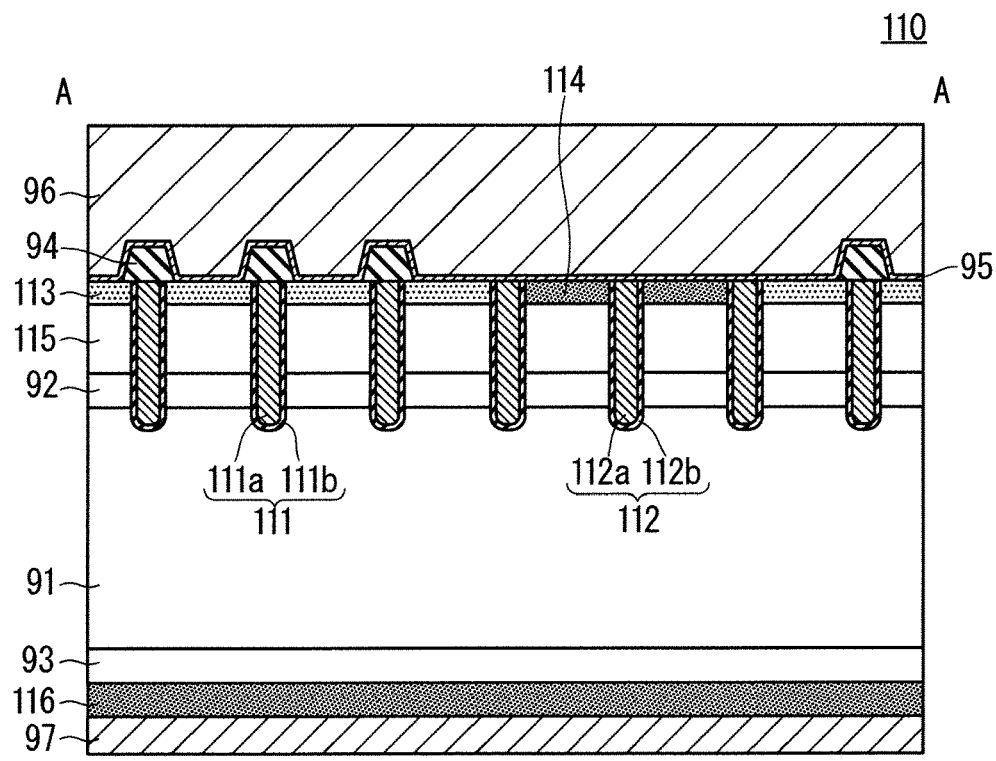
FIGS. 66 and 67 are each a partial cross-sectional view illustrating another configuration of an RC-IGBT.

FIG. 66 is a cross-sectional view taken along the A-A line in FIG. 65 and viewed from the direction indicated by the arrows. As illustrated in FIG. 66, the semiconductor device 2000 or the semiconductor device 2001 has an $n^-$-type drift layer 91 made of a semiconductor substrate. The $n^-$-type drift layer 91 is a semiconductor layer having, for example, arsenic (As) or phosphorus (P) as n-type impurities, and the concentration of the n-type impurities is $1.0\times10^{12}/cm^3$ to $1.0\times10^{15}/cm^3$. In FIG. 66, the semiconductor substrate ranges from the $n^+$-type source layer 113 and the $p^+$-type contact layer 114 to a p-type collector layer 116 in the IGBT region 110.

In FIG. 66, the top edges of the paper of the $n^+$-type source layer 113 and the $p^+$-type contact layer 114 in the IGBT region 110 are called the first main surface of the semiconductor substrate, and the bottom edge of the paper of the p-type collector layer 116 is called the second main surface of the semiconductor substrate.

The first main surface of the semiconductor substrate is the main surface, on the front surface side, of the semiconductor device 2000 or the semiconductor device 2001, and the second main surface of the semiconductor substrate is the main surface, on the back surface side, of the semiconductor device 2000 or the semiconductor device 2001. The semiconductor device 2000 or the semiconductor device 2001 has the $n^-$-type drift layer 91 between the first main surface and the second main surface facing the first main surface in the IGBT region 110 that is the cell region.

In the IGBT region 110, an n-type carrier storage layer 92 having a higher concentration of n-type impurities than the $n^-$-type drift layer 91 is provided on the first main surface side of the $n^-$-type drift layer 91, as illustrated in FIG. 66. The n-type carrier storage layer 92 is a semiconductor layer having, for example, arsenic (As) or phosphorus (P) as n-type impurities, and the concentration of the n-type impurities is $1.0\times10^{13}/cm^3$ to $1.0\times10^{17}/cm^3$. Alternatively, the semiconductor device 2000 and the semiconductor device 2001 may have a configuration in which instead of the n-type carrier storage layer 92, the $n^-$-type drift layer 91 is provided also in a region where the n-type carrier storage layer 92 is to be provided. By providing the n-type carrier storage layer 92, a power loss, possibly occurring when a current flows through the IGBT region 110, can be reduced. The n-type carrier storage layer 92 and the $n^-$-type drift layer 91 may be collectively called a drift layer.

The n-type carrier storage layer 92 is formed by ion-implanting n-type impurities into the semiconductor substrate constituting the $n^-$-type drift layer 91 and then by diffusing the implanted n-type impurities into the semiconductor substrate that is the $n^-$-type drift layer 91 with annealing.

A p-type base layer 115 is provided on the first main surface side of the n-type carrier storage layer 92. The p-type base layer 115 is a semiconductor layer having, for example, boron (B) or aluminum (Al) as p-type impurities, and the concentration of the p-type impurities is $1.0\times10^{12}/cm^3$ to $1.0\times10^{19}/cm^3$. The p-type base layer 115 is in contact with the gate trench insulating film 111b of the active trench gate 111. The n$^+$-type source layer 113 is provided in contact with the gate trench insulating film 111b of the active trench gate 111 on the first main surface side of the p-type base layer 115, and the p$^+$-type contact layer 114 is provided in the remaining region. The n$^+$-type source layer 113 and the p$^+$-type contact layer 114 constitute the first main surface of the semiconductor substrate. The p$^+$-type contact layer 114 is a region having a higher concentration of p-type impurities than the p-type base layer 115, and when it is necessary to distinguish, the p$^+$-type contact layer 114 and the p-type base layer 115, each of them may be referred to individually. Otherwise, the p$^+$-type contact layer 114 and the p-type base layer 115 may be collectively called a p-type base layer.

In addition, in the semiconductor device 2000 or the semiconductor device 2001, an n-type buffer layer 93 having a higher concentration of n-type impurities than the n$^-$-type drift layer 91 is provided on the second main surface side of the n$^-$-type drift layer 91. The n-type buffer layer 93 is provided to suppress, during the off-state of the semiconductor device 2000 or the semiconductor device 2001, a depletion layer, extending from the p-type base layer 115 toward the second main surface, from punching through. The n-type buffer layer 93 may be formed by implanting, for example, phosphorus (P) or protons (H$^+$), or by implanting both phosphorus (P) and protons (H$^+$). The concentration of n-type impurities in the n-type buffer layer 93 is $1.0\times10^{12}/cm^3$ to $1.0\times10^{18}/cm^3$.

Alternatively, the semiconductor device 2000 or the semiconductor device 2001 may have a configuration in which instead of the n-type buffer layer 93, the n$^+$-type drift layer 91 is provided also in a region where the n-type buffer layer 93 is to be provided. The n-type buffer layer 93 and the n$^+$-type drift layer 91 may be collectively called a drift layer.

In the semiconductor device 2000 or the semiconductor device 2001, the p-type collector layer 116 is provided on the second main surface side of the n-type buffer layer 93. That is, the p-type collector layer 116 is provided between the n$^+$-type drift layer 91 and the second main surface. The p-type collector layer 116 is a semiconductor layer having, for example, boron (B) or aluminum (Al) as p-type impurities, and the concentration of the p-type impurities is $1.0\times10^{16}/cm^3$ to $1.0\times10^{20}/cm^3$. The p-type collector layer 116 constitutes the second main surface of the semiconductor substrate. The p-type collector layer 116 is provided not only in the IGBT region 110 but also in the terminal region 130 (not shown), and a portion, provided in the terminal region 130, of the p-type collector layer 116 constitutes a p-type terminal collector layer 116a. Alternatively, the p-type collector layer 116 may be provided such that a part of it protrudes from the IGBT region 110 to the diode region 120.

In the IGBT region 110, trenches, each of which penetrates the p-type base layer 115 from the first main surface of the semiconductor substrate and reaches the n$^-$-type drift layer 91, are formed as illustrated in FIG. 66. The active trench gate 111 is configured by providing the gate trench electrode 111a in the trench via the gate trench insulating film 111b. The gate trench electrode 111a faces the n$^-$-type drift layer 91 via the gate trench insulating film 111b. In addition, the dummy trench gate 112 is configured by providing the dummy trench electrode 112a in the trench via the dummy trench insulating film 112b. The dummy trench electrode 112a faces the n$^-$-type drift layer 91 via the dummy trench insulating film 112b. The gate trench insulating film 111b of the active trench gate 111 is in contact with the p-type base layer 115 and the n$^+$-type source layer 113. When a gate drive voltage is applied to the gate trench electrode 111a, a channel is formed in the p-type base layer 115 in contact with the gate trench insulating film 111b of the active trench gate 111.

As illustrated in FIG. 66, an interlayer insulating film 94 is provided on the gate trench electrode 111a of the active trench gate 111. A barrier metal 95 is formed on a region of the first main surface of the semiconductor substrate, where the interlayer insulating film 94 is not provided, and on the interlayer insulating film 94. The barrier metal 95 may be a conductor containing, for example, titanium (Ti), may be, for example, titanium nitride, or may be TiSi in which titanium and silicon (Si) are alloyed. As illustrated in FIG. 66, the barrier metal 95 is in ohmic contact with the n$^+$-type source layer 113, the p$^+$-type contact layer 114, and the dummy trench electrode 112a, so that it is electrically connected to the n$^+$-type source layer 113, the p$^+$-type contact layer 114, and the dummy trench electrode 112a. An emitter electrode 96 is provided on the barrier metal 95. The emitter electrode 96 may be formed of, for example, an aluminum alloy such as an aluminum silicon alloy (Al—Si based alloy), or may be an electrode made of multiple layers of metal films obtained by forming a plating film on the electrode formed of the aluminum alloy by electroless plating or electrolytic plating. The plating film formed by electroless plating or electrolytic plating may be, for example, a nickel (Ni) plating film. When there is a fine region, such as one between the adjacent interlayer insulating films 94, where good embedding cannot be obtained with the emitter electrode 96, it may be configured such that tungsten (W) having a better embedding property than the emitter electrode 96 is arranged in the fine region and the emitter electrode 96 is provided on the tungsten. Alternatively, the emitter electrode 96 may be provided on the n$^+$-type source layer 113, the p$^+$-type contact layer 114, and the dummy trench electrode 112a without providing the barrier metal 95. Alternatively, the barrier metal 95 may be provided only on the n-type semiconductor layer such as the n$^+$-type source layer 113. The barrier metal 95 and the emitter electrode 86 may be collectively called an emitter electrode. Although FIG. 66 illustrates a view in which the interlayer insulating film 94 is not provided on the dummy trench electrode 112a of the dummy trench gate 112, the interlayer insulating film 94 may be formed on the dummy trench electrode 112a of the dummy trench gate 112. When the interlayer insulating film 94 is formed on the dummy trench electrode 112a of the dummy trench gate 112, the emitter electrode 96 and the dummy trench electrode 112a may be electrically connected in another cross section.

A collector electrode 97 is provided on the second main surface side of the p-type collector layer 116. The collector electrode 97 may be formed of an aluminum alloy or an aluminum alloy and a plating film, similarly to the emitter electrode 96. Alternatively, the collector electrode 97 may have a different configuration from the emitter electrode 96. The collector electrode 97 is in ohmic contact with the p-type collector layer 116, so that it is electrically connected to the p-type collector layer 116.

Figure 67:
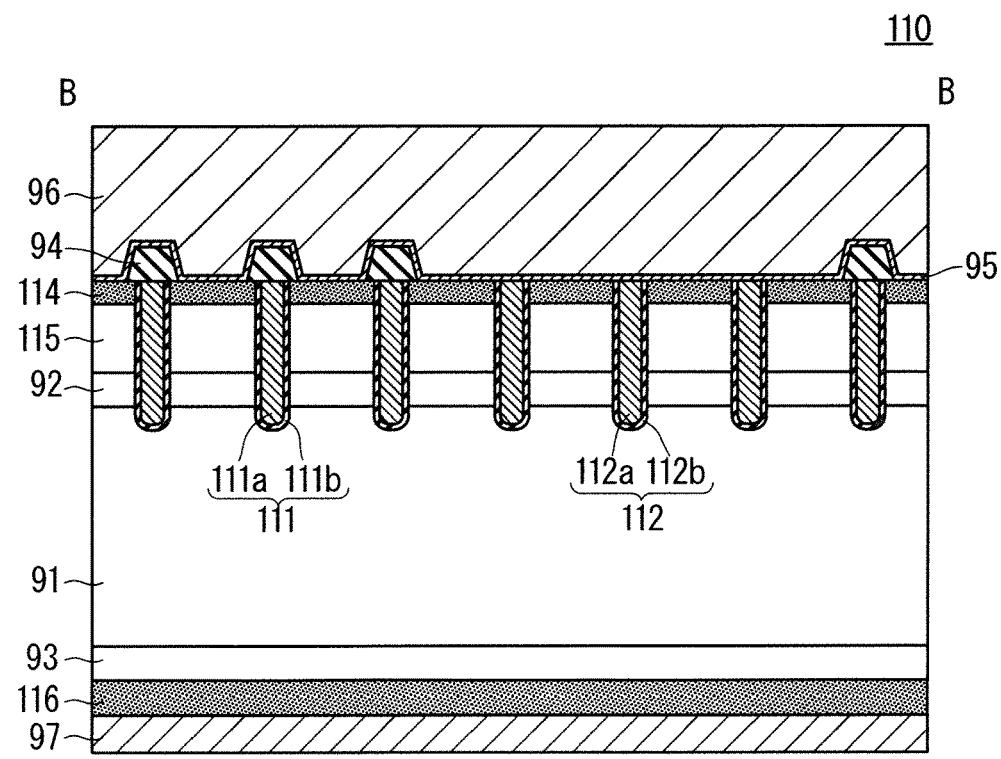

FIG. 67 is a cross-sectional view taken along the B-B line in FIG. 65 and viewed from the direction indicated by the arrows. The cross-sectional structure of the IGBT region 110 illustrated in FIG. 67 is a cross-sectional structure along the arrangement direction of the p+-type contact layer 114. It differs from FIG. 66 in that the p+-type contact layers 114 are provided on the entire first main surface side of the p-type base layer 115 and the n+-type source layer 113 is not seen. That is, the n+-type source layer 113 is selectively provided on the first main surface side of the p-type base layer, as illustrated in FIG. 65. The p-type base layer referred to here means the p-type base layer that the p-type base layer 115 and the p+-type contact layer 114 are collectively called.

<Structure of Diode Region>
<Partial Planar Configuration>

FIG. 68 is an enlarged partial plan view of a region 183, surrounded by the dashed line, of the diode region 120 in the semiconductor device 2000 illustrated in FIG. 63 or the semiconductor device 2001 illustrated in FIG. 54. In the diode region 120, diode trench gates 121 extend from one end side, which is the cell region, of the diode region 120 toward the other end side that faces the one end side along the first main surface of the semiconductor device 2000 or the semiconductor device 2001, as illustrated in FIG. 68. The diode trench gate 121 is configured by providing a diode trench electrode 121a in the trench formed in the semiconductor substrate in the diode region 120 via a diode trench insulating film 121b. The diode trench electrode 121a faces the n−-type drift layer 91 via the diode trench insulating film 121b. A p+-type contact layer 124 and a p-type anode layer 125 are provided between two adjacent diode trench gates 121.

The p+-type contact layer 124 is a semiconductor layer having, for example, boron (B) or aluminum (Al) as p-type impurities, and the concentration of the p-type impurities is $1.0 \times 10^{15}/cm^3$ to $1.0 \times 10^{20}/cm^3$. The p-type anode layer 125 is a semiconductor layer having, for example, boron or aluminum as p-type impurities, and the concentration of the p-type impurities is $1.0 \times 10^{12}/cm^3$ to $1.0 \times 10^{19}/cm^3$. The p+-type contact layers 124 and the p-type anode layers 125 are alternately provided in the longitudinal direction of the diode trench gate 121.

<Partial Cross-Sectional Structure>

Figure 69:
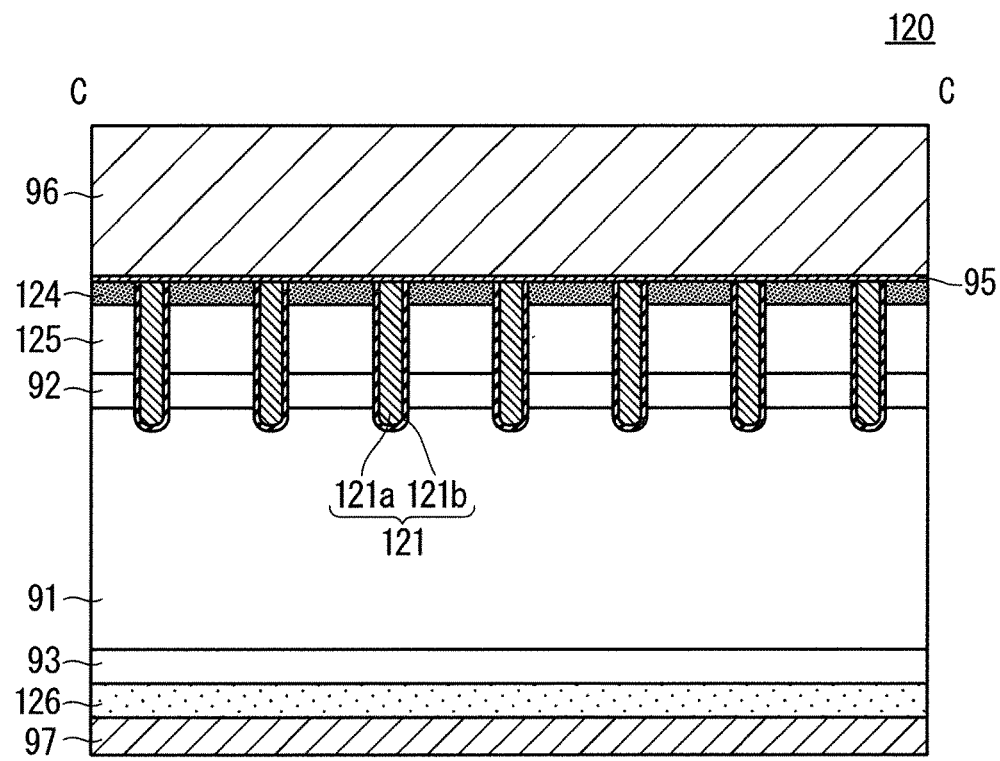
FIGS. 69 to 73 are each a partial cross-sectional view illustrating another configuration of an RC-IGBT.

FIG. 69 is a cross-sectional view taken along the C-C line in FIG. 68 and viewed from the direction indicated by the arrows. As illustrated in FIG. 69, the semiconductor device 2000 or the semiconductor device 2001 has an n−-type drift layer 1 made of the semiconductor substrate even in the diode region 120, similarly to the IGBT region 110. The n−-type drift layer 1 in the diode region 120 and the n−-type drift layer 1 in the IGBT region 110 are continuously and integrally formed, and are formed of the same semiconductor substrate. In FIG. 69, the semiconductor substrate ranges from the p+-type contact layer 124 to an n+-type cathode layer 126. In FIG. 69, the top edge of the paper of the p+-type contact layer 124 is called the first main surface of the semiconductor substrate, and the bottom edge of the paper of the n+-type cathode layer 126 is called the second main surface of the semiconductor substrate. The first main surface in the diode region 120 and the first main surface in the IGBT region 110 are the same surface, and the second main surface in the diode region 120 and the second main surface in the IGBT region 110 are the same surface.

Also, in the diode region 120, the n-type carrier storage layer 92 is provided on the first main surface side of the n−-type drift layer 91, and the n-type buffer layer 93 is provided on the second main surface side of the n−-type drift layer 91, similarly to the IGBT region 110, as illustrated in FIG. 69. The n-type carrier storage layer 92 and the n-type buffer layer 93 provided in the diode region 120 have the same configurations as those of the n-type carrier storage layer 92 and the n-type buffer layer 93 provided in the IGBT region 110, respectively. The n-type carrier storage layer 92 is not necessary required to be provided in the IGBT region 110 and the diode region 120. Even if the n-type carrier storage layer 92 is provided in the IGBT region 110, the n-type carrier storage layer 92 may not be provided in the diode region 120. Similarly to the IGBT region 110, the n−-type drift layer 91, the n-type carrier storage layer 92, and the n-type buffer layer 93 may be collectively called a drift layer.

The p-type anode layer 125 is provided on the first main surface side of the n-type carrier storage layer 92. The p-type anode layer 125 is provided between the n−-type drift layer 91 and the first main surface. The p-type anode layer 125 and the p-type base layer 115 in the IGBT region 110 may be formed simultaneously by setting the concentrations of p-type impurities in the two layers to be equal to each other. Alternatively, it may be configured such that the amount of holes to be implanted, during the operation of the diode, into the diode region 120 is reduced by setting the concentration of p-type impurities in the p-type anode layer 125 to be lower than the concentration of p-type impurities in the p-type base layer 115 in the IGBT region 110. By reducing the amount of holes to be implanted during the operation of the diode, the recovery loss during the operation of the diode can be reduced.

A p+-type contact layer 124 is provided on the first main surface side of the p-type anode layer 125. The concentration of p-type impurities in the p+-type contact layer 124 may be set to be equal to or different from the concentration of p-type impurities in the p+-type contact layer 114 in the IGBT region 110. The p+-type contact layer 124 constitutes the first main surface of the semiconductor substrate. The p+-type contact layer 124 is a region having a higher concentration of p-type impurities than the p-type anode layer 125, and when it is necessary to distinguish the p+-type contact layer 124 and the p-type anode layer 125, each of them may be referred to individually. Otherwise, the p+-type contact layer 124 and the p-type anode layer 125 may be collectively called a p-type anode layer.

In the diode region 120, the n+-type cathode layer 126 is provided on the second main surface side of the n-type buffer layer 93. The n+-type cathode layer 126 is provided between the n−-type drift layer 91 and the second main surface. The n+-type cathode layer 126 is a semiconductor layer having, for example, arsenic or phosphorus as n-type impurities, and the concentration of the n-type impurities is $1.0 \times 10^{16}/cm^3$ to $1.0 \times 10^{21}/cm^3$. As illustrated in FIG. 69, the n+-type cathode layer 126 is provided in a part or all of the diode region 120. The n+-type cathode layer 126 constitutes the second main surface of the semiconductor substrate. Although not illustrated, a part of a region where the n+-type cathode layer 126 has been formed as described above may be changed to a p-type semiconductor by further implanting p-type impurities selectively into the region, whereby a p-type cathode layer can be provided. The diode in which the n+-type cathode layers and the p+-type cathode layers are alternately arranged along the second main surface of the semiconductor substrate in this way is referred to as an RFC (Relaxed Field of Cathode) diode.

In the diode region 120 of the semiconductor device 2000 or the semiconductor device 2001, trenches, each of which penetrates the p-type anode layer 125 from the first main surface of the semiconductor substrate and reaches the n−-type drift layer 91, are formed as illustrated in FIG. 69. The diode trench gate 121 is configured by providing the diode trench electrode 121a in the trench in the diode region 120 via the diode trench insulating film 121b. The diode trench electrode 121a faces the n⁻-type drift layer 91 via the diode trench insulating film 121b.

As illustrated in FIG. 69, the barrier metal 95 is provided on the diode trench electrode 121a and the p⁺-type contact layer 124. The barrier metal 95 is in ohmic contact with the diode trench electrode 121a and the p⁺-type contact layer 124, so that it is electrically connected to the diode trench electrode and the p⁺-type contact layer 124. The barrier metal 95 may have the same configuration as that of the barrier metal 95 in the IGBT region 110. The emitter electrode 96 is provided on the barrier metal 95. The emitter electrode 96 provided in the diode region 120 is formed continuously with the emitter electrode 96 provided in the IGBT region 110. As in the case of the IGBT region 110, the diode trench electrode 121a and the p⁺-type contact layer 124 may be brought into ohmic contact with the emitter electrode 96 without providing the barrier metal 95. Although FIG. 69 illustrates a view in which the interlayer insulating film 94 is not provided on the diode trench electrode 121a of the diode trench gate 121, the interlayer insulating film 94 may be formed on the diode trench electrode 121a of the diode trench gate 121. When the interlayer insulating film 94 is formed on the diode trench electrode 121a of the diode trench gate 121, the emitter electrode 96 and the diode trench electrode 121a may be electrically connected in another cross section.

The collector electrode 97 is provided on the second main surface side of the n⁺-type cathode layer 126. Similarly to the emitter electrode 96, the collector electrode 97 in the diode region 120 is formed continuously with the collector electrode 97 provided in the IGBT region 110. The collector electrode 97 is in ohmic contact with the n⁺-type cathode layer 126, so that it is electrically connected to the n⁺-type cathode layer 126.

Figure 70:
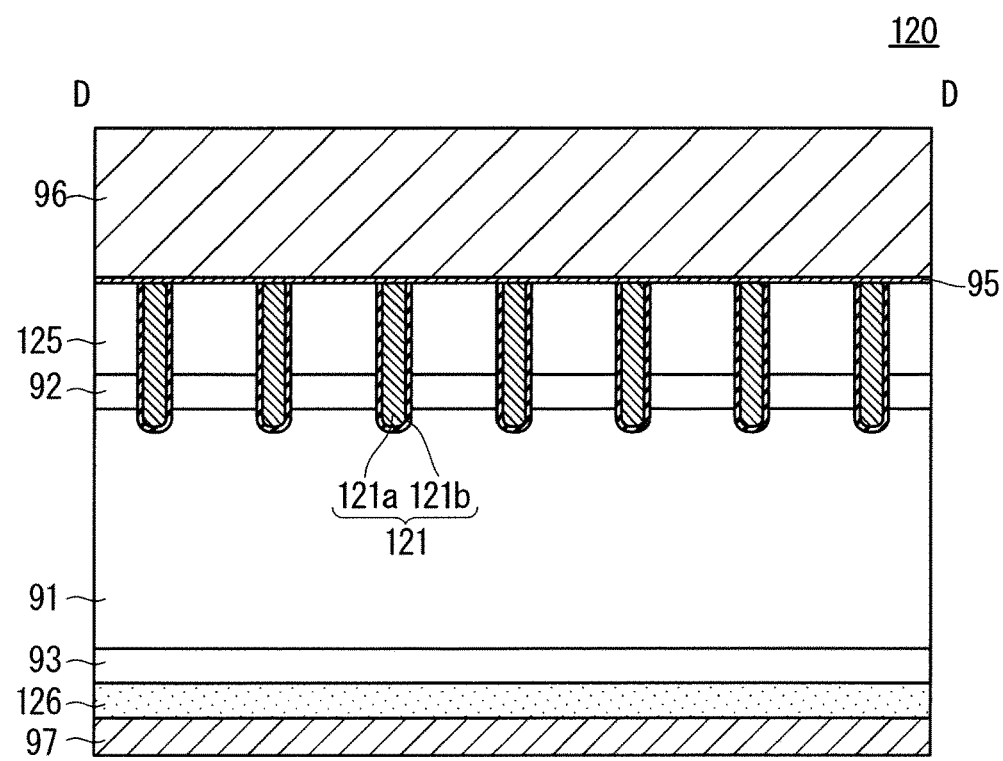

FIG. 70 is a cross-sectional view taken along the D-D line in FIG. 68 and viewed from the direction indicated by the arrows. Since the cross-sectional structure, illustrated in FIG. 70, of the diode region 120 is a cross-sectional structure along the arrangement direction of the p-type anode layers 125, the p⁺-type contact layer 124 is not provided between the p-type anode layer 125 and the barrier metal 95. It differs from FIG. 69 in that the p-type anode layer 125 constitutes the first main surface of the semiconductor substrate. That is, the p⁺-type contact layer 124 is selectively provided on the first main surface side of the p-type anode layer 125, as illustrated in FIG. 68.

Figure 71:
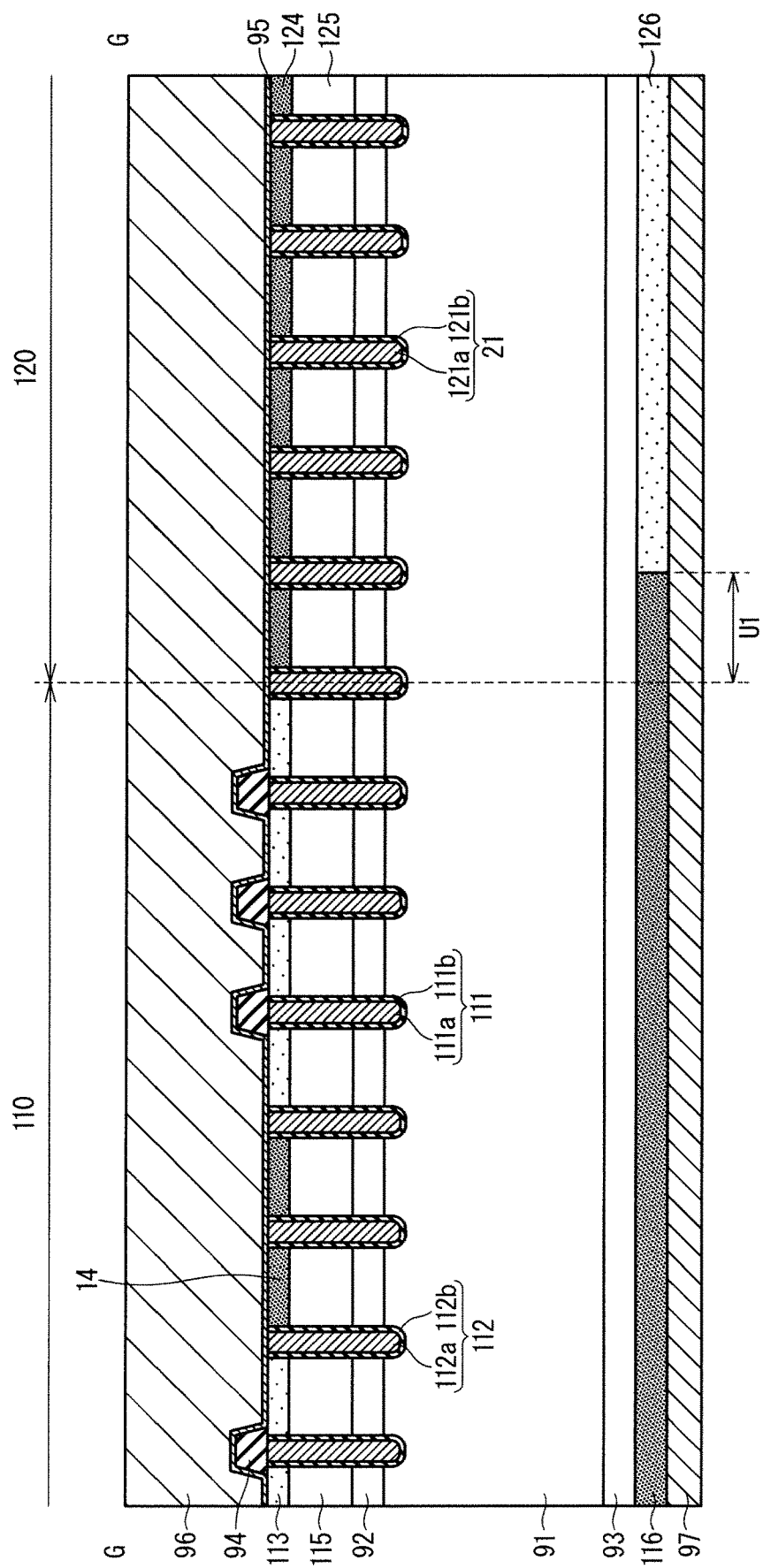

FIG. 71 is a cross-sectional view taken along the G-G line in the semiconductor device 2000 illustrated in FIG. 63 or the semiconductor device 2001 illustrated in FIG. 64, and viewed from the direction indicated by the arrows, in which the structure of the boundary portion between the IGBT region 110 and the diode region 120 is illustrated.

As illustrated in FIG. 71, the p-type collector layer 116 provided on the second main surface side in the IGBT region 110 is provided to protrude from the boundary between the IGBT region 110 and the diode region 120 into the diode region 120 by a distance U1. By providing the p-type collector layer 116 so as to protrude into the diode region 120 in this way, the distance between the n⁺-type cathode layer 126 in the diode region 120 and the active trench gate 111 can be increased. Therefore, even if a gate drive voltage is applied to the active trench gate 111 during the operation of a freewheeling diode, a current can be suppressed from flowing into the n⁺-type cathode layer 126 from a channel formed adjacent to the active trench gate 111 in the IGBT region 110. The distance U1 may be, for example, 100 μm. The distance U1 may be zero or smaller than 100 μm depending on the use of the semiconductor device 2000 or the semiconductor device 2001 that is an RC-IGBT.

<Structure of Terminal Region>

Figure 72:
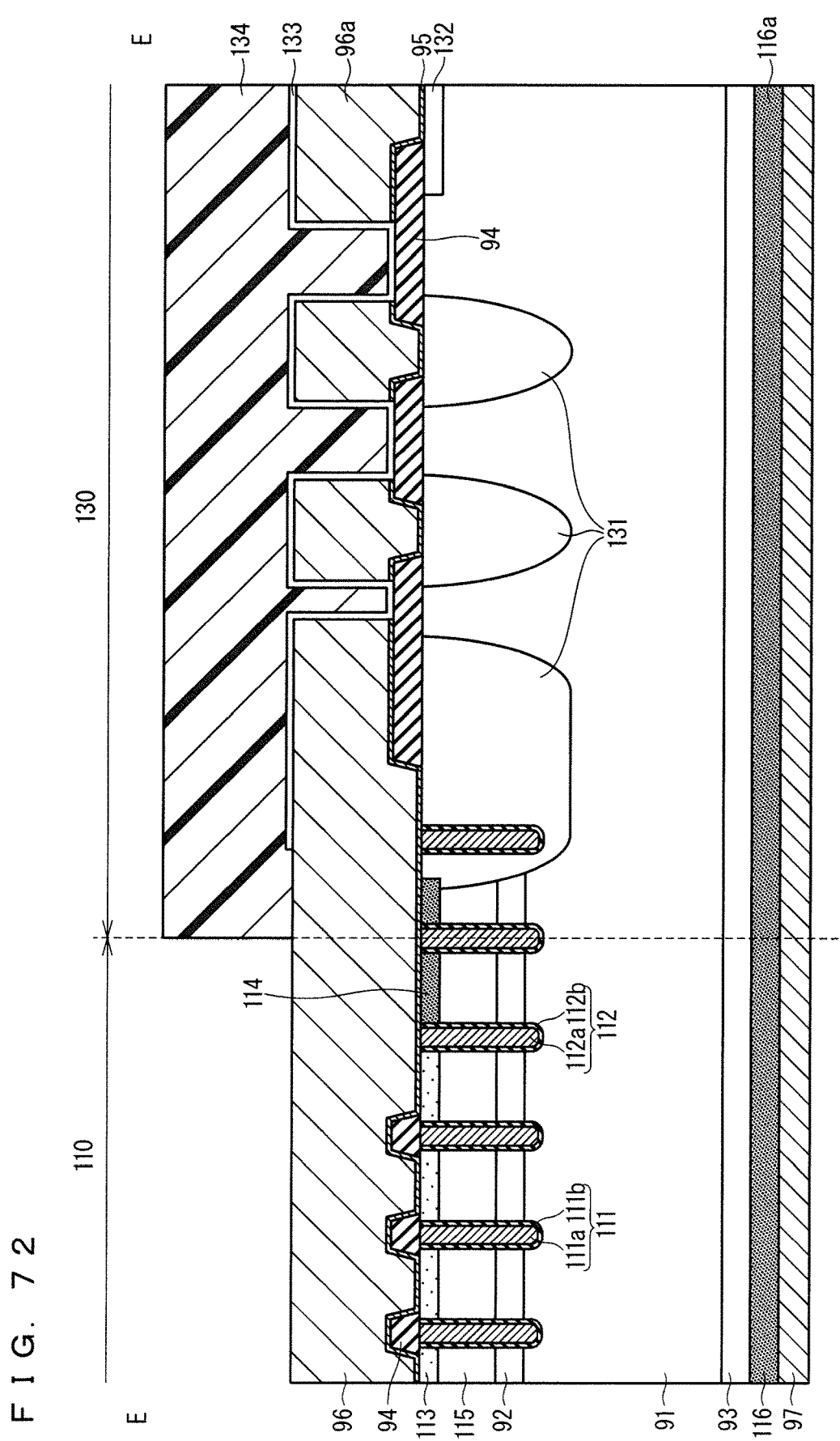

FIG. 72 is a cross-sectional view taken along the E-E line in the semiconductor device 2000 illustrated in FIG. 63 or the semiconductor device 2001 illustrated in FIG. 64, and viewed from the direction indicated by the arrows, in which the configuration of the boundary portion between the IGBT region 110 and the terminal region 130 is illustrated.

As illustrated in FIG. 72, the terminal region 130 of the semiconductor device 2000 or the semiconductor device 2001 has the n⁻-type drift layer 91 between the first main surface and second main surface of the semiconductor substrate. The first and second main surfaces in the terminal region 130 are the same as the first and second main surfaces in each of the IGBT region 110 and the diode region 120. In addition, the n⁻-type drift layer 91 in the terminal region 130 has the same configuration as that of the n⁻-type drift layer 91 in each of the IGBT region 110 and the diode region 120, and is formed continuously and integrally with the layers.

A p-type terminal well layer 131 is provided on the first main surface side of the n⁻-type drift layer 91, that is, provided between the first main surface of the semiconductor substrate and the n⁻-type drift layer 91. The p-type terminal well layer 131 is a semiconductor layer having, for example, boron (B) or aluminum (Al) as p-type impurities, and the concentration of the p-type impurities is $1.0 \times 10^{14}/\text{cm}^3$ to $1.0 \times 10^{19}/\text{cm}^3$. The p-type terminal well layer 131 is provided to surround the cell region including the IGBT region 110 and the diode region 120. The p-type terminal well layer 131 is provided in the form of multiple rings, and the number of p-type terminal well layers 131 provided is appropriately selected depending on the withstand voltage design of the semiconductor device 2000 or the semiconductor device 2001. An n⁺-type channel stopper layer 132 is provided on the further outer edge side of the p-type terminal well layer 131 in order to surround the p-type terminal well layer 131.

The p-type terminal collector layer 116a is provided between the n⁻-type drift layer 91 and the second main surface of the semiconductor substrate. The p-type terminal collector layer 116a is formed continuously and integrally with the p-type collector layer 116 provided in the cell region. Therefore, the p-type collector layer 116 and the p-type terminal collector layer 116a may be collectively called a p-type collector layer 116.

The collector electrode 97 is provided on the second main surface of the semiconductor substrate. The collector electrode 97 is continuously and integrally formed over a region from the cell region including the IGBT region 110 and the diode region 120 to the terminal region 130. On the other hand, on the first main surface of the semiconductor substrate in the terminal region 130, the emitter electrode 96 that is continued from the cell region and a terminal electrode 96a separated from the emitter electrode 96 are provided.

The emitter electrode 96 and the terminal electrode 96a are electrically connected to each other via a semi-insulating film 133. The semi-insulating film 133 may be, for example, a sinSiN (semi-insulating Silicon Nitride) film. The terminal electrode 96a, the p-type terminal well layer 131, and the n⁺-type channel stopper layer 132 are electrically connected via a contact hole formed in the interlayer insulating film 94 provided on the first main surface in the terminal region 130. In addition, the terminal region 130 is provided with a terminal protective film 134 that covers the emitter electrode 96, the terminal electrode 96a, and the semi-insulating film 133. The terminal protective film 134 may be formed of, for example, polyimide.

Figure 73:
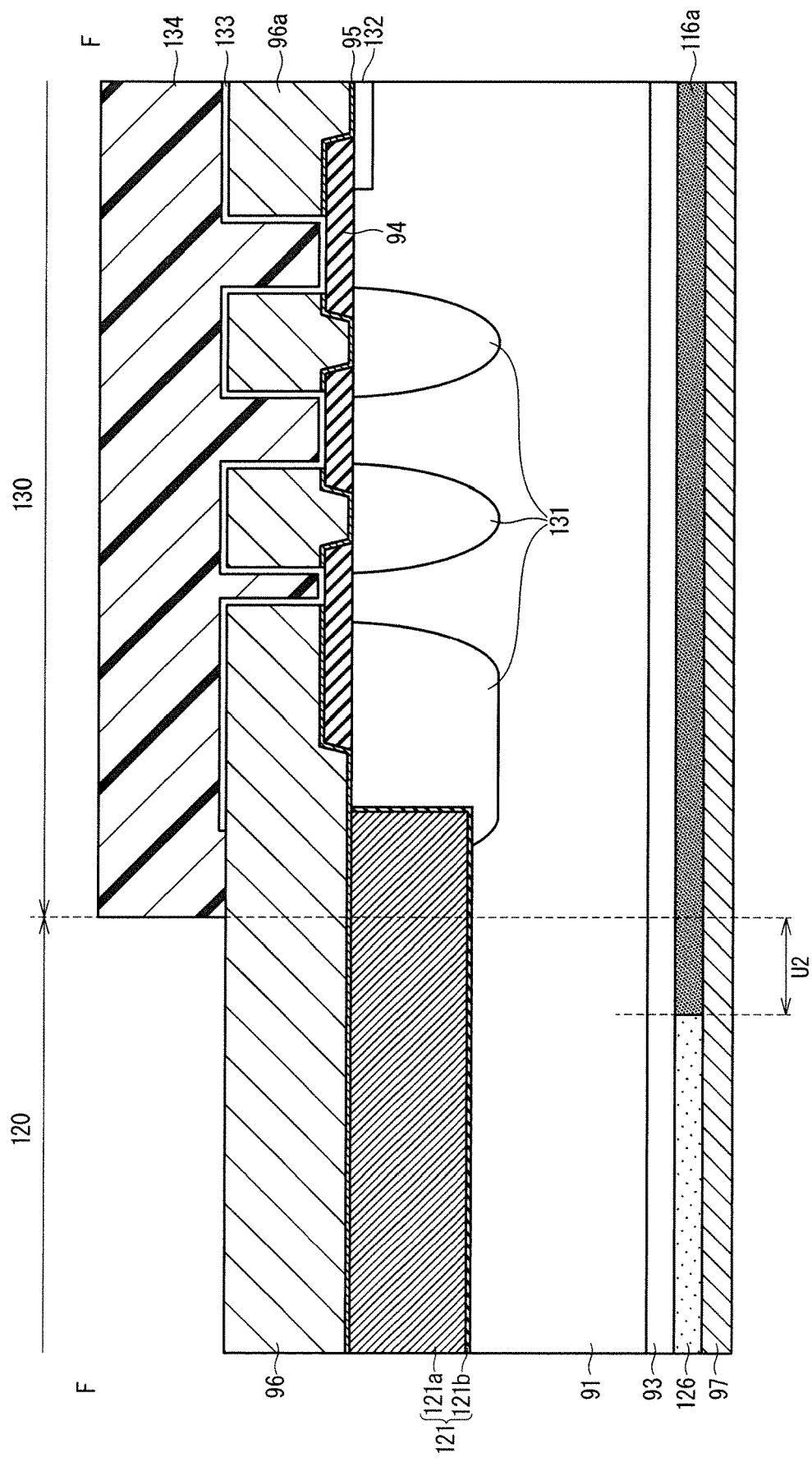

FIG. 73 is a cross-sectional view taken along the F-F line in the semiconductor device 2000 illustrated in FIG. 63 or the semiconductor device 2001 illustrated in FIG. 64, and viewed from the direction indicated by the arrows, in which the configuration of the boundary portion between the IGBT region 110 and the terminal region 130 is illustrated.

As illustrated in FIG. 73, the p-type terminal collector layer 116a is provided such that the end portion on the diode region 120 side protrudes into the diode region 120 by a distance U2. By providing the p-type terminal collector layer 116a so as to protrude into the diode region 120 in this way, the distance between the $n^+$-type cathode layer 126 in the diode region 120 and the p-type terminal well layer 131 can be increased. Therefore, the p-type terminal well layer 131 can be suppressed from operating as the anode of the diode. The distance U2 may be, for example, 100 μm.

In the present disclosure, each preferred embodiment can be freely combined or can be appropriately modified or omitted within the scope of the present disclosure.

While the disclosure has been shown and described in detail, the foregoing description is in all aspects illustrative and not restrictive. It is therefore understood that numerous modifications and variations can be devised.

What is claimed is:

1. A semiconductor device in which a transistor and a diode are formed on a common semiconductor substrate, wherein:
   the semiconductor substrate has
   a transistor region where the transistor is formed,
   a diode region where the diode is formed, and
   an outer peripheral region surrounding a cell region including the transistor region and the diode region;
   the transistor region is divided into a plurality of transistor unit cell regions by a plurality of gate electrodes each having a stripe shape;
   the diode region is divided into a plurality of diode unit cell regions by the plurality of gate electrodes;
   each of the plurality of transistor unit cell regions has
   a first semiconductor layer of a first conductivity type provided on a second main surface side of the semiconductor substrate,
   a second semiconductor layer of a second conductivity type provided on the first semiconductor layer,
   a third semiconductor layer of the first conductivity type provided on a first main surface side of the semiconductor substrate with respect to the second semiconductor layer,
   a fourth semiconductor layer of the second conductivity type selectively provided on an upper layer part of the third semiconductor layer,
   a fifth semiconductor layer of the first conductivity type selectively provided such that a side surface of the fifth semiconductor layer is in contact with a side surface of the fourth semiconductor layer,
   a first electrode electrically connected to the first semiconductor layer, and
   a second electrode electrically connected to the fourth semiconductor layer and the fifth semiconductor layer via a contact hole;
   each of the plurality of diode unit cell regions has
   a sixth semiconductor layer of the second conductivity type provided on the second main surface side of the semiconductor substrate,
   the second semiconductor layer provided on the sixth semiconductor layer,
   a seventh semiconductor layer of the first conductivity type provided on the first main surface side of the semiconductor substrate with respect to the second semiconductor layer,
   an eighth semiconductor layer of the first conductivity type selectively provided on an upper layer part of the seventh semiconductor layer,
   the first electrode electrically connected to the sixth semiconductor layer, and
   the second electrode electrically connected to the seventh semiconductor layer and the eighth semiconductor layer via the contact hole;
   the fifth semiconductor layer in the transistor region is provided to be in contact with an impurity layer of the first conductivity type that is provided in the outer peripheral region and defines a boundary with the cell region, or to enter the impurity layer; and
   the contact hole is provided to extend to an upper portion of the impurity layer in the outer peripheral region.

2. The semiconductor device according to claim 1, wherein
   the eighth semiconductor layer in the diode region is provided not in contact with the impurity layer in the outer peripheral region, and the contact hole is provided to extend to the upper portion of the impurity layer in the outer peripheral region.

3. The semiconductor device according to claim 1, wherein
   the eighth semiconductor layer in the diode region is provided to be in contact with the impurity layer in the outer peripheral region, and the contact hole is provided to extend to the upper portion of the impurity layer in the outer peripheral region.

4. The semiconductor device according to claim 1, wherein
   the eighth semiconductor layer in the diode region is provided such that a shape, in plan view, of the eighth semiconductor layer forms a continuous single line shape extending in an extending direction of the plurality of gate electrodes.

5. The semiconductor device according to claim 1, wherein
   a plurality of the eighth semiconductor layers in the diode region, each having, in plan view, an elongated rectangular shape extending in an extending direction of the plurality of gate electrodes, are provided at intervals so as to form a line in a longitudinal direction of the eighth semiconductor layer, and
   the interval is set to be smaller than a length in the longitudinal direction.

6. The semiconductor device according to claim 1, wherein:
   the plurality of diode unit cell regions include
   first diode unit cell regions each not having the eighth semiconductor layer, and
   second diode unit cell regions each having the eighth semiconductor layer;
   the first diode unit cell regions and the second diode unit cell regions are alternately arranged in an arrangement direction of the plurality of gate electrodes; and
   in the second diode unit cell region, the seventh semiconductor layers and the eighth semiconductor layers are alternately arranged in an extending direction of the plurality of gate electrodes.

7. The semiconductor device according to claim 6, wherein
in the second diode unit cell regions on both sides of the first diode unit cell region, the arrangement positions of the eighth semiconductor layer are different from each other in the extending direction of the plurality of gate electrodes.

8. The semiconductor device according to claim 1, wherein
in each of the plurality of diode unit cell regions, the seventh semiconductor layers and the eighth semiconductor layers are alternately arranged in an extending direction of the plurality of gate electrodes.

9. The semiconductor device according to claim 1, wherein
in each of the plurality of diode unit cell regions, a ratio of an area, in plan view, of the eighth semiconductor layer to a total area, in plan view, of the seventh semiconductor layer and the eighth semiconductor layer is smaller than a ratio of an area, in plan view, of the seventh semiconductor layer.

10. The semiconductor device according to claim 9, wherein
the ratio of the area, in plan view, of the eighth semiconductor layer to the total area, in plan view, of the seventh semiconductor layer and the eighth semiconductor layer in each of the plurality of diode unit cell regions is smaller than a ratio of an area, in plan view, of the fifth semiconductor layer to a total area, in plan view, of the fourth semiconductor layer and the fifth semiconductor layer in each of the plurality of transistor unit cell regions.

11. The semiconductor device according to claim 1, wherein
an arrangement interval between the plurality of gate electrodes in the diode region is larger than an arrangement interval between the plurality of gate electrodes in the transistor region.

12. The semiconductor device according to claim 1, wherein
a ratio of an area, in plan view, of the eighth semiconductor layer to a total area, in plan view, of the seventh semiconductor layer and the eighth semiconductor layer in the diode unit cell region adjacent to the transistor region, among the plurality of diode unit cell regions, is larger than a ratio of an area, in plan view, of the eighth semiconductor layer to a total area, in plan view, of the seventh semiconductor layer and the eighth semiconductor layer in the diode unit cell region not adjacent to the transistor region.

13. The semiconductor device according to claim 1, wherein
a ratio of an area, in plan view, of the eighth semiconductor layer to a total area, in plan view, of the seventh semiconductor layer and the eighth semiconductor layer in the diode unit cell region adjacent to the transistor region, among the plurality of diode unit cell regions, is smaller than a ratio of an area, in plan view, of the eighth semiconductor layer to a total area, in plan view, of the seventh semiconductor layer and the eighth semiconductor layer in the diode unit cell region not adjacent to the transistor region.

14. The semiconductor device according to claim 1, wherein
a ratio of an area, in plan view, of the fifth semiconductor layer to a total area, in plan view, of the fourth semiconductor layer and the fifth semiconductor layer in the transistor unit cell region adjacent to the diode region, among the plurality of transistor unit cell regions, is smaller than a ratio of an area, in plan view, of the fifth semiconductor layer to a total area, in plan view, of the fourth semiconductor layer and the fifth semiconductor layer in the transistor unit cell region not adjacent to the diode region.

15. The semiconductor device according to claim 1, wherein
a ratio of an area, in plan view, of the fifth semiconductor layer to a total area, in plan view, of the fourth semiconductor layer and the fifth semiconductor layer in the transistor unit cell region adjacent to the diode region, among the plurality of transistor unit cell regions, is larger than a ratio of an area, in plan view, of the fifth semiconductor layer to a total area, in plan view, of the fourth semiconductor layer and the fifth semiconductor layer in the transistor unit cell region not adjacent to the diode region.

16. A semiconductor device in which a transistor and a diode are formed on a common semiconductor substrate, wherein:
the semiconductor substrate has
a transistor region where the transistor is formed,
a diode region where the diode is formed, and
an outer peripheral region surrounding a cell region including the transistor region and the diode region;
the transistor region is divided into a plurality of transistor unit cell regions by a plurality of gate electrodes each having a stripe shape;
the diode region is divided into a plurality of diode unit cell regions each having a rectangular shape by a mesh-shaped gate electrode;
each of the plurality of transistor unit cell regions has
a first semiconductor layer of a first conductivity type provided on a second main surface side of the semiconductor substrate,
a second semiconductor layer of a second conductivity type provided on the first semiconductor layer,
a third semiconductor layer of the first conductivity type provided on a first main surface side of the semiconductor substrate with respect to the second semiconductor layer,
a fourth semiconductor layer of the second conductivity type selectively provided on an upper layer part of the third semiconductor layer,
a fifth semiconductor layer of the first conductivity type selectively provided such that a side surface of the fifth semiconductor layer is in contact with a side surface of the fourth semiconductor layer,
a first electrode electrically connected to the first semiconductor layer, and
a second electrode electrically connected to the fourth semiconductor layer and the fifth semiconductor layer via a contact hole;
each of the plurality of diode unit cell regions has
a sixth semiconductor layer of the second conductivity type provided on the second main surface side of the semiconductor substrate,
the second semiconductor layer provided on the sixth semiconductor layer,
a seventh semiconductor layer of the first conductivity type provided on the first main surface side of the semiconductor substrate with respect to the second semiconductor layer, an eighth semiconductor layer of the first conductivity type selectively provided on an upper layer part of the seventh semiconductor layer, the first electrode electrically connected to the sixth semiconductor layer, and the second electrode electrically connected to the seventh semiconductor layer and the eighth semiconductor layer via the contact hole;

the fifth semiconductor layer in the transistor region is provided to be in contact with an impurity layer of the first conductivity type that is provided in the outer peripheral region and defines a boundary with the cell region, or to enter the impurity layer; and the contact hole is provided to extend to an upper portion of the impurity layer in the outer peripheral region.

17. The semiconductor device according to claim 16, wherein the eighth semiconductor layer in the diode region is provided not in contact with the impurity layer in the outer peripheral region, and the contact hole is provided to extend to the upper portion of the impurity layer in the outer peripheral region.

18. The semiconductor device according to claim 16, wherein in each of the plurality of diode unit cell regions, a ratio of an area, in plan view, of the eighth semiconductor layer to a total area, in plan view, of the seventh semiconductor layer and the eighth semiconductor layer is smaller than a ratio of an area, in plan view, of the seventh semiconductor layer.

19. The semiconductor device according to claim 18, wherein the ratio of the area, in plan view, of the eighth semiconductor layer to the total area, in plan view, of the seventh semiconductor layer and the eighth semiconductor layer in each of the plurality of diode unit cell regions is smaller than a ratio of an area, in plan view, of the fifth semiconductor layer to a total area, in plan view, of the fourth semiconductor layer and the fifth semiconductor layer in each of the plurality of transistor unit cell regions.

* * * * *